US007120556B2

(12) United States Patent
Nakano et al.

(10) Patent No.: US 7,120,556 B2
(45) Date of Patent: Oct. 10, 2006

(54) PERFORMANCE EVALUATION METHOD FOR PLASMA PROCESSING APPARATUS FOR CONTINUOUSLY MAINTAINING A DESIRED PERFORMANCE LEVEL

(75) Inventors: Akira Nakano, Miyagi-ken (JP); Tadahiro Ohmi, Miyagi-ken (JP)

(73) Assignee: Alps Electric Co., Ltd., Tokyo (JP)

(*) Notice: Subject to any disclaimer, the term of this patent is extended or adjusted under 35 U.S.C. 154(b) by 35 days.

(21) Appl. No.: 10/887,795
(22) Filed: Jul. 9, 2004

(65) Prior Publication Data
US 2004/0250770 A1 Dec. 16, 2004

Related U.S. Application Data

(62) Division of application No. 09/957,684, filed on Sep. 20, 2001, now Pat. No. 6,795,796.

(30) Foreign Application Priority Data

Sep. 22, 2000 (JP) ............................. 2000-289489
Sep. 27, 2000 (JP) ............................. 2000-295086

(51) Int. Cl.
*G06F 19/00* (2006.01)
(52) U.S. Cl. ..................... 702/182; 702/65; 702/75; 438/17
(58) Field of Classification Search .............. 702/57, 702/58, 182, 65, 75, 79, 183–185, 187, 188, 702/189, 193; 438/17, 18, 9, 10, 14
See application file for complete search history.

(56) References Cited

U.S. PATENT DOCUMENTS

| 5,187,457 A | * | 2/1993 | Chawla et al. ............... 333/170 |
| 5,472,561 A | | 12/1995 | Williams et al. .............. 438/10 |
| 5,630,949 A | * | 5/1997 | Lakin ........................... 216/61 |
| 5,669,975 A | * | 9/1997 | Ashtiani ................... 118/723 I |
| 6,174,450 B1 | | 1/2001 | Patrick et al. ................ 216/61 |
| 6,197,116 B1 | | 3/2001 | Kosugi ....................... 118/712 |
| 6,239,403 B1 | * | 5/2001 | Dible et al. ............ 219/121.43 |
| 6,351,683 B1 | | 2/2002 | Johnson et al. ............. 700/121 |

* cited by examiner

*Primary Examiner*—Hal Wachsman
(74) *Attorney, Agent, or Firm*—Brinks Hofer Gilson & Lione

(57) ABSTRACT

The performance of a plasma processing apparatus which is disassembled, transferred, and reassembled is evaluated. The plasma processing apparatus has a plasma processing chamber having an electrode for exciting a plasma, a radiofrequency generator connected to the electrode, and an impedance matching circuit for performing the impedance matching between the plasma processing chamber and the radiofrequency generator. The performance of the apparatus is evaluated whether or not three times the first series resonant frequency of the plasma processing chamber is larger than the power frequency supplied to the plasma processing chamber.

12 Claims, 35 Drawing Sheets

FIG. 30

DETAILED MAINTENANCE PAGE CP4 xxxx' K13

ELECTRICAL PERFORMANCE K10

| | $f_o$ ... | $f_e$ ... | $Z_e$ ... | $R_e$ ... | $C_e$ ... | $C_x$ ... |
|---|---|---|---|---|---|---|

MAINTENANCE HISTORY K17

CHAMBER 1 xxxx K13

| DATE | $f_o$ MHz | $f_e$ MHz | $Z_e$ Ω | $R_e$ Ω | $C_e$ pF | $C_x$ pF |
|---|---|---|---|---|---|---|
| 7/27 | 45.3 | 40.68 | 8 | 3.1 | 37 | 1800 |

CHAMBER 2 xxxx K13

| $f_o$ MHz | $f_e$ MHz | $Z_e$ Ω | $R_e$ Ω | $C_e$ pF | $C_x$ pF |
|---|---|---|---|---|---|
| 45.3 | 40.68 | 8 | 3.1 | 37 | 1800 |

VARIATIONS xxxx K13

| $f_o$ MHz | $f_e$ MHz | $Z_e$ Ω | $R_e$ Ω | $C_e$ pF | $C_x$ pF |
|---|---|---|---|---|---|
| 0 | 0 | 0 | 0 | 0 | 0.01 |

ID
PERFORMANCE EVALUATION METHOD FOR PLASMA PROCESSING APPARATUS FOR CONTINUOUSLY MAINTAINING A DESIRED PERFORMANCE LEVEL

This application is a divisional of U.S. patent application Ser. No. 09/957,684, filed Sep. 20, 2001, now U.S. Pat. No. 6,795,796, which claims priority to Japanese Patent Applications No. :2000-289489, filed Sep. 22, 2000, and 2000-295086, filed Sep. 27, 2000, all of which being incorporated herein by reference.

BACKGROUND OF THE INVENTION

1. Field of the Invention

The present invention relates to a plasma processing apparatus and to an evaluation method, a performance management system, and a performance validation system for the plasma processing apparatus and a plasma processing system. More particularly, the present invention is suitable for continuously securing the performance of the plasma processing apparatus to be maintained at a required level even after the plasma processing apparatus or system is delivered to a customer site.

2. Description of the Related Art

FIG. 22 illustrates an example of a conventional dual-frequency excitation plasma processing apparatus which performs a plasma process such as a chemical vapor deposition (CVD) process, a sputtering process, a dry etching process, or an ashing process.

In the plasma processing apparatus shown in FIG. 22, a matching circuit 2A is inserted between a radiofrequency generator 1 and a plasma excitation electrode 4. The matching circuit 2A serves as a circuit that matches the impedance between the radiofrequency generator 1 and the excitation electrode 4.

Radiofrequency power from the radiofrequency generator 1 is fed to the plasma excitation electrode 4 via the matching circuit 2A and a feed plate 3. The matching circuit 2A is accommodated in a matching box 2 which is a housing composed of a conductive material. The plasma excitation electrode 4 and the feed plate 3 are covered by a chassis 21 made of a conductor.

The plasma excitation electrode 4 is provided with a projection 4a at the lower side thereof. A shower plate 5 having many holes 7 provided under the plasma excitation electrode 4 is in contact with the projection 4a. The plasma excitation electrode 4 and the shower plate 5 define a space 6. A gas feeding tube 17 comprising a conductor is connected to the space 6. The gas feeding tube 17 is provided with an insulator 17a at the middle thereof so as to insulate the plasma excitation electrode 4 and the gas source.

Gas from the gas feeding tube 17 is fed inside a chamber space 60 composed of a chamber wall 10, via the holes 7 in the shower plate 5. An insulator 9 is disposed between the chamber wall 10 and the plasma excitation electrode 4 (cathode) to provide insulation therebetween. The exhaust system is omitted from the drawing.

A wafer susceptor (susceptor electrode) 8 which receives a substrate 16 and also serves as a plasma excitation electrode is installed inside the chamber space 60. A susceptor shield 12 is disposed under the wafer susceptor 8.

The susceptor shield 12 comprises a shield supporting plate 12A for receiving the susceptor electrode 8 and a cylindrical supporting cylinder 12B extending downward from the center of the shield supporting plate 12A. The supporting cylinder 12B penetrates a chamber bottom 10A, and the lower portion of the supporting cylinder 12B and the chamber bottom 10A are hermetically sealed with bellows 11.

The shaft 13 and the susceptor electrode 8 are electrically isolated from the susceptor shield 12 by a gap between the susceptor shield 12 and the susceptor electrode 8 and by insulators 12C provided around the shaft 13. The insulators 12C also serve to maintain high vacuum in the chamber space 60. The susceptor electrode 8 and the susceptor shield 12 can be moved upward and downward by the bellows 11 in order to control the distance between plasma excitation electrodes 4 and 8.

The susceptor electrode 8 is connected to a second radiofrequency generator 15 via the shaft 13 and a matching circuit accommodated in a matching box 14. The chamber wall 10 and the susceptor shield 12 have equal DC potentials.

FIG. 23 illustrates another example of a conventional plasma processing apparatus. Unlike the plasma processing apparatus shown in FIG. 22, the plasma processing apparatus shown in FIG. 23 is of a single-frequency excitation type. In other words, a radiofrequency power is supplied only to the cathode electrode 4 and the susceptor electrode 8 is grounded. Moreover, the matching box 14 and the radiofrequency generator 15 shown in FIG. 18 are not provided. The susceptor electrode 8 and the chamber wall 10 have the same DC potential.

In these plasma processing apparatuses, power with a frequency of approximately 13.56 MHz is generally supplied in order to generate a plasma between the electrodes 4 and 8. A plasma process such as a plasma-enhanced CVD process, a sputtering process, a dry etching process, or an ashing process is then performed using the plasma.

The operation validation and the evaluation of the above-described plasma processing apparatuses have been conducted by actually performing the process such as deposition and then evaluating the deposition characteristics thereof as follows.

(1) Deposition Tate and In-plane Uniformity

The process of determining and evaluating deposition rates and planar uniformity includes the following.

Step 1: Depositing a desired layer on a 6-inch substrate by a plasma-enhanced CVD process.

Step 2: Patterning a resist layer.

Step 3: Dry-etching the layer.

Step 4: Separating the resist layer by ashing.

Step 5: Measuring step differences in the layer thickness using a contact-type displacement meter.

Step 6: Calculating the deposition rate from the deposition time and the layer thickness.

Step 7: Measuring the in-plane uniformity at 16 points.

(2) BHF Etching Rate

The process of determining etching rates includes the following.

A resist mask is patterned as in Steps 1 and 2 above.

Step 3: Immersing the substrate in a buffered hydrofluoric acid (BHF) solution for one minute.

Step 4: Rinsing the substrate with deionized water, drying the substrate, and separating the resist mask using a mixture of sulfuric acid and hydrogen peroxide ($H_2SO_4+H_2O_2$)

Step 5: Measuring the step difference as in Step 5 above.

Step 6: Calculating the etching rate from the immersion time and the step differences.

(3) Isolation Voltage

The process of determining and evaluating the isolation voltage includes the following.

Step 1: Depositing a conductive layer on a glass substrate by a sputtering method and patterning the conductive layer to form a lower electrode.

Step 2: Depositing an insulation layer by a plasma-enhanced CVD method.

Step 3: Forming an upper electrode as in Step 1.

Step 4: Forming a contact hole for the lower electrode.

Step 5: Measuring the current-voltage characteristics (I–V characteristics) of the upper and lower electrodes by using probes while applying a voltage of approximately 200 V or less.

Step 6: Defining the isolation voltage as the voltage V at 100 pA corresponding 1 $\mu A/cm^2$ in a 100 µm square electrode.

The plasma processing apparatus has been required to achieve a higher plasma processing rate (the deposition rate or the processing speed), increased productivity, and uniformity of the plasma processing in the in-plane direction of the substrates to be treated (uniformity in the distribution of the layer thickness in the in-plane direction and uniformity in the distribution of the process variation in the in-plane direction). As the size of substrates has been increasing in recent years, the requirement for uniformity in the in-plane direction is becoming tighter.

Moreover, as the size of the substrate is increased, the power required is also increased to the order of kilowatts, thus increasing the power consumption. Accordingly, as the capacity of the power supply increases, both the cost for developing the power supply and the power consumption during the operation of the apparatus are increased. In this respect, it is desirable to reduce the operation costs.

Furthermore, an increase in power consumption leads to an increase in emission of carbon dioxide which places a burden on the environment. Since the power consumption is increased by the combination of increase in the size of substrates and a low power consumption efficiency, there is a growing demand to reduce the carbon dioxide emission.

The density of the plasma generated can be improved by increasing the plasma excitation frequency. For example, a frequency in the VHF band of 30 MHz or more can be used instead of the conventional 13.56 MHz. Thus, one possible way to improve the deposition rate of a deposition apparatus such as a plasma-enhanced CVD apparatus is to employ a high plasma excitation frequency.

Another type of plasma processing apparatus is one having a plurality of plasma chambers (multi-chamber plasma processing apparatus). Such a plasma processing apparatus is also required to achieve a higher plasma processing rate (the deposition rate or the processing speed), increased productivity, and uniformity of the plasma processing in the in-plane direction of the substrates (uniformity in the distribution of the layer thickness in the in-plane direction and uniformity in the distribution of the process variation in the in-plane direction), even when the substrates are treated in different plasma chambers. There is also a demand to eliminate operational differences among the plurality of the plasma chambers, thus avoiding processing variations.

Moreover, the respective plasma chambers of the plasma processing apparatus having the plurality of plasma processing chambers are required to achieve substantially the same plasma processing results by using the same process recipe specifying external parameters such as the flow and pressure of the charged gasses, power supply, and treatment time.

At the time of initial installation or maintenance of the plasma processing apparatus, there is a demand to reduce the amount of time required for adjusting the apparatus to eliminate differences among the plural plasma chambers and processing variations, so that substantially the same process results can be achieved by using the same process recipe. Reduction of the cost required for such an adjustment is also required.

Furthermore, a plasma processing system equipped with a plurality of the above-described plasma processing apparatuses is also required to eliminate plasma processing variations among individual plasma chambers of the individual plasma processing apparatuses.

In the above-described conventional plasma processing apparatuses, the power consumption efficiency (the ratio of the power consumed in the plasma processing chamber to the power supplied from the radiofrequency generator 1 to the plasma excitation electrode 4) is not satisfactory. Especially as the frequency supplied from the radiofrequency generator is increased, the power consumption efficiency in the plasma processing apparatus becomes significantly lower. Moreover, the power consumption efficiency decreases as the substrate size becomes larger.

As a result, the effective power consumed in the plasma space is low due to the low power consumption efficiency, resulting in a lower deposition rate. Moreover, when applied to the deposition of insulating layers, it is difficult to form insulating layers of high isolation voltage.

While the plasma processing apparatus is required to achieve a desired performance level, the multi-chamber plasma processing apparatus having the plurality of plasma processing chambers and the plasma processing system are required to eliminate the differences in the performance of plasma process among the plurality of plasma processing chambers. Even when the plasma processing apparatus is optimized as above, the level of the performance may not be maintained at the desired level and the differences among the plasma processing chambers may occur after the plasma processing apparatus has repeated plasma processes. When adjustment works such as overhauling, parts replacement, assembly with alignment or the like are performed, it is possible that the performance is not maintained at the level maintained before the adjustment works. When the plasma processing apparatus is transferred, the plasma processing apparatus is disassembled first, transferred, and then reassembled at the customer site. In this case also it is possible that the performance is not maintained at the level maintained before the transfer due to the vibration during the transfer and inappropriate reassembly work.

When processes (1) to (3) described above are employed to evaluate whether the operation of the plasma processing apparatus and the difference among the plasma processing chambers are maintained within the required levels, it becomes necessary to actually operate the plasma processing apparatus and to examine the treated substrates using an ex-situ inspection method requiring a plurality of steps.

Such an evaluation takes several days to several weeks to yield evaluation results, and the characteristics of the substrates manufactured during that period, assuming that the manufacturing line is not stopped, remain unknown during that period. If the status of the plasma processing apparatus is not satisfactory, the resulting products will not meet predetermined standards. In this respect, a method that facilitates maintenance of the plasma processing apparatus has been demanded.

The conventional plasma processing apparatuses described above are designed to use a power having a frequency of approximately 13.56 MHz and is not suited for higher frequencies. To be more specific, the units to which the radiofrequency voltage is delivered, i.e., the chambers in which plasma processing is performed, are designed without taking into an account radiofrequency characteristics such as impedance and resonance frequency characteristics and thus have the following problems.

First, when a power having a frequency exceeding 13.56 MHz is delivered, no improvement is achieved in the deposition rate during the deposition process, but rather the deposition rate is decreased in some cases.

Second, although the density of a generated plasma increases as the frequency increases, the density starts to decrease once its peak value is reached, eventually reaching a level at which glow-discharge is no longer possible, thus rendering further increases in frequency pointless.

In addition to the disadvantages described above, the conventional plasma processing apparatuses have the following disadvantages.

The conventional multi-chamber type plasma processing apparatus and plasma processing system, both comprising a plurality of plasma chambers, are not designed to eliminate the differences in electrical radiofrequency characteristics such as impedance and resonant frequency characteristics among the plasma chambers. Thus, it is possible that the effective power consumed in each of plasma spaces and the density of the generated plasma differ between each of the plasma chambers.

Also, the same plasma processing results may not be obtained even when the same process recipe is applied to these plasma chambers.

Accordingly, in order to obtain the same plasma processing results, external parameters such as gas flow/pressure, power supply, process time, and the like must be compared with the process results according to evaluation methods (1) to (3) described above for each of the plasma chambers so as to determine the correlation between them. However, the amount of data is enormous and it is impossible to completely carry out the comparison.

When methods (1) to (3) described above are employed to validate and evaluate the operation of the plasma processing apparatus, it becomes necessary to actually operate the plasma processing apparatus and to examine the treated substrates using an ex-situ inspection method comprising a plurality of steps.

Since such an inspection requires several days to several weeks to yield evaluation results, it is desired that the time required for performance inspection of a plasma processing apparatus be reduced especially when the apparatus is in the development stage.

Moreover, when methods (1) to (3) described above are employed to inspect the plasma processing apparatus or system having a plurality of plasma chambers, the time required for adjusting the plasma processing chambers so as to eliminate the difference in performance and variation in processing among the plasma processing chambers to achieve the same processing results using the same process recipe may be months. The time required for such adjustment needs to be reduced. Also, the cost of substrates for inspection, the cost of processing the substrates for inspection, the labor cost for workers involved with the adjustment, and so forth are significantly high.

As described above, while the plasma processing apparatus is required to achieve a desired performance level, the multi-chamber plasma processing apparatus having the plurality of plasma processing chambers and the plasma processing system are required to eliminate the differences in the performance of plasma process among the plurality of plasma processing chambers.

Even when the plasma processing apparatus has been optimized as above, the plasma processing apparatus is generally disassembled before the transfer and then reassembled at the customer site. Thus, it is possible that the performance is not maintained at the level generated before the transfer due to the vibration during the transfer and inappropriate reassembly work.

When processes (1) to (3) described above are employed to evaluate whether the operation of the plasma processing apparatus and the difference among the plasma processing chambers are maintained within the required levels, it becomes necessary to actually operate the plasma processing apparatus and to examine the treated substrates using an ex-situ inspection method requiring a plurality of steps.

If the performance of the plasma processing apparatus does not satisfy the required levels, it is necessary to repeat long series of cycles of adjusting the plasma processing apparatus, performing a plasma process on a substrate, and evaluating the processed substrate, thereby extending the initialization process of the delivered plasma processing apparatus. The length of the time required to complete the initialization process of a production line directly effects the annual sales, and a prolonged initialization process leads to an opportunity loss since the products can not be made available for the market at a suitable time.

Thus, it is desired that the validation of the performance of the plasma processing apparatus be performed more easily and that the cycle of fault detection and performance of corrective action be performed in a shorter period of time, so as to shorten the initialization process of the plasma processing apparatus.

SUMMARY OF THE INVENTION

In view of the above, the present invention aims to achieve the following objects.

1. To facilitate the process for evaluating whether the plasma processing apparatus maintains a required performance level.

2. To rapidly provide maintenance and corrective action when the performance of the plasma processing apparatus is not maintained at the required level.

3. To provide a performance management system for managing the plasma processing apparatus located at the customer site to maintain the required level.

4. To provide the plasma processing apparatus which can be easily maintained at the required operation level.

5. To provide an evaluation method for easily and rapidly evaluating whether the plasma processing apparatus or system located at the customer site exhibits a required performance.

6. To provide a performance management system for managing the plasma processing apparatus or system located at the customer site to exhibit a required performance and for immediately performing corrective actions when the required performance is not achieved.

According to one aspect of the present invention, a performance evaluation method for a plasma processing apparatus using a radiofrequency characteristic A, the plasma processing apparatus comprising: a plasma processing chamber including an electrode for exciting a plasma and a radiofrequency feeder, the electrode being connected to an output end of the radiofrequency feeder; a radiofrequency generator for supplying a radiofrequency voltage to the electrode; and a matching circuit having an input terminal and an output terminal, the input terminal being connected to the radiofrequency generator and the output terminal being connected to an input end of the radiofrequency feeder so as to achieve impedance matching between the plasma processing chamber and the radiofrequency generator, the method comprises: calculating the absolute value of the difference $\Delta A$ between a radiofrequency characteristic $A_0$ at a time $t_0$ and a radiofrequency characteristic $A_1$ at a later time $t_1$ of the plasma processing chamber, the radiofrequency characteristics $A_0$ and $A_1$ being measured at the input end of the radiofrequency feeder; and determining that the plasma processing apparatus maintains a required level of performance when the absolute value is less than an upper limit and that the plasma processing apparatus does not maintain the required level of performance when the absolute value is not less than the upper limit.

According to another aspect of the present invention, a performance evaluation method for a plasma processing apparatus using a radiofrequency characteristic A, the plasma processing apparatus comprising: a plasma processing chamber including an electrode for exciting a plasma and a radiofrequency feeder, the electrode being connected to an output end of the radiofrequency feeder; a radiofrequency generator for supplying a radiofrequency voltage to the electrode; a radiofrequency supplier having an input end connected to the radiofrequency generator and an output end; and a matching circuit having an input terminal and an output terminal, the input terminal being connected to the output end of the radiofrequency supplier and the output terminal being connected to an input end of the radiofrequency feeder so as to achieve impedance matching between the plasma processing chamber and the radiofrequency generator, the method comprises: calculating the absolute value of the difference $\Delta A$ between a radiofrequency characteristic $A_0$ at a time $t_0$ and a radiofrequency characteristic $A_1$ at a later time $t_1$ of the plasma processing chamber, the radiofrequency characteristics $A_0$ and $A_1$ being measured at the input end of the radiofrequency supplier; and determining that the plasma processing apparatus maintains a required level of performance when the absolute value is less than an upper limit and that the plasma processing apparatus does not maintain the required level of performance when the absolute value is not less than the upper limit.

According to another aspect of the invention, a performance evaluation method for a plasma processing apparatus using a radiofrequency characteristic A, the plasma processing apparatus comprising: a plasma processing chamber including an electrode for exciting a plasma and a radiofrequency feeder, the electrode being connected to an output end of the radiofrequency feeder; a radiofrequency generator for supplying a radiofrequency voltage to the electrode; a radiofrequency supplier having an input end connected to the radiofrequency generator and an output end; and a matching circuit having an input terminal and an output terminal, the input terminal being connected to the output end of the radiofrequency supplier and the output terminal being connected to the input end of the radiofrequency feeder so as to achieve impedance matching between the plasma processing chamber and the radiofrequency generator, the method comprises: calculating the absolute value of the difference $\Delta A$ between a radiofrequency characteristic $A_0$ at a time $t_0$ and a radiofrequency characteristic $A_1$ at a later time $t_1$ of the plasma processing chamber, the radiofrequency characteristics $A_0$ and $A_1$ being measured at the input terminal of the matching circuit; and determining that the plasma processing apparatus maintains a required level of performance when the absolute value is less than an upper limit and that the plasma processing apparatus does not maintain the required level of performance when the absolute value is not less than the upper limit.

According to the present invention, a maintenance method for a plasma processing apparatus comprises performing a corrective action to correct the above-described radiofrequency characteristic A when the absolute value of $\Delta A$ calculated according to the above-described evaluation method is more than or equal to the upper limit.

According to another, aspect of the present invention, a performance management system for a plasma processing apparatus using a radiofrequency characteristic A, the plasma processing apparatus comprising: a plasma processing chamber including an electrode for exciting a plasma and a radiofrequency feeder, the electrode being connected to an output end of the radiofrequency feeder; a radiofrequency generator for supplying a radiofrequency voltage to the electrode; and a matching circuit having an input terminal and an output terminal, the input terminal being connected to the radiofrequency generator and the output terminal being connected to an input end of the radiofrequency feeder so as to achieve impedance matching between the plasma processing chamber and the radiofrequency generator, the performance management system comprises: a server storing data of a radiofrequency characteristic $A_0$ of the plasma processing chamber at a time $t_0$ measured at the input end of the radiofrequency feeder; and a customer I/O device linked to the server via a communication line. The server receives data of a radiofrequency characteristic $A_1$ at a later time $t_1$ from the customer I/O device, calculates the absolute value of the difference $\Delta A$ between the radiofrequency characteristics $A_0$ and $A_1$, and transmits a signal indicating that the plasma processing apparatus maintains the required level of performance when the absolute value is less than an upper limit and a signal indicating that the plasma processing apparatus does not maintain the required level of performance when the absolute value is not less than the upper limit, to the customer I/O device.

According to another aspect of the present invention, a performance management system for a plasma processing apparatus using a radiofrequency characteristic A, the plasma processing apparatus comprising: a plasma processing chamber including an electrode for exciting a plasma and a radiofrequency feeder, the electrode being connected to an output end of the radiofrequency feeder; a radiofrequency generator for supplying a radiofrequency voltage to the electrode; a radiofrequency supplier having an input end connected to the radiofrequency generator and an output end; and a matching circuit having an input terminal and an output terminal, the input terminal being connected to the output end of the radiofrequency supplier and the output terminal being connected to an input end of the radiofrequency-feeder so as to achieve impedance matching between the plasma processing chamber and the radiofrequency generator, the performance management system comprises: a server storing data of a radiofrequency characteristic $A_0$ of the plasma processing chamber at a time $t_0$ measured at the input end of the radiofrequency supplier; and a customer I/O device linked to the server via a communication line. The server receives data of a radiofrequency characteristic $A_1$ at a later time $t_1$ from the customer I/O device, calculates the absolute value of the difference $\Delta A$ between the radiofrequency characteristics $A_0$ and $A_1$, and transmits a signal indicating that the plasma processing apparatus maintains the required level of performance when the absolute value is less than an upper limit and a signal indicating that the plasma processing apparatus does not maintain the required level of performance when the absolute value is not less than the upper limit, to the customer I/O device.

According to another aspect of the present invention, a performance management system for a plasma processing apparatus using a radiofrequency characteristic A, the plasma processing apparatus comprising: a plasma processing chamber including an electrode for exciting a plasma and a radiofrequency feeder, the electrode being connected to an output end of the radiofrequency feeder; a radiofrequency generator for supplying a radiofrequency voltage to the electrode; a radiofrequency supplier having an input end connected to the radiofrequency generator and an output end; and a matching circuit having an input terminal and an output terminal, the input terminal being connected to the output end of the radiofrequency supplier and the output terminal being connected to an input end of the radiofrequency feeder so as to achieve impedance matching between the plasma processing chamber and the radiofrequency generator, the performance management system comprises: a server storing data of a radiofrequency characteristic $A_0$ of the plasma processing chamber at a time $t_0$ measured at the input terminal of the matching circuit; and a customer I/O device linked to the server via a communication line. The server receives data of a radiofrequency characteristic $A_1$ at a later time $t_1$ from the customer I/O device, calculates the absolute value of the difference $\Delta A$ between the radiofrequency characteristics $A_0$ and $A_1$, and transmits a signal indicating that the plasma processing apparatus maintains the required level of performance when the absolute value is less than an upper limit and a signal indicating that the plasma processing apparatus does not maintain the required level of performance when the absolute value is not less than the upper limit, to the customer I/O device.

According to another aspect of the present invention, a performance management system for a plasma processing apparatus using a radiofrequency characteristic A, the plasma processing apparatus comprising: a plasma processing chamber including an electrode for exciting a plasma and a radiofrequency feeder, the electrode being connected to an output end of the radiofrequency feeder; a radiofrequency generator for supplying a radiofrequency voltage to the electrode; and a matching circuit having an input terminal and an output terminal, the input terminal being connected to the radiofrequency generator and the output terminal being connected to an input end of the radiofrequency feeder so as to achieve impedance matching between the plasma processing chamber and the radiofrequency generator, the performance management system comprises: a server storing data of a radiofrequency characteristic $A_0$ of the plasma processing chamber at a time $t_0$ measured at the input end of the radiofrequency feeder and service engineer information according to fault levels each having a predetermined range; an output device for the server, the output device being located at a delivery site; and a customer I/O device linked to the server via a communication line. The server receives data of a radiofrequency characteristic $A_1$ at a later time $t_1$ from the customer I/O device, calculates the absolute value of the difference $\Delta A$ between the radiofrequency characteristics $A_0$ and $A_1$, and outputs the fault level, the service engineer information corresponding to the fault level, and a maintenance command corresponding to the fault level through the output device, if the absolute value falls within the fault level with the predetermined range.

According to another aspect of the invention, a performance management system for a plasma processing apparatus using a radiofrequency characteristic A, the plasma processing apparatus comprising: a plasma processing chamber including an electrode for exciting a plasma and a radiofrequency feeder, the electrode being connected to an output end of the radiofrequency feeder; a radiofrequency generator for supplying a radiofrequency voltage to the electrode; a radiofrequency supplier having an input end connected to the radiofrequency generator and an output end; and a matching circuit having an input terminal and an output terminal, the input terminal being connected to the output end of the radiofrequency supplier and the output terminal being connected to an input end of the radiofrequency feeder so as to achieve impedance matching between the plasma processing chamber and the radiofrequency generator, the performance management system comprises: a server storing a radiofrequency characteristic $A_0$ of the plasma processing chamber at a time $t_0$ measured at the input end of the radiofrequency supplier and service engineer information according to fault levels each having a predetermined range; an output device for the server, the output device being located at a delivery site; and a customer I/O device linked to the server via a communication line. The server receives data of a radiofrequency characteristic $A_1$ at a later time $t_1$ from the customer I/O device, calculates the absolute value of the difference $\Delta A$ between the radiofrequency characteristics $A_0$ and $A_1$, and outputs the fault level, the service engineer information corresponding to the fault level, and a maintenance command corresponding to the fault level through the output device, if the absolute value falls within the fault level with the predetermined range.

According to another aspect of the present invention, a performance management system for a plasma processing apparatus using a radiofrequency characteristic A, the plasma processing apparatus comprising: a plasma processing chamber including an electrode for exciting a plasma and a radiofrequency feeder, the electrode being connected to an output end of the radiofrequency feeder; a radiofrequency generator for supplying a radiofrequency voltage to the electrode; a radiofrequency supplier having an input end connected to the radiofrequency generator and an output end; and a matching circuit having an input terminal and an output terminal, the input terminal being connected to the output end of the radiofrequency supplier and the output terminal being connected to an input end of the radiofrequency feeder so as to achieve impedance matching between the plasma processing chamber and the radiofrequency generator, the performance management system comprises: a server storing data of a radiofrequency characteristic $A_0$ of the plasma processing chamber at a time $t_0$ measured at the input terminal of the matching circuit and service engineer information according to fault levels each having a predetermined range; an output device for the server, the output device being located at a delivery site; and a customer I/O device linked to the server via a communication line. The server receives data of a radiofrequency characteristic $A_1$ at a later time $t_1$ from the customer I/O device, calculates the absolute value of the difference $\Delta A$ between the radiofrequency characteristics $A_0$ and $A_1$, and outputs the fault level, the service engineer information corresponding to the fault level, and a maintenance command corresponding to the fault level through the output device, if the absolute value falls within the fault level with the predetermined range.

According to another aspect of the present invention, a plasma processing apparatus comprises: a plasma processing chamber including an electrode for exciting a plasma and a radiofrequency feeder, the electrode being connected to an output end of the radiofrequency feeder; a radiofrequency generator for supplying a radiofrequency voltage to the electrode; and a matching circuit having an input terminal and an output terminal, the input terminal being connected to the radiofrequency generator and the output terminal being connected to an input end of the radiofrequency feeder so as to achieve impedance matching between the plasma processing chamber and the radiofrequency generator. The absolute value of the difference $\Delta A$ between a radiofrequency characteristics $A_0$ at a time $t_0$ and radiofrequency characteristic $A_1$ at a later time $t_1$ of a radiofrequency characteristic A of the plasma processing chamber is maintained at a value which is less than an upper limit, and the radiofrequency characteristics $A_0$ and $A_1$ is measured at the input end of the radiofrequency feeder.

According to another aspect of the present invention, a plasma processing apparatus comprises: a plasma processing chamber including an electrode for exciting a plasma and a radiofrequency feeder, the electrode being connected to an output end of the radiofrequency feeder; a radiofrequency generator for supplying a radiofrequency voltage to the electrode; a radiofrequency supplier having an input end connected to the radiofrequency generator and an output end; and a matching circuit having an input terminal and an output terminal, the input terminal being connected to the output end of the radiofrequency supplier and the output terminal being connected to an input end of the radiofrequency feeder so as to achieve impedance matching between the plasma processing chamber and the radiofrequency generator. The absolute value of the difference $\Delta A$ between a radiofrequency characteristics $A_0$ at a time $t_0$ and radiofrequency characteristic $A_1$ at a later time $t_1$ of a radiofrequency characteristic A of the plasma processing chamber is maintained at a value which is less than an upper limit, and the radiofrequency characteristics $A_0$ and $A_1$ is measured at the input end of the radiofrequency supplier.

According to another aspect of the present invention, a plasma processing apparatus comprises: a plasma processing chamber including an electrode for exciting a plasma and a radiofrequency feeder, the electrode being connected to an output end of the radiofrequency feeder; a radiofrequency generator for supplying a radiofrequency voltage to the electrode; a radiofrequency supplier having an input end connected to the radiofrequency generator and an output end; and a matching circuit having an input terminal and an output terminal, the input terminal being connected to the output end of the radiofrequency supplier and the output terminal being connected to the input end of the radiofrequency feeder so as to achieve impedance matching between the plasma processing chamber and the radiofrequency generator. The absolute value of the difference $\Delta A$ between a radiofrequency characteristics $A_0$ at a time $t_0$ and radiofrequency characteristic $A_1$ at a later time $t_1$ of a radiofrequency characteristic A of the plasma processing chamber is maintained at a value which is less than an upper limit, and the radiofrequency characteristics $A_0$ and $A_1$ is measured at the input terminal of the matching circuit.

According to another aspect of the present invention, a performance validation system for the above-described plasma processing apparatus comprises a customer terminal, an engineer terminal, and information providing means. The customer terminal requests browsing of performance information at the time $t_0$ and the later time $t_1$ to the information providing means via a public line, a maintenance engineer uploads the performance information to the information providing means through the engineer terminal, and the information providing means provides the performance information uploaded from the engineer terminal to the customer terminal upon the request from the customer terminal.

In each of the above aspects of the present invention, the radiofrequency characteristic A is preferably any one of a resonant frequency f, an impedance $Z_{ef}$ at the frequency of the radiofrequency waves, a resistance $R_{ef}$ at the frequency of the radiofrequency waves, and a reactance $X_{ef}$ at the frequency of the radiofrequency waves.

In each of the above aspects of the present invention, the upper limit is preferably 10% of $A_0$, and more preferably, 3% of $A_0$.

In each of the above aspects of the present invention, a workpiece may be introduced into the plasma processing chamber between the time $t_0$ and the later time $t_1$ to plasma-treat the workpiece. Also, an adjustment work including overhaul, parts replacement, and assembly with alignment of the plasma processing chamber may be performed between the time $t_0$ and the later time $t_1$. These events may affect the radiofrequency characteristic A.

Alternatively, in the above-described performance management system of the plasma processing apparatus according to the present invention, the server may store the data of radiofrequency characteristic $A_0$ according to identification numbers of the plasma processing chambers, may receive the data of the identification number of the plasma processing chamber sent from the customer I/O device, and may perform calculation using $A_0$ associated with this identification number.

Alternatively, in the above-described performance management system of the plasma processing apparatus according to the present invention, the customer I/O device may be connected to an impedance meter which is connected to the plasma processing chamber so that data of the radiofrequency characteristic $A_1$ is directly transmitted from the impedance meter to the server.

Alternatively, in the above-described performance management system of the plasma processing apparatus according to the present invention, the server may be provided with an output device located at a delivery site so that a maintenance command can be output from the output device when the absolute value of $\Delta A$ is not less than the upper limit.

Alternatively, in the above-described performance management system of the plasma processing apparatus according to the present invention, the server may output the maintenance command from the output device located at the delivery site and at the same time transmit the fault level to the customer I/O device.

Preferably, in the plasma processing apparatus of the present invention described above, corrective action for correcting the radiofrequency characteristic A is performed when the absolute value of $\Delta A$ is not less than the upper limit so that the absolute value of $\Delta A$ is maintained at less than the upper limit.

Preferably, in the performance validation system of the plasma processing apparatus of the present invention described above, the performance information contains information on the radiofrequency characteristic A. Moreover, the performance information may be output as a catalog or a specification document.

According to another aspect of the present invention, in a performance evaluation method for a plasma processing apparatus which is disassembled before transfer, is transferred to a customer, and is reassembled at a customer site, the plasma processing apparatus comprising a plasma processing chamber including an electrode for exciting a plasma and a radiofrequency feeder, the electrode being connected to an output end of the radiofrequency feeder; a radiofrequency generator for supplying a radiofrequency voltage to the electrode; and a matching circuit having an input terminal and an output terminal, the input terminal being connected to the radiofrequency generator and the output terminal being connected to an input end of the radiofrequency feeder so as to achieve impedance matching between the plasma processing chamber and the radiofrequency generator, the method comprises determining that the plasma processing apparatus maintains a required level of performance when three times a first series resonant frequency $f_{01}$ of the plasma processing chamber after the delivery is larger than the power frequency $f_e$ of the radiofrequency and that the plasma processing apparatus does not maintain the required level of performance when three times the first series resonant frequency $f_{01}$ is not larger than the power frequency $f_e$, wherein the first series resonant frequency $f_{01}$ is measured at the input end of the radiofrequency feeder.

According to another aspect of the present invention, in a performance evaluation method for a plasma processing apparatus which is disassembled before transfer, is transferred to a customer, and is reassembled at a customer site, the plasma processing apparatus comprising a plurality of plasma processing chambers each including an electrode for exciting a plasma and a radiofrequency feeder, the electrode being connected to an output end of the radiofrequency feeder; a radiofrequency generator for supplying a radiofrequency voltage to the electrode of each of the plasma processing chambers; and a matching circuit having an input terminal and an output terminal, the input terminal being connected to the radiofrequency generator and the output terminal being connected to an input end of the radiofrequency feeder so as to achieve impedance matching between the plasma processing chamber and the radiofrequency generator, the method comprises determining that the plasma processing apparatus maintains a required level of performance when a variation $A_{1r}$, defined by $(A_{1max}-A_{1min})/(A_{1max}+A_{1min})$, between the maximum frequency $A_{1max}$ and the minimum frequency $A_{1min}$ among radiofrequency characteristics A of the plurality of plasma processing chambers is less than an upper limit and that the plasma processing apparatus does not maintain the required level of performance when the variation is not less than the upper limit, wherein the radiofrequency characteristics A are measured at the input ends of the radiofrequency feeders.

According to another aspect of the present invention, in a performance evaluation method for a plasma processing apparatus which is disassembled before transfer, is transferred to a customer, and is reassembled at a customer site, the plasma processing apparatus comprising a plurality of plasma processing chambers, each including an electrode for exciting a plasma and a radiofrequency feeder, the electrode being connected to an output end of the radiofrequency feeder; a radiofrequency generator for supplying a radiofrequency voltage to the electrode of each of the plasma processing chambers; a radiofrequency supplier, an input end being connected to the radiofrequency generator; and a matching circuit having an input terminal and an output terminal, the input terminal being connected to the output end of the radiofrequency supplier and the output terminal being connected to an input end of the radiofrequency feeder so as to achieve impedance matching between the plasma processing chamber and the radiofrequency generator, the method comprises determining that the plasma processing apparatus maintains a required level of performance when a variation $A_{1r}$, defined by $(A_{1max}-A_{1min})/(A_{1max}+A_{1min})$, between the maximum frequency $A_{1max}$ and the minimum frequency $A_{1min}$ among radiofrequency characteristics A of the plurality of plasma processing chambers is less than an upper limit and that the plasma processing apparatus does not maintain the required level of performance when the variation is not less than the upper limit, wherein the radiofrequency characteristics A are measured at the input terminals of the matching circuits.

According to another aspect of the present invention, in a performance evaluation method for a plasma processing apparatus which is disassembled before transfer, is transferred to a customer, and is reassembled at a customer site, the plasma processing apparatus comprising: a plurality of plasma processing chambers, each including an electrode for exciting a plasma and a radiofrequency feeder, the electrode being connected to an output end of the radiofrequency feeder; a radiofrequency generator for supplying a radiofrequency voltage to the electrode of each of the plasma processing chambers; a radiofrequency supplier, an input end being connected to the radiofrequency generator; and a matching circuit having an input terminal and an output terminal, the input terminal being connected to the output end of the radiofrequency supplier and the output terminal being connected to an input end of the radiofrequency feeder so as to achieve impedance matching between the plasma processing chamber and the radiofrequency generator, the method comprises determining that the plasma processing apparatus maintains a required level of performance when a variation $A_{1r}$, defined by $(A_{1max}-A_{1min})/(A_{1max}+A_{1min})$, between the maximum frequency $A_{1max}$ and the minimum frequency $A_{1min}$ among radiofrequency characteristics A of the plurality of plasma processing chambers is less than an upper limit and that the plasma processing apparatus does not maintain the required level of performance when the variation is not less than the upper limit, wherein the radiofrequency characteristics A are measured at the input ends of the radiofrequency suppliers.

According to another aspect of the present invention, in a performance evaluation method for a plasma processing apparatus which is disassembled before transfer, is transferred to a customer, and is reassembled at a customer site, the plasma processing apparatus comprising a plurality of plasma processing chambers, each including an electrode for exciting a plasma and a radiofrequency feeder, the electrode being connected to an output end of the radiofrequency feeder; a radiofrequency generator for supplying a radiofrequency voltage to the electrode; and a matching circuit having an input terminal and an output terminal, the input terminal being connected to the radiofrequency generator and the output terminal being connected to an input end of the radiofrequency feeder so as to achieve impedance matching between the plasma processing chamber and the radiofrequency generator, the method comprises determining that the plasma processing apparatus maintains a required level of performance when a variation $f_{01r}$, defined by $(f_{01max}-f_{01min})/(f_{01max}+f_{01min})$, between the maximum $f_{01max}$ and the minimum $f_{01min}$ of the first series resonant frequencies $f_{01}$ of the plurality of plasma processing chambers after the delivery is less than an upper limit and when three times of the first series resonant frequency $f_{01}$ of each plasma processing chamber after the delivery is larger than the power frequency $f_e$ of the radiofrequency and that the plasma processing apparatus does not maintain the required level of performance when the variation $f_{01r}$ is not less than the upper limit or when three times the first series resonant frequency $f_{01}$ is not larger than the power frequency $f_e$, wherein the first series resonant frequency $f_{01}$ is measured at the input end of the radiofrequency feeder.

According to another aspect of the present invention, in a performance evaluation method for a plasma processing apparatus which is disassembled before transfer, is transferred to a customer, and is reassembled at a customer site, the plasma processing apparatus comprising a plurality of plasma processing chambers, each including an electrode for exciting a plasma and a radiofrequency feeder, the electrode being connected to an output end of the radiofrequency feeder; a radiofrequency generator for supplying a radiofrequency voltage to the electrode of each of the plasma processing chambers; a radiofrequency supplier, an input end being connected to the radiofrequency generator; and a matching circuit having an input terminal and an output terminal, the input terminal being connected to the output end of the radiofrequency supplier and the output terminal being connected to an input end of the radiofrequency feeder so as to achieve impedance matching between the plasma processing chamber and the radiofrequency generator, the method comprises determining that the plasma processing apparatus maintains a required level of performance when a variation $f_{01r}$, defined by $(f_{01max}-f_{01min})/(f_{01max}+f_{01min})$ between the maximum $f_{01max}$ and the minimum $f_{01min}$ of the first series resonant frequencies $f_{01}$ of the plurality of plasma processing chambers after the delivery is less than an upper limit and when three times of the first series resonant frequency $f_{01}$ of each plasma processing chamber after the delivery is larger than the power frequency $f_e$ of the radiofrequency and that the plasma processing apparatus does not maintain the required level of performance when the variation $f_{01r}$ is not less than the upper limit or when three times the first series resonant frequency $f_{01}$ is not larger than the power frequency $f_e$, wherein the first series resonant frequency $f_{01}$ are measured at the input terminal of the matching circuit.

According to another aspect of the present invention, in a performance evaluation method for a plasma processing apparatus which is disassembled before transfer, is transferred to a customer, and is reassembled at a customer site, the plasma processing apparatus comprising a plurality of plasma processing chambers, each including an electrode for exciting a plasma and a radiofrequency feeder, the electrode being connected to an output end of the radiofrequency feeder; a radiofrequency generator for supplying a radiofrequency voltage to the electrode of each of the plasma processing chambers; a radiofrequency supplier, an input end being connected to the radiofrequency generator; and a matching circuit having an input terminal and an output terminal, the input terminal being connected to the output end of the radiofrequency supplier and the output terminal being connected to an input end of the radiofrequency feeder so as to achieve impedance matching between the plasma processing chamber and the radiofrequency generator, the method comprises determining that the plasma processing apparatus maintains a required level of performance when a variation $f_{01r}$, defined by $(f_{01max}-f_{01min})/(f_{01max}+f_{01min})$ between the maximum $f_{01max}$ and the minimum $f_{01min}$ of the first series resonant frequencies $f_{01}$ of the plurality of plasma processing chambers after the delivery is less than an upper limit and when three times of the first series resonant frequency $f_{01}$ of each plasma processing chamber after the delivery is larger than the power frequency $f_e$ of the radiofrequency and that the plasma processing apparatus does not maintain the required level of performance when the variation $f_{01r}$ is not less than the upper limit or when three times the first series resonant frequency $f_{01}$ is not larger than the power frequency $f_e$, wherein the first series resonant frequency $f_{01}$ are measured at the input end of the radiofrequency supplier.

According to another aspect of the present invention, in a performance evaluation method for a plasma processing system which includes a plurality of plasma processing apparatuses and is disassembled before transfer, is transferred to a customer, and is reassembled at a customer site, each plasma processing apparatus comprising a plasma processing chamber including an electrode for exciting a plasma and a radiofrequency feeder, the electrode being connected to an output end of the radiofrequency feeder; a radiofrequency generator for supplying a radiofrequency voltage to the electrode; and a matching circuit having an input terminal and an output terminal, the input terminal being connected to the radiofrequency generator and the output terminal being connected to an input end of the radiofrequency feeder so as to achieve impedance matching between the plasma processing chamber and the radiofrequency generator, the method comprises determining that the plasma processing apparatus maintains a required level of performance when a variation $A_{1r}$, defined by $(A_{1max}-A_{1min})/(A_{1max}+A_{1min})$, between the maximum $A_{1max}$ and the minimum $A_{1min}$ of the radiofrequency characteristics A of the plasma processing chambers after the delivery is less than an upper limit and that the plasma processing apparatus does not maintain the required level of performance when the variation $A_{1r}$ is not less than the upper limit, wherein the first series resonant frequency $f_{01}$ is measured at the input end of the radiofrequency feeder.

According to another aspect of the present invention, in a performance evaluation method for a plasma processing system which includes a plurality of plasma processing apparatuses and is disassembled before transfer, is transferred to a customer, and is reassembled at a customer site, each plasma processing apparatus comprising a plasma processing chamber including an electrode for exciting a plasma and a radiofrequency feeder, the electrode being connected to an output end of the radiofrequency feeder; a radiofrequency generator for supplying a radiofrequency voltage to the electrode of each of the plasma processing chambers; a radiofrequency supplier, an input end being connected to the radiofrequency generator; and a matching circuit having an input terminal and an output terminal, the input terminal being connected to the output end of the radiofrequency supplier and the output terminal being connected to an input end of the radiofrequency feeder so as to achieve impedance matching between the plasma processing chamber and the radiofrequency generator, the method comprises determining that the plasma processing apparatus maintains a required level of performance when a variation $A_{1r}$, defined by $(A_{1max}-A_{1min})/(A_{1max}+A_{1min})$, between the maximum $A_{1max}$ and the minimum $A_{1min}$ of the radiofrequency characteristics A of the plasma processing chambers after the delivery is less than an upper limit and that the plasma processing apparatus does not maintain the required level of performance when the variation $A_{1r}$ is not less than the upper limit, wherein the radiofrequency characteristics A are measured at the input terminals of the matching circuits.

According to another aspect of the present invention, in a performance evaluation method for a plasma processing system which includes a plurality of plasma processing apparatuses and is disassembled before transfer, is transferred to a customer, and is reassembled at a customer site, each plasma processing apparatus comprising a plasma processing chamber including an electrode for exciting a plasma and a radiofrequency feeder, the electrode being connected to an output end of the radiofrequency feeder; a radiofrequency generator for supplying a radiofrequency voltage to the electrode of each of the plasma processing chambers; a radiofrequency supplier, an input end being connected to the radiofrequency generator; and a matching circuit having an input terminal and an output terminal, the input terminal being connected to the output end of the radiofrequency supplier and the output terminal being connected to an input end of the radiofrequency feeder so as to achieve impedance matching between the plasma processing chamber and the radiofrequency generator, the method comprises determining that the plasma processing apparatus maintains a required level of performance when a variation $A_{1r}$, defined by $(A_{1max}-A_{1min})/(A_{1max}+A_{1min})$, between the maximum $A_{1max}$ and the minimum $A_{1min}$ of the radiofrequency characteristics A of the plasma processing chambers after the delivery is less than an upper limit and that the plasma processing apparatus does not maintain the required level of performance when the variation $A_{1r}$ is not less than the upper limit, wherein the radiofrequency characteristics A are measured at the input ends of the radiofrequency suppliers.

According to another aspect of the present invention, in a performance evaluation method for a plasma processing system which includes a plurality of plasma processing apparatuses and is disassembled before transfer, is transferred to a customer, and is reassembled at a customer site, each plasma processing apparatus comprising a plasma processing chamber including an electrode for exciting a plasma and a radiofrequency feeder, the electrode being connected to an output end of the radiofrequency feeder; a radiofrequency generator for supplying a radiofrequency voltage to the electrode; and a matching circuit having an input terminal and an output terminal, the input terminal being connected to the radiofrequency generator and the output terminal being connected to an input end of the radiofrequency feeder so as to achieve impedance matching between the plasma processing chamber and the radiofrequency generator, the method comprises determining that the plasma processing apparatus maintains a required level of performance when a variation $f_{01r}$, defined by $(f_{01max}-f_{01min})/(f_{01max}+f_{01min})$, between the maximum $f_{01max}$ and the minimum $f_{01min}$ of the first series resonant frequencies $f_{01}$ of the plurality of plasma processing chambers after the delivery is less than an upper limit and when three times of the first series resonant frequency $f_{01}$ of each plasma processing chamber after the delivery is larger than the power frequency $f_e$ of the radiofrequency and that the plasma processing apparatus does not maintain the required level of performance when the variation $f_{01r}$ is not less than the upper limit or when three times the first series resonant frequency $f_{01}$ is not larger than the power frequency $f_e$, wherein the first series resonant frequency $f_{01}$ is measured at the input end of the radiofrequency feeder.

According to another aspect of the present invention, in a performance evaluation method for a plasma processing system which includes a plurality of plasma processing apparatuses and is disassembled before transfer, is transferred to a customer, and is reassembled at a customer site, each plasma processing apparatus comprising a plasma processing chamber including an electrode for exciting a plasma and a radiofrequency feeder, the electrode being connected to an output end of the radiofrequency feeder; a radiofrequency generator for supplying a radiofrequency voltage to the electrode of each of the plasma processing chambers; a radiofrequency supplier, an input end being connected to the radiofrequency generator; and a matching circuit having an input terminal and an output terminal, the input terminal being connected to the output end of the radiofrequency supplier and the output terminal being connected to an input end of the radiofrequency feeder so as to achieve impedance matching between the plasma processing chamber and the radiofrequency generator, the method comprises determining that the plasma processing apparatus maintains a required level of performance when a variation $f_{01r}$, defined by $(f_{01max}-f_{01min})/(f_{01max}+f_{01min})$, between the maximum $f_{01max}$ and the minimum $f_{01min}$ of the first series resonant frequencies $f_{01}$ of the plurality of plasma processing chambers after the delivery is less than an upper limit and when three times of the first series resonant frequency $f_{01}$ of each plasma processing chamber after the delivery is larger than the power frequency $f_e$ of the radiofrequency and that the plasma processing apparatus does not maintain the required level of performance when the variation $f_{01r}$ is not less than the upper limit or when three times the first series resonant frequency $f_{01}$ is not larger than the power frequency $f_e$, wherein the first series resonant frequency $f_{01}$ are measured at the input terminal of the matching circuit.

According to another aspect of the present invention, in a performance evaluation method for a plasma processing system which includes a plurality of plasma processing apparatuses and is disassembled before transfer, is transferred to a customer, and is reassembled at a customer site, each plasma processing apparatus comprising a plasma processing chamber including an electrode for exciting a plasma and a radiofrequency feeder, the electrode being connected to an output end of the radiofrequency feeder; a radiofrequency generator for supplying a radiofrequency voltage to the electrode of each of the plasma processing chambers; a radiofrequency supplier, an input end being connected to the radiofrequency generator; and a matching circuit having an input terminal and an output terminal, the input terminal being connected to the output end of the radiofrequency supplier and the output terminal being connected to an input end of the radiofrequency feeder so as to achieve impedance matching between the plasma processing chamber and the radiofrequency generator, the method comprises determining that the plasma processing apparatus maintains a required level of performance when a variation $f_{01r}$, defined by $(f_{01max}-f_{01min})/(f_{01max}+f_{01min})$, between the maximum $f_{01max}$ and the minimum $f_{01min}$ of the first series resonant frequencies $f_{01}$ of the plurality of plasma processing chambers after the delivery is less than an upper limit and when three times of the first series resonant frequency $f_{01}$ of each plasma processing chamber after the delivery is larger than the power frequency $f_e$ of the radiofrequency and that the plasma processing apparatus does not maintain the required level of performance when the variation $f_{01r}$ is not less than the upper limit or when three times the first series resonant frequency $f_{01}$ is not larger than the power frequency $f_e$, wherein the first series resonant frequency $f_{01}$ are measured at the input end of the radiofrequency supplier.

According to another aspect of the present invention, in a performance management system for a plasma processing system which is disassembled before transfer, is transferred to a customer, and is reassembled at a customer site, the plasma processing system comprising a plasma processing apparatus comprising a plasma processing chamber including an electrode for exciting a plasma and a radiofrequency feeder, the electrode being connected to an output end of the radiofrequency feeder; a radiofrequency generator for supplying a radiofrequency voltage to the electrode; and a matching circuit having an input terminal and an output terminal, the input terminal being connected to the radiofrequency generator and the output terminal being connected to an input end of the radiofrequency feeder so as to achieve impedance matching between the plasma processing chamber and the radiofrequency generator, the performance management system comprises a sever for storing data of a power frequency $f_e$ which is supplied from the radiofrequency generator to the plasma processing chamber, and a customer I/O device linked to the server via a communication line, wherein the server receives data of a first series resonant frequency $f_{01}$ of each plasma processing chamber after the delivery from the customer I/O device, wherein the first series resonant frequency $f_{01}$ is measured at the input end of the radiofrequency feeder, and transmits a signal indicating satisfying the required level of performance when three times the first series resonant frequency $f_{01}$ is larger than the power frequency $f_e$ and a signal indicating not satisfying the required level of performance when three times the first series resonant frequency $f_{01}$ is not larger than the power frequency $f_e$.

According to another aspect of the present invention, in a performance management system for a plasma processing system which is disassembled before transfer, is transferred to a customer, and is reassembled at a customer site, the plasma processing system comprising a plurality of plasma processing apparatuses, each comprising a plasma processing chamber including an electrode for exciting a plasma and a radiofrequency feeder, the electrode being connected to an output end of the radiofrequency feeder; a radiofrequency generator for supplying a radiofrequency voltage to the electrode; and a matching circuit having an input terminal and an output terminal, the input terminal being connected to the radiofrequency generator and the output terminal being connected to an input end of the radiofrequency feeder so as to achieve impedance matching between the plasma processing chamber and the radiofrequency generator, the performance management system comprises a sever for storing data of a power frequency $f_e$ which is supplied from the radiofrequency generator to the plasma processing chamber, and a customer I/O device linked to the server via a communication line, wherein the server receives data of first series resonant frequencies $f_{01}$ of plasma processing chambers after the delivery from the customer I/O device, wherein the first series resonant frequencies $f_{01}$ are measured at the input end of each radiofrequency feeder, and transmits a signal indicating satisfying the required level of performance when three times the first series resonant frequency $f_{01}$ is larger than the power frequency $f_e$ in all the plasma processing chambers and a signal indicating not satisfying the required level of performance when three times the first series resonant frequency $f_{01}$ is not larger than the power frequency $f_e$ in any one of the plasma processing chambers.

According to another aspect of the present invention, in a performance management system for a plasma processing system which is disassembled before transfer, is transferred to a customer, and is reassembled at a customer site, the plasma processing system comprising a plurality of plasma processing apparatuses, each comprising a plasma processing chamber including an electrode for exciting a plasma and a radiofrequency feeder, the electrode being connected to an output end of the radiofrequency feeder; a radiofrequency generator for supplying a radiofrequency voltage to the electrode; and a matching circuit having an input terminal and an output terminal, the input terminal being connected to the radiofrequency generator and the output terminal being connected to an input end of the radiofrequency feeder so as to achieve impedance matching between the plasma processing chamber and the radiofrequency generator, the performance management system comprises a server including an output device and a customer I/O device linked to the server via a communication line, wherein the server receives data of identification numbers and radiofrequency characteristics $A_1$ of the plasma processing chambers after the delivery from the customer I/O device, and outputs the identification numbers and a maintenance command through the output device when a variation $A_{1r}$, defined by $(A_{1max}-A_{1min})/(A_{1max}+A_{1min})$ between the maximum frequency $A_{1max}$ and the minimum frequency $A_{1min}$ among radiofrequency characteristics $A_1$ is not less than an upper limit, wherein the radiofrequency characteristics A are measured at the input ends of the radiofrequency feeders.

According to another aspect of the present invention, in a performance management system for a plasma processing system which is disassembled before transfer, is transferred to a customer, and is reassembled at a customer site, the plasma processing system comprising a plurality of plasma processing apparatuses, each comprising a plasma processing chamber including an electrode for exciting a plasma and a radiofrequency feeder, the electrode being connected to an output end of the radiofrequency feeder; a radiofrequency generator for supplying a radiofrequency voltage to the electrode; a radiofrequency supplier having an input end connected to the radiofrequency generator and an output end; and a matching circuit having an input terminal and an output terminal, the input terminal being connected to the output end of the radiofrequency supplier and the output terminal being connected to an input end of the radiofrequency feeder so as to achieve impedance matching between the plasma processing chamber and the radiofrequency generator, the performance management system comprises a server including an output device and a customer I/O device linked to the server via a communication line, wherein the server receives data of identification numbers and radiofrequency characteristics $A_1$ of the plasma processing chambers after the delivery from the customer I/O device, and outputs the identification numbers and a maintenance command through the output device when a variation $A_{1r}$, defined by $(A_{1max}-A_{1min})/(A_{1max}+A_{1min})$, between the maximum frequency $A_{1max}$ and the minimum frequency $A_{1min}$ among radiofrequency characteristics $A_1$ is not less than an upper limit, wherein the radiofrequency characteristics A are measured at the input ends of the radiofrequency suppliers.

According to another aspect of the present invention, in a performance management system for a plasma processing system which is disassembled before transfer, is transferred to a customer, and is reassembled at a customer site, the plasma processing system comprising a plurality of plasma processing apparatuses, each comprising a plasma processing chamber including an electrode for exciting a plasma and a radiofrequency feeder, the electrode being connected to an output end of the radiofrequency feeder; a radiofrequency generator for supplying a radiofrequency voltage to the electrode; a radiofrequency supplier having an input end connected to the radiofrequency generator and an output end; and a matching circuit having an input terminal and an output terminal, the input terminal being connected to the output end of the radiofrequency supplier and the output terminal being connected to an input end of the radiofrequency feeder so as to achieve impedance matching between the plasma processing chamber and the radiofrequency generator, the performance management system comprises a server including an output device and a customer I/O device linked to the server via a communication line, wherein the server receives data of identification numbers and radiofrequency characteristics $A_1$ of the plasma processing chambers after the delivery from the customer I/O device, and outputs the identification numbers and a maintenance command through the output device when a variation $A_{1r}$, defined by $(A_{1max}-A_{1min})/(A_{1max}+A_{1min})$, between the maximum frequency $A_{1max}$ and the minimum frequency $A_{1min}$ among radiofrequency characteristics $A_1$ is not less than an upper limit, wherein the radiofrequency characteristics A are measured at the input terminals of the matching circuits.

According to another aspect of the present invention, in a performance management system for a plasma processing system which includes a plurality of plasma processing apparatuses and is disassembled before transfer, is transferred to a customer, and is reassembled at a customer site, each plasma processing apparatus comprising a plasma processing chamber including an electrode for exciting a plasma and a radiofrequency feeder, the electrode being connected to an output end of the radiofrequency feeder; a radiofrequency generator for supplying a radiofrequency voltage to the electrode; and a matching circuit having an input terminal and an output terminal, the input terminal being connected to the radiofrequency generator and the output terminal being connected to an input end of the radiofrequency feeder so as to achieve impedance matching between the plasma processing chamber and the radiofrequency generator, the performance management system comprises a server which stores data of the power frequency $f_e$ supplied from the radiofrequency generator to the plasma processing chambers; and a customer I/O device linked to the server via a communication line, wherein the server receives the first series resonant frequencies $f_{01}$ measured at the input end of the radiofrequency feeder after the delivery of the plasma processing chambers, and transmits a signal indicating satisfying the required level of the performance when the three times the first resonant frequency $f_{01}$ is larger than the power frequency $f_e$ in all the plasma processing chambers, and a signal indicating not satisfying the required level of the performance when the three times the first resonant frequency $f_{01}$ is not larger than the power frequency $f_e$ in any one of the plasma processing chambers.

According to another aspect of the present invention, in a performance management system for a plasma processing system which includes a plurality of plasma processing apparatuses and is disassembled before transfer, is transferred to a customer, and is reassembled at a customer site, each plasma processing apparatus comprising a plasma processing chamber including an electrode for exciting a plasma and a radiofrequency feeder, the electrode being connected to an output end of the radiofrequency feeder; a radiofrequency generator for supplying a radiofrequency voltage to the electrode; and a matching circuit having an input terminal and an output terminal, the input terminal being connected to the radiofrequency generator and the output terminal being connected to an input end of the radiofrequency feeder so as to achieve impedance matching between the plasma processing chamber and the radiofrequency generator, the performance management system comprises a server which stores data of the power frequency $f_e$ supplied from the radiofrequency generator to the plasma processing chambers; and a customer I/O device linked to the server via a communication line, wherein the server receives the first series resonant frequencies $f_{01}$ measured at the input end of the radiofrequency supplier after the delivery of the plasma processing chambers, and transmits a signal indicating satisfying the required level of the performance when the three times the first resonant frequency $f_{01}$ is larger than the power frequency $f_e$ in all the plasma processing chambers, and a signal indicating not satisfying the required level of the performance when the three times the first resonant frequency $f_{01}$ is not larger than the power frequency $f_e$ in any one of the plasma processing chambers.

According to another aspect of the present invention, in a performance management system for a plasma processing system which includes a plurality of plasma processing apparatuses and is disassembled before transfer, is transferred to a customer, and is reassembled at a customer site, each plasma processing apparatus comprising a plasma processing chamber including an electrode for exciting a plasma and a radiofrequency feeder, the electrode being connected to an output end of the radiofrequency feeder; a radiofrequency generator for supplying a radiofrequency voltage to the electrode; and a matching circuit having an input terminal and an output terminal, the input terminal being connected to the radiofrequency generator and the output terminal being connected to an input end of the radiofrequency feeder so as to achieve impedance matching between the plasma processing chamber and the radiofrequency generator, the performance management system comprises a server which stores data of the power frequency $f_e$ supplied from the radiofrequency generator to the plasma processing chambers; and a customer I/O device linked to the server via a communication line, wherein the server receives the first series resonant frequencies $f_{01}$ measured at the input terminal of the matching circuit after the delivery of the plasma processing chambers, and transmits a signal indicating satisfying the required level of the performance when the three times the first resonant frequency $f_{01}$ is larger than the power frequency $f_e$ in all the plasma processing chambers, and a signal indicating not satisfying the required level of the performance when the three times the first resonant frequency $f_{01}$ is not larger than the power frequency $f_e$ in any one of the plasma processing chambers.

According to another aspect of the present invention, in a performance management system for a plasma processing system which includes a plurality of plasma processing apparatuses and is disassembled before transfer, is transferred to a customer, and is reassembled at a customer site, each plasma processing apparatus comprising a plasma processing chamber including an electrode for exciting a plasma and a radiofrequency feeder, the electrode being connected to an output end of the radiofrequency feeder; a radiofrequency generator for supplying a radiofrequency voltage to the electrode; and a matching circuit having an input terminal and an output terminal, the input terminal being connected to the radiofrequency generator and the output terminal being connected to an input end of the radiofrequency feeder so as to achieve impedance matching between the plasma processing chamber and the radiofrequency generator, the performance management system comprises a server having an output device, and a customer I/O device linked to the server via a communication line, wherein the server receives data of the identification numbers and the radiofrequency characteristics $A_1$ measured at the input end of the radiofrequency feeder after the delivery of the plasma processing chambers, and outputs the identification numbers and a maintenance command through the output device when the variation $A_{1r}$, defined by $(A_{1max}-A_{1min})/(A_{1max}+A_{1min})$, between the maximum frequency $A_{1max}$ and the minimum frequency $A_{1min}$ among radiofrequency characteristics $A_1$ is not less than the upper limit.

According to another aspect of the present invention, in a performance management system for a plasma processing system which includes a plurality of plasma processing apparatuses and is disassembled before transfer, is transferred to a customer, and is reassembled at a customer site, each plasma processing apparatus comprising a plasma processing chamber including an electrode for exciting a plasma and a radiofrequency feeder, the electrode being connected to an output end of the radiofrequency feeder; a radiofrequency generator for supplying a radiofrequency voltage to the electrode; and a matching circuit having an input terminal and an output terminal, the input terminal being connected to the radiofrequency generator and the output terminal being connected to an input end of the radiofrequency feeder so as to achieve impedance matching between the plasma processing chamber and the radiofrequency generator, the performance management system comprises a server having an output device, and a customer I/O device linked to the server via a communication line, wherein the server receives data of the identification numbers and the radiofrequency characteristics $A_1$ measured at the input end of the radiofrequency supplier after the delivery of the plasma processing chambers, and outputs the identification numbers and a maintenance command through the output device when the variation $A_{1r}$, defined by $(A_{1max}-A_{1min})/(A_{1max}+A_{1min})$, between the maximum frequency $A_{1max}$ and the minimum frequency $A_{1min}$ among radiofrequency characteristics $A_1$ is not less than the upper limit.

According to another aspect of the present invention, in a performance management system for a plasma processing system which includes a plurality of plasma processing apparatuses and is disassembled before transfer, is transferred to a customer, and is reassembled at a customer site, each plasma processing apparatus comprising a plasma processing chamber including an electrode for exciting a plasma and a radiofrequency feeder, the electrode being connected to an output end of the radiofrequency feeder; a radiofrequency generator for supplying a radiofrequency voltage to the electrode; and a matching circuit having an input terminal and an output terminal, the input terminal being connected to the radiofrequency generator and the output terminal being connected to an input end of the radiofrequency feeder so as to achieve impedance matching between the plasma processing chamber and the radiofrequency generator, the performance management system comprises a server having an output device, and a customer I/O device linked to the server via a communication line, wherein the server receives data of the identification numbers and the radiofrequency characteristics $A_1$ measured at the input terminal of the matching circuit after the delivery of the plasma processing chambers, and outputs the identification numbers and a maintenance command through the output device when the variation $A_{1r}$, defined by $(A_{1max}-A_{1min})/(A_{1max}+A_{1min})$, between the maximum frequency $A_{1max}$ and the minimum frequency $A_{1min}$ among radiofrequency characteristics $A_1$ is not less than the upper limit.

In each performance validation system for a plasma processing system which is purchased by a customer from a maintenance engineer and which is controlled by the performance management system according to the immediately preceding aspect of the invention, the performance validation system comprises a customer terminal, an engineer terminal, and information providing means, wherein the customer terminal requests, via a public line, browsing of performance information of the plasma processing system which is disassembled before transfer, is transferred to a customer, and is reassembled at a customer site, a maintenance engineer uploads the performance information to the information providing means through the engineer terminal, and the information providing means provides the performance information uploaded from the engineer terminal to the customer terminal upon the request from the customer terminal.

In each aspect, the radiofrequency characteristic A is preferably any one of a resonant frequency f, an impedance $Z_{ef}$ at the frequency of the radiofrequency waves, a resistance $R_{ef}$ at the frequency of the radiofrequency waves, and a reactance $X_{ef}$ at the frequency of the radiofrequency waves.

In each aspect, the upper limit of the variation $A_{1r}$ (or the variation $f_{01r}$) of the radiofrequency characteristics $A_1$ (or the first resonant frequencies $f_{01}$) after the deliver is preferably 0.1 and more preferably 0.03.

In the performance management system for the plasma processing apparatus or plasma processing system of the present invention, it is preferable that the output device outputs a maintenance command to the customer I/O device when three times the first series resonant frequency $f_{01}$ be not larger than the power frequency $f_e$.

In the performance validation system for the plasma processing apparatus of the present invention, the performance information may include the radiofrequency characteristic A. In addition, the performance information may output as catalogs or specifications.

Next, the present invention is described in detail below.

In the present invention, a plasma processing chamber is evaluated based on the radiofrequency characteristic A. The radiofrequency characteristic A is closely associated with the performance of the plasma processing apparatus such as an effective power consumption in the plasma space and readily fluctuates when an event that gives ill effects to the performance of the plasma processing apparatus, such as vibration during transferring of the plasma processing apparatus or reassembling the plasma processing apparatus at the delivery site occurs.

The absolute value of the difference $\Delta A$ between $A_0$ which is the radiofrequency characteristic A measured at a time $t_0$ and $A_1$ which is the radiofrequency characteristic A measured at a later time $t_1$ is closely associated with the fluctuation in performance of the plasma processing apparatus. Moreover, when this value is kept less than an upper limit, the fluctuation in performance of the plasma processing apparatus can also be kept within a required level. Thus, by comparing the absolute value of the difference $\Delta A$ to the upper limit, it is possible to evaluate the performance of the plasma processing apparatus.

In other words, it is possible to examine whether the plasma processing apparatus maintains a required performance level at the time the plasma processing apparatus is first installed after being disassembled for transfer, after plasma processes are repeated, or at the time of adjustment and maintenance. When a plurality of the plasma processing chambers are provided, it is possible to examine whether the difference in performance among these plasma processing chambers is kept within an appropriate range.

According to the evaluation method of the plasma processing apparatus of the present invention, the measurement of the radiofrequency characteristic A can be instantaneously performed. Thus, it is possible to reduce the time required to evaluate the plasma processing apparatus compared to conventional evaluation processes requiring the steps of evaluating the processed (deposited) substrates. Moreover, the cost of substrates for evaluation, the cost of evaluating the processed substrates, the labor cost for workers engaged in the evaluation process, etc., can be reduced.

According to the evaluation method of the plasma processing apparatus of the present invention, the plasma processing apparatus can be evaluated in an instant at low costs. According to the maintenance method of the plasma processing apparatus of the present invention, the performance evaluation can be performed at a desired interval and corrective action can be readily performed in response to the obtained results since the evaluation can be performed in an instant at low costs. Moreover, according to the performance management system of the plasma processing apparatus of this invention, the user in possession of the plasma processing apparatus can readily be informed of the evaluation results by using a server maintained by, for example, a manufacturer. Furthermore, according to the plasma processing apparatus of this invention, plasma processes can be stably performed since the plasma processing apparatus maintains a desired performance level using the radiofrequency characteristic A which can be evaluated at any time.

In the case of a plasma processing apparatus having a plurality of plasma processing chambers, substantially the same results can be obtained by the same process recipe for these plasma processing chambers with reference to the radiofrequency characteristics A of these chambers. When layers are formed in these processing chambers, these layers can have substantially the same characteristics, e.g., the thickness, the isolation voltage, and the etching rate.

According to the performance evaluation method for the plasma processing system of the present invention, the performance of the plasma processing system can be rapidly evaluated at low cost. Moreover, substantially the same results can be obtained by the same process recipe for plasma processing chambers contained in the plasma processing system, with reference to the radiofrequency characteristics A of these chambers. When layers are formed in these processing chambers, these layers can have substantially the same characteristics, e.g., the thickness, the isolation voltage, and the etching rate.

According to the performance management system for the plasma processing apparatus of the present invention, users and so on can readily know the results of performance evaluation through a server controlled by the manufacturer. According to the performance management system for the plasma processing system of the present invention, users can readily know the results of performance evaluation and variation according to the chambers through a server controlled by the manufacturer.

The invention contributes to preventing performance of abnormal plasma processing operation and to maintaining the plasma processing apparatus at a required level.

Moreover, it is possible to obtain substantially the same plasma processing results by applying the same process recipe. That is, for example, when a deposition process is performed in the plasma processing chamber, it is possible to continuously manufacture the layers having substantially the same layer characteristics such as layer thickness, isolation voltage, etching rate, etc.

When the plasma processing apparatus has many plasma processing chambers or when many plasma processing apparatuses are integrated into a plasma processing system, the radiofrequency characteristic A may be obtained for each of the plasma processing chambers for the purpose of evaluation.

In each of the above-described aspects of the present invention, the point at which the radiofrequency characteristic A is measured may be the input end of the radiofrequency feeder (feed plate).

By evaluating the fluctuation in the radiofrequency characteristics, it is possible to evaluate the fluctuation in the effective power consumed in the plasma space. Thus, it is possible to evaluate whether substantially the same plasma processing results can be obtained by applying the same process recipe.

Preferably, the point at which the radiofrequency characteristic A is measured is the input terminal of a matching circuit.

In this manner, the radiofrequency characteristics of the matching circuit as well as the plasma processing chamber can be evaluated. Thus, compared to the foregoing point of measurement, the evaluation of the effective power consumed in the plasma space and the evaluation of the plasma processing results can be further accurately performed.

In each of the aspects of the present invention described above, the point at which the radiofrequency characteristic A is measured may be an input end of a radiofrequency supplier (feeding line).

In this manner, the radiofrequency characteristics of the plasma processing chamber, the matching circuit, and the radiofrequency supplier can be evaluated. Thus, compared to the points of measurement described above, the evaluation of the effective power consumed in the plasma space and the evaluation of the plasma processing results can be yet further accurately performed.

In each of the aspects of the present invention described above, the radiofrequency characteristic A may be any one of resonant frequency f, impedance Ze at a power frequency, resistance Re at the power frequency, and reactance X at the power frequency. In this manner, it is possible to evaluate the plasma processing apparatus based on the radiofrequency characteristic. As for the resonant frequency f, a first series resonant frequency $f_0$, which is the lowest frequency at the minima of the impedance Z in an impedance curve, and a series frequency $f_0'$, which is defined by the capacitance between two electrodes for exciting a plasma, may be used.

A voltage-current amplitude ratio expressed in Formula 1 below and a voltage-current phase difference expressed in Formula 2 below may also be used as the radiofrequency characteristic A.

$$\sqrt{R^2+X^2} \qquad \text{Formula 1}$$

$$\tan^{-1}\left(\frac{X}{R}\right) \qquad \text{Formula 2}$$

When the impedance $Z_e$ at the frequency of the radiofrequency generator is employed as the radiofrequency characteristic A, it is not necessary to find the dependence of the radiofrequency characteristic on the frequency in the plasma chambers. Thus, the impedance $Z_e$ at the frequency of the radiofrequency generator can be readily determined compared with the resonant frequency f which must be determined by the dependence of the impedance Z on the frequency. Moreover, the impedance $Z_e$ can directly reflect the radiofrequency electrical characteristic at the plasma excitation frequency of the plasma chambers.

When the resistance $R_e$ or the reactance $X_e$ is employed, this can more directly reflect the radiofrequency electrical characteristic at the plasma excitation frequency of the plasma chamber compared with the impedance $Z_e$ which corresponds to the vector quantity defined by the resistance $R_e$ and the reactance $X_e$.

A first series resonant frequency $f_0$ may also be employed as the radiofrequency characteristic A.

The first series resonant frequency $f_0$ is a radiofrequency characteristic mainly determined by the mechanical structure and is likely to differ according to individual plasma processing chambers. The first series resonant frequency $f_0$ is closely associated with stability of the plasma generation and uniform operation.

When the first series resonant frequency $f_0$ is employed as the radiofrequency characteristic A, it is possible to evaluate the operation of the plasma processing apparatus more accurately.

When the resonant frequency f is employed as the radiofrequency characteristic A, other series resonant frequencies in addition to the first series resonant frequency $f_0$ need to be considered. That is, the characteristics of all the paths of the electrical current branching inside the chamber need to be considered. Thus, the difference in performance among the plasma processing chambers can be evaluated more precisely. However, the analysis therefor requires more time and effort, which is the disadvantage of employing the resonant frequency f.

Now, the definition of the first series resonant frequency $f_0$ is explained.

First, the dependency of the impedance of the plasma chamber on frequency is measured. During the measurement, the region of the plasma processing chamber in which the impedance is measured is defined as will be described in later sections, and the impedance within this measured region is measured while varying the frequency oscillated from the impedance meter in order to obtain the vector quantity (Z, θ) of the impedance. Herein, considering the power frequency $f_e$ is likely to be set at 13.56 MHz, 27.12 MHz, 40.68 MHz, or the like, the frequency oscillated from the impedance meter is varied over the range of 1 MHz to 100 MHz.

FIG. 5 is a graph for explaining the first series resonant frequency $f_0$. The graph shows dependency of the impedance Z and the phase θ on frequency.

Next, as shown in FIG. 5, impedance Z and phase θ are plotted relative to the frequency to give an impedance characteristic curve and a phase curve. The first series resonant frequency $f_0$ is then defined as the lowest frequency among the frequencies at the minima Z.

Now, the region of the plasma processing chamber in which the impedance is measured (measured region) will be explained.

A radiofrequency generator is connected to the plasma processing chamber via a matching circuit. The measured region of the impedance begins from the output terminal of the matching circuit.

The matching circuit is often constituted from a plurality of passive devices in order to adjust the impedance in response to the change in plasma state inside the plasma processing chamber.

FIG. 2 illustrates a matching circuit 2A which is an example of the matching circuit employed in the plasma processing apparatus.

As shown in FIG. 2, the matching circuit 2A comprises a coil 23 and a tuning capacitor 24 connected in series between a radiofrequency generator 1 and a plasma excitation electrode 4, and a load capacitor 22 which is connected in parallel to the radiofrequency generator 1 at one end having the other end thereof grounded. The matching circuit 2A is separated from the plasma processing chamber at the output terminal position of the passive elements located at the final output stage among the plurality of the passive elements constituting the matching circuit 2A, i.e., the measuring point PR corresponding to the position of the output terminal of the tuning capacitor 24 which is connected to the plasma excitation electrode 4. The remaining portion of the plasma processing chamber is defined as the measured region.

Alternatively, instead of the above-described measuring point, a measuring point PR2 which corresponds to the input end of the radiofrequency feed line 1A may be employed to define the measured region of the plasma processing chamber, as shown in FIG. 2. Herein, the feed line 1A connecting the radiofrequency generator 1 to the matching circuit 2A is disconnected from the radiofrequency generator 1 at the output end thereof, thereby separating the radiofrequency generator 1 from the plasma processing chamber. The remaining portion of the plasma processing chamber is defined as the measured region.

Alternatively, instead of the above-described measuring point, a measuring point PR3 which corresponds to the input terminal of the matching circuit 2A connected to the feed line 1A may be employed to define the measured region of the plasma processing chamber, as shown in FIG. 2. Herein, the feed line 1A is disconnected from the input end of the matching circuit 2A at the measuring point PR3, and the remaining portion of the plasma processing chamber is defined as the measured region.

In the present invention, no specific limit is imposed as to the value with which the absolute value of the difference ΔA between $A_0$, which is the radiofrequency characteristic A measured at time $t_0$, and $A_1$, which is the radiofrequency characteristic A measured at time $t_1$, is compared. For example, the value may be set at 10% of $A_0$. In this case, when applied to a plasma-enhanced CVD apparatus, the fluctuation in the deposition rate can be maintained within 5%.

More preferably, the value may be set at 3% of $A_0$. In this case, when applied to a plasma-enhanced CVD apparatus, the fluctuation in the deposition rate can be maintained within 2%.

A performance management system of a plasma processing apparatus according to the present invention aims to evaluate the performance of the plasma processing apparatus at a time $t_1$, which is a time later than the time $t_0$, in order to control the performance of the plasma processing apparatus. Examples of the time $t_1$ are a time after the plasma processing apparatus which is to be delivered to a customer from a manufacturer, a distributor, a maintenance engineer, etc., is disassembled at the delivery site, transferred to the customer site, and reassembled at the customer site, and a time during the use thereof.

The server of this management system is maintained by a person who delivers the plasma processing apparatus, such as a manufacturer, a distributor, or a maintenance engineer; however, the location of the server is not limited to the delivery site. The server stores $A_0$ which is the radiofrequency characteristic A measured prior to disassembling the plasma processing apparatus. Using $A_0$, the performance of the plasma processing apparatus at the customer site is evaluated.

The value of $A_0$ may be a standard value of the radiofrequency characteristic A managed by the manufacturer. Alternatively, the server may store the values of $A_0$ particular to the plasma processing chambers having different identification numbers. Thus, more precise evaluation of the plasma processing chambers located at the customer site can be performed, and the performance management system with further higher precision can be achieved.

The identification number of the plasma processing chamber may be of any form as long as the plasma processing chambers can be distinctively identified and may include numerals and characters. For example, in a plasma processing apparatus having one plasma processing chamber, the serial number of the plasma processing apparatus may be used as the identification number of the plasma processing chamber.

The server is connected to an input-output (I/O) device located at the customer site via a communication line. No limit is imposed as to the media and the types of the communication line as long as signals can be exchanged between the remote server and the I/O device. Wire communication media such as cables, optical fiber lines, or satellite circuits, or wireless communication media may be suitably employed. Various types of communications such as telephone network, the Internet, or the like may also be used. Moreover, no limit is imposed as to the types of the I/O devices located at the customer site. Any one of a personal computer, a dedicated terminal, a telephone, etc., may be suitably selected as the customer I/O device according to the type of the communication line used.

The server receives $A_1$ measured after the plasma processing apparatus has been reassembled at the customer site from the I/O device at the customer site. The identification number of the plasma processing apparatus may also be received if necessary. Herein, the statement "after the plasma processing apparatus has been reassembled" refers not only to the time immediately after the reassembly but also to the subsequent time period during which the plasma processing apparatus is operated. The server continuously receives the values of $A_1$ which reflect the performance of the plasma processing apparatus at the customer site.

A customer at the location at which the plasma processing apparatus is installed or a service engineer sent to the customer site may manually input the values of $A_1$ and the identification number of the plasma processing apparatus from the customer I/O device to be transmitted to the server. This input operation can be automated to save the labor cost. For example, the customer I/O device may be connected to an impedance meter which is connected to the plasma processing apparatus, and data of $A_1$ may be directly sent from the impedance meter to the server. Moreover, when a customer uses a plasma processing apparatus having only one plasma processing chamber, it is possible to skip the input operation of the identification number by once registering the identification number of that plasma processing apparatus to the customer I/O device.

The server calculates the absolute value of the difference $\Delta A$ between the obtained values of $A_0$ and $A_1$ using a processing unit inside. A result smaller than an upper limit indicates that the performance is maintained to a required level, and a signal to that effect (evaluation information) is transmitted from the server to the customer I/O device. A result equal to or more than the upper limit indicates that the performance is not maintained to the required level, and a signal to that effect (evaluation information) is transmitted from the server to the customer I/O device. The customer I/O device receives this evaluation information which allows the customer to be aware of the evaluation results of the plasma processing apparatus. The customer I/O device is capable of communicating with the customer by a suitable process, including displaying the evaluation information at its display, printing-out the evaluation information, and sending an alarm.

The server has an output device located at the delivery site. When the absolute value of $\Delta A$ is not less than an upper limit, the output device may output a maintenance command as the evaluation information. Preferably, the identification number of the relevant plasma processing chamber is output at the same time. In this manner, the defect of the plasma processing apparatus located at the customer site can be rapidly detected at the delivery site, and maintenance services can be performed without delay.

Note that when the server is not installed at the delivery site, a desired communication line may be used to link the server and the output device.

When the evaluation information is provided to both the customer I/O device and the output device at the delivery site, the upper limit that serves as the basis of the evaluation information need not be the same value. For example, the upper limit for the evaluation information transmitted to the customer I/O device may be set at 10% of $A_0$ so that a signal indicating that required performance level is not maintained is output when $A_0$ exceeds this value. Meanwhile, the upper limit for the evaluation information transmitted to the output device at the delivery site may be set at 3% of $A_0$ so that a maintenance command is output when this value is exceeded. When the maintenance command is dispatched based on the evaluation standard tighter than that in the customer I/O device as in the above, it is possible to provide maintenance services before the performance of the plasma processing apparatus at the customer site is significantly changed. That is, the service system becomes more preventive.

The performance management system of the plasma processing apparatus according to another aspect of the present invention also aims to evaluate the performance of the plasma processing apparatus at a time $t_1$, which is a time later than the time $t_0$, in order to control the performance of the plasma processing apparatus. Examples of the time $t_1$ are a time after the plasma processing apparatus which is to be delivered to a customer from a manufacturer, a distributor, a maintenance engineer, etc., is disassembled at the delivery site, transferred to the customer site, and reassembled at the customer site, and a time during the use thereof.

The performance management system of the plasma processing apparatus according to this aspect of the present invention differs from the foregoing performance management system in that the server stores service engineer information registered according to fault levels each defined by a predetermined range of values and that the server has an output device located at the delivery site. After the server has calculated the absolute value of $\Delta A$, if the calculated value is within a predetermined range assigned to a particular fault level, the output device outputs a maintenance command, the fault level, and the information of the service engineers registered to that fault level simultaneously.

Thus, the fault level of the plasma processing apparatus installed at a remote location can be detected at the delivery site, and a service engineer having skill sufficient for the detected fault level can be readily dispatched. Accordingly, engineers can be efficiently managed, and rapid yet adequate maintenance system can be efficiently achieved even after the plasma processing apparatus is delivered to the customer site.

In the performance validation system of the plasma processing apparatus according to the present invention, the customer may view the performance information uploaded by a maintenance engineer indicating the operation of the plasma processing unit via a public line through an information terminal. Thus, the customer who purchased the plasma processing apparatus can be readily provided with the information regarding operation, performance, and maintenance of the plasma processing apparatus. Moreover, because the performance information includes the information regarding the radiofrequency characteristic A such as first series resonant frequency $f_0$ serving as a performance parameter of the plasma processing apparatus, a customer can be provided with the basis of the performance evaluation of the plasma processing apparatus. Furthermore, the performance information can be output as a catalog or a specification document.

In the present invention, an evaluation standard (Evaluation Standard 1) is whether or not three times the first series resonant frequency $f_0$ of the plasma processing chamber is larger than the power frequency $f_e$.

When three times the first series resonant frequency $f_0$ of the plasma processing chamber is larger than the power frequency $f_e$, electrical power can be more effectively fed into the plasma generating space even if the power frequency $f_e$ is higher than a conventional level, 13.56 MHz. When the power frequency $f_e$ is the same as the conventional level, the electrical power can be more effectively consumed in the plasma space, resulting in an increased deposition rate.

Since the first series resonant frequency $f_0$ mainly depends on the mechanical structure, thus the individual plasma processing chambers have different first series resonant frequencies $f_0$. By setting the first series resonant frequency $f_0$ to the above-described range, the overall radiofrequency characteristics of the plasma chambers can be optimized, achieving stable plasma generation. Consequently, the plasma processing apparatus exhibits improved operation stability.

In the present invention, another evaluation standard (Evaluation Standard 2) is whether or not the variation $A_{1r}$ of the radiofrequency characteristics $A_1$ after delivery is less than the upper limit.

When a radiofrequency voltage is applied to the electrodes of the plasma processing chamber, the radiofrequency characteristic A is measured at the input end of the radiofrequency feeder of each plasma processing chamber to determine the maximum frequency $A_{1max}$ and the minimum frequency $A_{1min}$. The $A_{1r}$ is defined by equation (1A) using the maximum frequency $A_{1max}$ and the minimum frequency $A_{1min}$.

$$A_{1r}=(A_{1max}-A_{1min})/(A_{1max}+A_{1min}) \tag{1A}$$

When the variation $A_{1r}$ is less than the upper limit, the plasma processing chambers substantially have the same radiofrequency characteristics, such as impedance and resonant frequency characteristics. Since the different plasma processing chambers can be controlled within a predetermined range using the impedance characteristics etc., these plasma processing chambers can consume substantially the same electrical power in the plasma spaces.

As a result, substantially the same results can be obtained by the same process recipe for plasma processing chambers contained in the plasma processing system. When layers are formed in these processing chambers, these layers can have substantially the same characteristics, e.g., the thickness, the isolation voltage, and the etching rate.

In the present invention, Standard Evaluations 1 and 2 may be used in combination. In this case, the performance evaluation method allows the plasma processing apparatus to maintain at a highly stable operation state. Moreover, the performance evaluation method maintains reduced differences in radiofrequency characteristics such as resonant frequency characteristics between the different plasma processing chambers.

In Evaluation Standard 2, the radiofrequency characteristic A may be any one of a resonant frequency f, an impedance $Z_{ef}$ at the frequency of the radiofrequency waves, a resistance $R_{ef}$ at the frequency of the radiofrequency waves, and a reactance $X_{ef}$ at the frequency of the radiofrequency waves.

In this case, the variation $A_{1r}$ (or $f_{01r}$) of the radiofrequency characteristics $A_1$ (or first resonant frequency $f_{01}$) after the delivery may be any value, for example, 0.1. When the variation $A_{1r}$ is 0.1, the variation in layer thickness can be controlled within ±5%, resulting in uniform plasma deposition.

When the variation $A_{1r}$ is less than 0.03, the different plasma processing chambers have substantially the same radiofrequency characteristics such as impedance and resonant frequency characteristics. These plasma processing chambers can be controlled within a predetermined level using the impedance characteristics, consuming substantially the same power in the plasma spaces thereof.

As a result, substantially the same results can be obtained by the same process recipe for these plasma processing chambers. When layers are formed in these processing chambers, these layers can have substantially the same characteristics, e.g., the thickness, the isolation voltage, and the etching rate. When the variation $A_{1r}$ is 0.03, the variation in layer thickness can be controlled within ±2%, resulting in uniform plasma deposition.

The performance management system for the plasma processing apparatus or system of the present invention evaluates to control the performance of the plasma processing apparatus or system, based on the above evaluation standards, which is disassembled at the delivery site, transferred to the customer site, reassembled and used at the customer site.

The server in this system is controlled at the delivery site, for example, by the manufacturer of the plasma processing apparatus, distributors, or maintenance engineers. The server, however, may not be placed at the delivery site.

The server is linked to I/O devices placed at customer sites via communication lines. The communication line may be of any form which can perform transmitting/receiving of signals between the server and the I/O devices which are distant from each other. Examples of communication lines are communication media, such as cables, optical fiber lines, satellite circuits, telephone lines, and the Internet. Any type of the customer I/O device may be used without limitation as long as the device can perform transmitting/receiving of signals to/from the server via the communication line. Examples of such devices are personal computers, dedicated terminals, and telephones. In the performance management system using Evaluation Standard 2, the input device at the delivery site may has an output function, if necessary.

In the performance management system using Evaluation Standard 1, the server stores data of the power frequency $f_e$ which is supplied to the plasma processing chamber through the radiofrequency generator to evaluate the performance of the plasma processing apparatus at the customer site.

The power frequency $f_e$ may be a standard power frequency $f_e$ which is controlled by the manufacturer. Alternatively, data of the power frequency $f_e$ may be stored for the identification number of each plasma processing chamber to more precisely evaluate each plasma processing chamber at the customer site. In such a case, the performance management system becomes more precise.

The identification number of the plasma processing chamber may be of any form and may include numerals and characters. In a plasma processing apparatus having one plasma processing chamber, the serial number of the plasma processing apparatus may be used as the identification number of the plasma processing chamber.

In such a case, the server receives data of the first resonant frequency $f_{o1}$ after the delivery from the customer I/O device. Herein, "after the delivery" includes "immediately after reassembly" and "in use" after the reassembly. Accordingly, the server can continually receive data of the first resonant frequency $f_{o1}$ which reflects the performance of the plasma processing apparatus or system at the customer site anytime.

The server may receive data of the first resonant frequency $f_{o1}$ together with the identification number of the corresponding plasma processing chamber, if necessary.

In the transmission of the first resonant frequency $f_{o1}$ and the identification number (if necessary) of the plasma processing chamber to the server, the user or a maintenance engineer may manually input these values through the customer I/O device. The input operation can be automated or simplified. For example, an impedance meter is connected to both the plasma processing apparatus or system and the customer I/O device to directly transmit the first resonant frequency $f_{o1}$ to the server. In the case of a plasma processing apparatus having a single plasma processing chamber, the identification number of the plasma processing chamber is preliminarily stored in the customer I/O device and no input operation for the identification number is required for subsequent procedures.

The server compares three times the first resonant frequency $f_{o1}$ with the power frequency $f_e$ after the delivery by arithmetic calculation. To the customer I/O device, the server transmits a signal indicating satisfying the required level of the performance when the three times the first resonant frequency $f_{o1}$ is larger than the power frequency $f_e$, and a signal indicating not satisfying the required level of the performance when the three times the first resonant frequency $f_{o1}$ is not larger than the power frequency $f_e$. The customer I/O device outputs the results of the performance evaluation in any form, for example, display, print, or alarm signal.

The server is preferably provided with an output device at the parasitic device to output a maintenance command therefrom when the three times the first resonant frequency $f_{o1}$ is not larger than the power frequency $f_e$ after the delivery.

In this case, it is preferable to output the identification number of the corresponding plasma processing chamber so as to rapidly detect the defect of the plasma processing apparatus or system at the delivery site and to promptly start maintenance services.

If the server is not provided at the delivery site, the server and the output device may be linked via any communication line.

In the performance management system using Evaluation Standard 2, the server has an output device. The output device may be placed anywhere, and preferably is placed at a site which provides maintenance services, for example, the delivery site, the manufacturer, or a maintenance center. If the server is distant from the output device, these may be linked via any communication line.

The server evaluates the performance of the plasma processing apparatus at the customer site by Standard Evaluation 2 and outputs a maintenance command and the identification numbers of the plasma processing chambers having the maximum $A_{1max}$ and minimum $A_{1min}$ when the results are not desirable.

The server receives data of the radiofrequency characteristic $A_1$ after the deliver from the customer I/O device before the evaluation based on Evaluation Standard 2. Herein, "after the delivery" includes "immediately after reassembly" and "in use" after the reassembly. Accordingly, the server can continually receives data of the first resonant frequency $f_{o1}$ which reflects the performance of the plasma processing apparatus or system at the customer site anytime.

The server also receives the identification number of the plasma processing chamber having the radiofrequency characteristic $A_1$.

In the transmission of the radiofrequency characteristic $A_1$ and the identification number (if necessary) of the plasma processing chamber to the server, the user or a maintenance engineer may manually input these values through the customer I/O device. The input operation can be automated or simplified. For example, an impedance meter is connected to both the plasma processing apparatus or system and the customer I/O device to directly transmit the radiofrequency characteristic $A_1$ to the server. In the case of a plasma processing apparatus having a single plasma processing chamber, the identification number of the plasma processing chamber is preliminarily stored in the customer I/O device and no input operation for the identification number is required for subsequent procedures.

The server receives data of the radiofrequency characteristics $A_1$ of all plasma processing chambers included in the plasma processing apparatus or system and specifies the maximum $A_{1max}$, the minimum $A_{1min}$, and the identification numbers of the plasma processing chambers having the maximum or minimum. Next, the server calculates the variation $A_{1r}$ according to the equation:

$$A_{1r}=(A_{1max}-A_{1min})/(A_{1max}+A_{1min})$$

When the variation $A_{1r}$ is larger than the upper limit, the output device outputs a maintenance command and the identification numbers of the plasma processing chambers having the maximum $A_{1max}$ or minimum $A_{1min}$.

The defect of the plasma processing apparatus or system at the customer site can be rapidly detected at the maintenance engineer site, prompting maintenance services.

The performance evaluation method for the plasma processing apparatus or system can readily detect the performance of the apparatus or system when the apparatus is reassembled, is used for plasma treatment to workpieces, and is subjected to adjustment works including overhaul, parts replacement, and assembly with alignment.

The performance evaluation method can also readily detect the performance of the apparatus or system, when the apparatus or system is used after being reassembled at the customer site.

Also, the performance evaluation method of the present invention can rapidly perform corrective action to restore the performance of the plasma processing apparatus.

The performance management system for the plasma processing apparatus or system of the present invention controls the performance evaluation of the plasma processing apparatus or system at the customer site and provides rapid and satisfactory maintenance services so as to maintain the performance of the apparatus or system at a required level.

The plasma processing apparatus of the present invention can maintain a required level of performance during operation, resulting in continuous plasma processing.

BRIEF DESCRIPTION OF THE DRAWINGS

FIG. 30 shows an output form of a subpage CP4 in accordance with the performance validation system of the plasma processing apparatus of the present invention;

DESCRIPTION OF THE PREFERRED EMBODIMENTS

First Embodiment

A plasma processing apparatus according to a first embodiment of the present invention will be described below with reference to the drawings.

Figure 1:
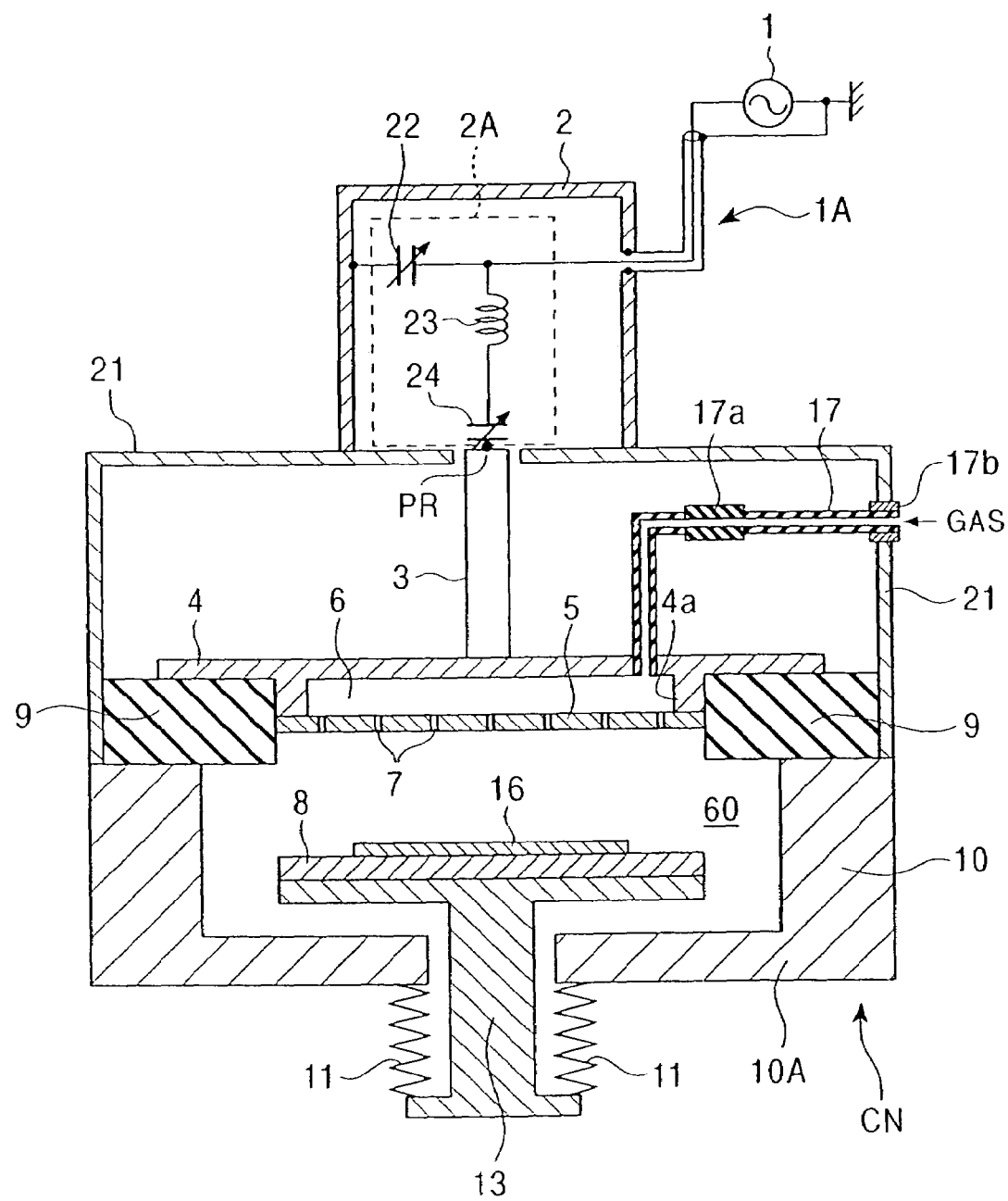
FIG. 1 is a schematic view of a plasma processing apparatus in accordance with a first embodiment of the present invention.
Figure 2:
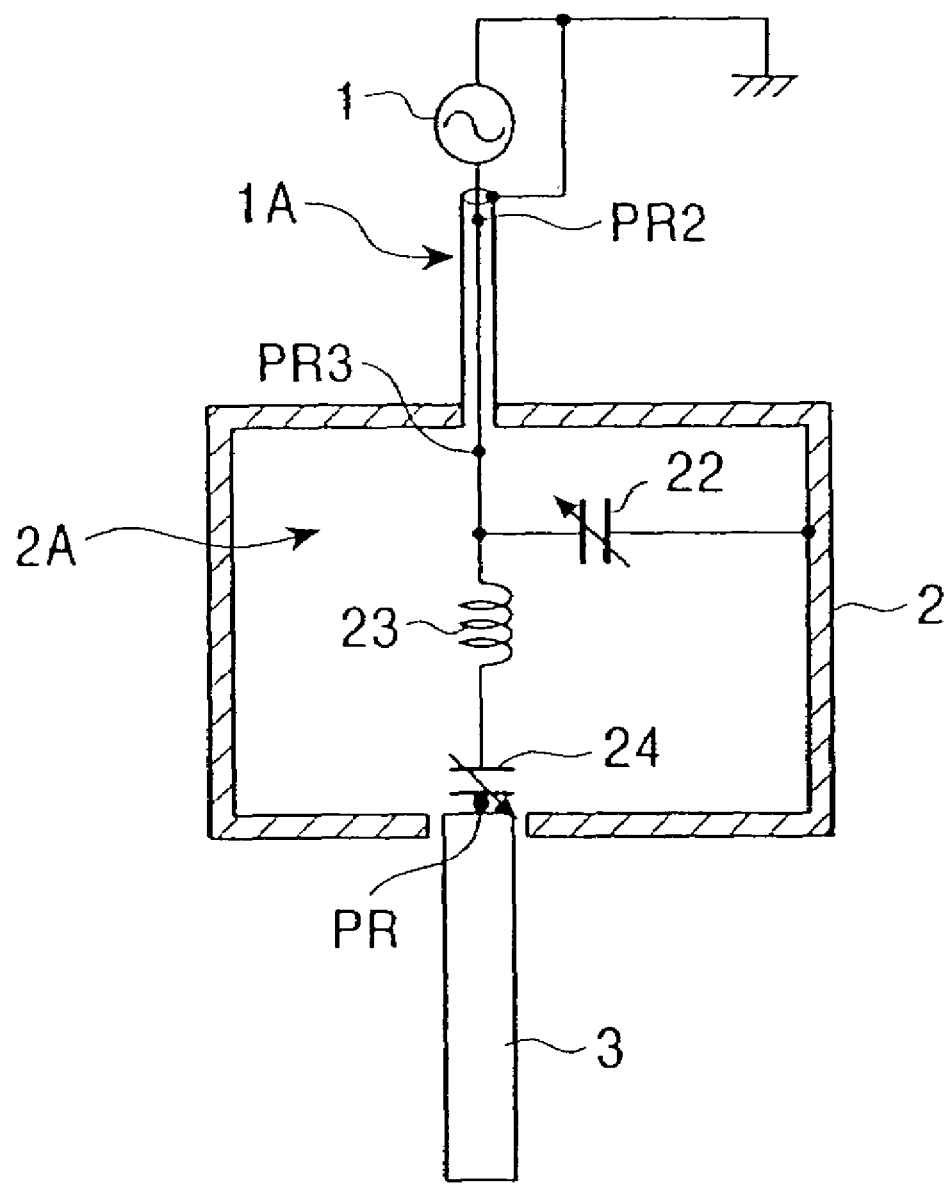
FIG. 2 is a schematic view of a matching circuit of the plasma processing apparatus shown in FIG. 1.

FIG. 1 is a cross-sectional view showing the outline of the structure of the plasma processing apparatus according to the first embodiment of the present invention. FIG. 2 illustrates a matching circuit 2A of the plasma processing apparatus shown in FIG. 1.

The plasma processing apparatus of this embodiment is of a single-frequency excitation type and performs plasma processing such as plasma-enhanced chemical vapor deposition (CVD), dry etching, ashing, and the like. Referring to FIG. 1, the plasma processing apparatus comprises a plasma processing chamber CN having parallel plate electrodes, which are a plasma excitation electrode 4 for exciting a plasma and a susceptor electrode 8, a radiofrequency generator 1 connected to the plasma excitation electrode 4, and the matching circuit 2A for matching the impedance between the plasma processing chamber CN and the radiofrequency generator 1.

In the plasma processing apparatus of this embodiment, a first series resonant frequency $f_0$ of the plasma processing chamber CN measured at a measuring point PR which corresponds to the input end of the feed plate 3 and the output terminal of the matching circuit 2A is used as a radiofrequency characteristic A. As will be described below, the plasma processing apparatus is designed and manufactured so as to set the initial value $f_{00}$ (a radiofrequency characteristic $A_0$) of the first series resonant frequency $f_0$ at such a value that three times $f_{00}$ is larger than the power frequency $f_e$ supplied from the radiofrequency generator 1. Moreover, a first series resonant frequency $f_{01}$ (a radiofrequency characteristic $A_1$) measured at the same position after the plasma processing apparatus which has been disassembled for transportation is reassembled at the customer site or during use is maintained to such a level that the absolute value of the difference $\Delta f_0$ ($\Delta A$) between $f_{00}$ and $f_{01}$ is less than 10% of $f_{00}$.

In particular, referring to FIGS. 1 and 2, a shower plate 5 and the plasma excitation electrode 4 connected to the radiofrequency generator 1 are disposed in the upper portion of the plasma processing chamber CN of this embodiment, and the susceptor electrode 8 for receiving a substrate 16 to be treated is disposed in the lower portion of the plasma processing chamber CN to oppose the shower plate 5. The plasma excitation electrode 4 is connected to the first radiofrequency generator 1 via a feed plate (radiofrequency feeder) 3 and the matching circuit 2A. The plasma excitation electrode 4 and the feed plate 3 are covered by a chassis 21, and the matching circuit 2A is housed inside a matching box 2.

A silver-plated copper plate 50 to 100 mm in width, 0.5 mm in thickness, and 100 to 300 mm in length is used as the feed plate 3. The input end of the feed plate 3 is attached to the terminal from the matching circuit 2A, and the output end of the feed plate 3 is attached to the plasma excitation electrode 4. Screws are preferably used to attach the feed plate 3 to the terminal and the plasma excitation electrode 4 although other methods well known in the art may also be used.

A projection 4a is disposed at the bottom of the plasma excitation electrode (cathode) 4, and the shower plate 5 contacting the projection 4a and having a large number of holes 7 is provided under the plasma excitation electrode (cathode) 4. The plasma excitation electrode 4 and the shower plate 5 define a space 6. A gas feeding tube 17 is connected to the space 6.

The gas feeding tube 17 is made of a conductor, and an insulator 17a which is inserted in a position inside the chassis 21 and midway in the gas feeding tube 17 insulates between the plasma excitation electrode 4 and the gas source. An insulator 17b is disposed at a position of the gas feeding tube 17 penetrating the side wall of the chassis 21 and around the external periphery of the gas feeding tube 17 so as to insulate the gas feeding tube 17 from the chassis 21.

The gas fed from the gas feeding tube 17 flows into a chamber space 60 comprising a chamber wall 10 via the holes 7 of the shower plate 5. The chamber wall 10 and the plasma excitation electrode (cathode) 4 are isolated from each other by an insulator 9. The exhaust system is omitted from the drawing.

The susceptor electrode (wafer susceptor) 8 for receiving the substrate 16 and for exciting a plasma is disposed in the chamber space 60.

The susceptor electrode 8 is supported by a shaft 13, and the bottom end portion of the shaft 13 and the center portion of a chamber bottom 10A are hermetically sealed by a bellows 11. The susceptor electrode 8 and the shaft 13 are vertically moved by the bellows 11 to adjust the distance between the plasma excitation electrode 4 and the susceptor electrode 8.

The susceptor electrode 8 is connected to the shaft 13, and the shaft 13 is connected to the bellows 11 which is connected to the chamber wall 10. Thus, the susceptor electrode 8, the shaft 13, the bellows 11, the chamber bottom 10A, and the chamber wall 10 have the same potential. Because the chamber wall 10 is connected to the chassis 21, the chamber wall 10, the chassis 21, and the matching circuit 2A have the same potential.

Herein, in order to adjust impedance in response to a change in the state of the plasma inside the plasma processing chamber CN, the matching circuit 2A is provided with a plurality of passive elements in many cases.

Referring to FIGS. 1 and 2, the matching circuit 2A has, as the passive elements, a coil 23 and a tuning capacitor 24 connected in series between the radiofrequency generator 1 and the feed plate 3, and a load capacitor 22 connected in parallel with the coil 23 and the tuning capacitor 24. One end of the load capacitor 22 is coupled to the matching box 2.

The matching box 2 is connected to a shielding line of a feed line 1A which is a coaxial cable, and the shielding line is grounded. Thus, the susceptor electrode 8, the shaft 13, the bellows 11, the chamber bottom 10A, the chamber wall 10, the chassis 21, and the matching box 2 are all set to a ground potential. Meanwhile, one end of the load capacitor 22 is also grounded.

In the plasma processing apparatus of this embodiment, power having a frequency of approximately 13.56 MHz or more, for example, 13.56 MHz, 27.12 MHz, or 40.68 MHz, is supplied to generate a plasma between the plasma excitation electrode 4 and the susceptor electrode 8. Using this plasma, plasma processing such as plasma-enhanced CVD, dry etching, ashing, or the like is performed on the substrate 16 placed on the susceptor electrode 8.

The radiofrequency power is supplied from the radiofrequency generator 1 to the coaxial cable of the feed line 1A, the matching circuit 2A, the feed plate 3, and the plasma excitation electrode (cathode) 4. As for the path of the electrical current, the electrical current which has passed through these components enters the plasma space 60 and then flows into the susceptor electrode 8, the shaft 13, the bellows 11, the chamber bottom 10A, and the chamber wall 10. The current then flows into the chassis 21, the matching box 2, and the shielding line of the feed line 1A, and returns to the ground of the radiofrequency generator 1.

Now, the first series resonant frequency $f_0$ in the plasma processing apparatus of this embodiment is explained.

The first series resonant frequency $f_0$ is the lowest frequency among the frequencies at minima of the impedance Z when the dependency of the impedance of the plasma processing chamber CN on frequency is measured. The first series resonant frequency $f_0$ is set to be larger than the above-described frequency of the supplied power, i.e., the power frequency $f_e$.

Figure 3:
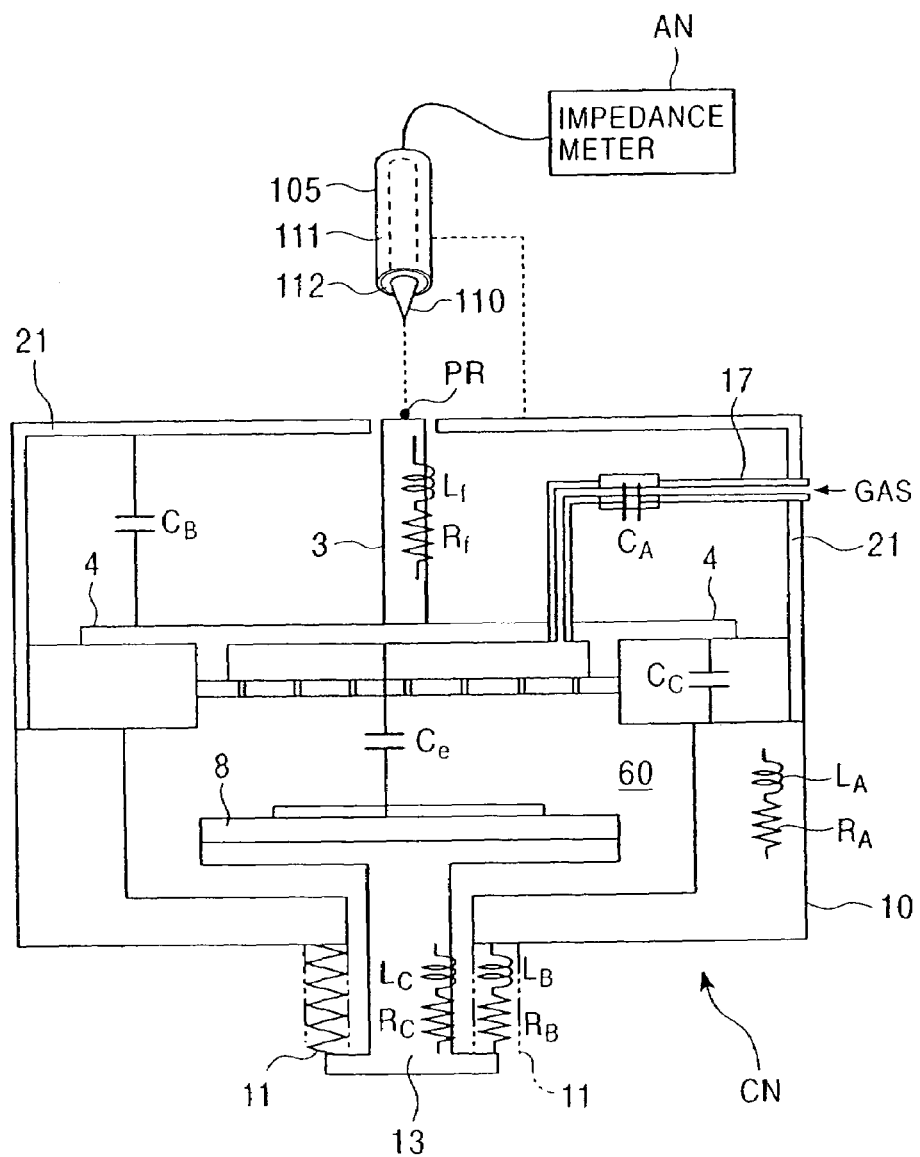
FIG. 3 is a schematic view for illustrating the impedance characteristics of the plasma processing apparatus in the first embodiment.
Figure 4:
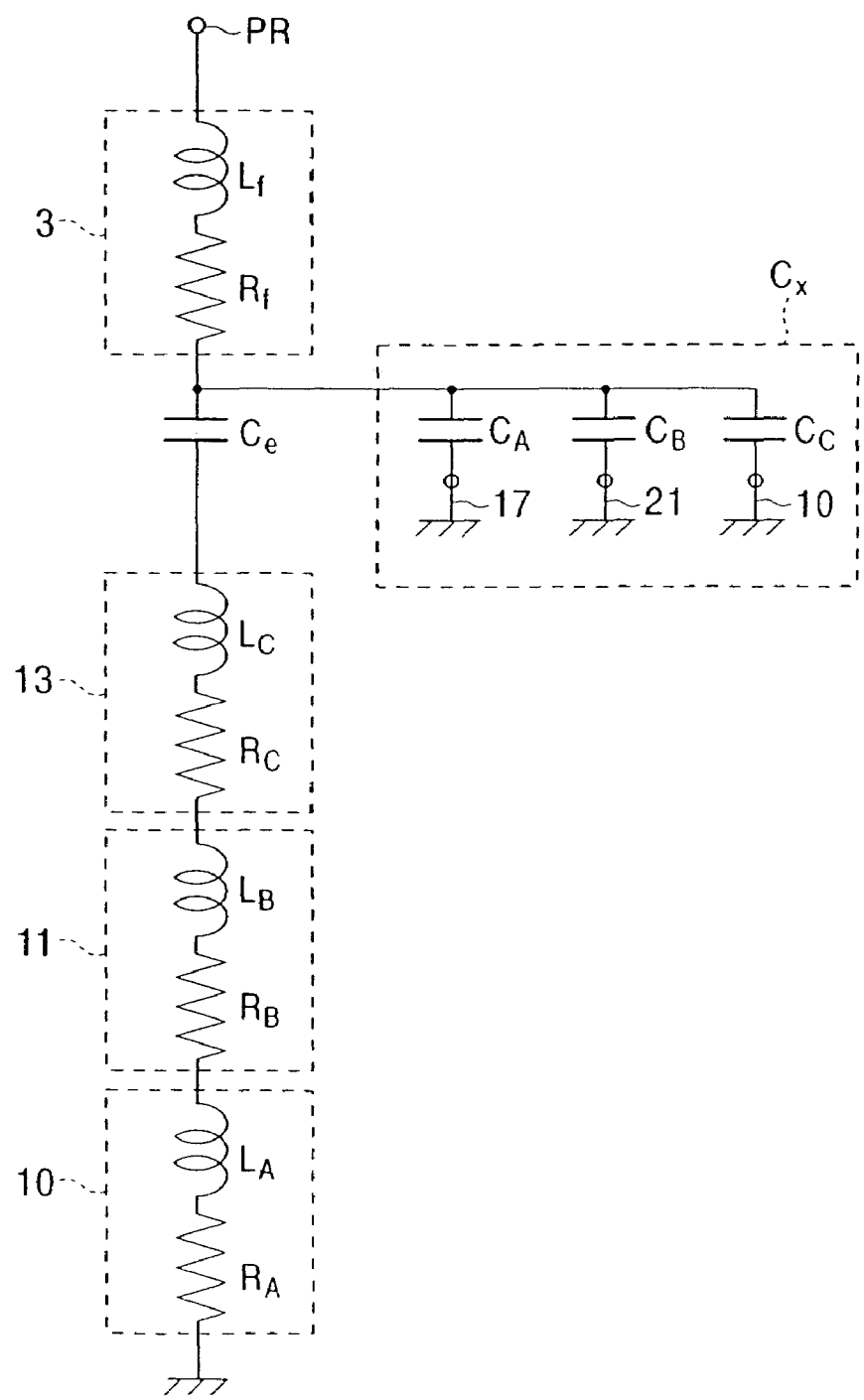
FIG. 4 is an equivalent circuit diagram of the plasma processing apparatus shown in FIG. 3.

The first series resonant frequency $f_0$ is a radiofrequency electrical characteristic mainly determined by the mechanical structure and is measured as shown in FIGS. 3 and 4.

FIG. 3 is an illustration of the plasma processing apparatus for explaining the impedance characteristics, and FIG. 4 is an equivalent circuit diagram of FIG. 3.

The plasma processing chamber CN without the matching circuit 2A is the measured region. The matching circuit 2A is detached from the plasma processing chamber CN at an output terminal position of the passive element at the final output stage among the passive elements constituting the matching circuit 2A. In other words, as shown in FIG. 3, the matching circuit 2A is detached from the plasma processing chamber CN at the measuring point PR which corresponds to the position of the output terminal of the tuning capacitor 24 (refer to FIG. 2) by removing screws or other fasteners connecting the feed plate 3 to the output terminal of the matching circuit 2A.

As shown by broken lines in FIG. 3, a probe 105 of an impedance meter AN is connected to the measuring point PR which corresponds to the input end of the feed plate 3 and to a ground position of the plasma processing chamber CN such as the chassis 21. In this state, a frequency oscillated from the impedance meter AN is varied over the range of, for example, 1 MHz to 100 MHz so as to measure the vector quantity (Z, θ) of the impedance within the above-described measured region of the plasma processing chamber CN.

As shown in FIG. 3, the probe 105 comprises a conductive line 110, an insulation coating 112 coating the conductive line 110, and a peripheral conductor 111 covering the insulation coating 112. The probe 105 is connected to the impedance meter (resonant frequency meter) AN via a coaxial cable.

Figure 5:
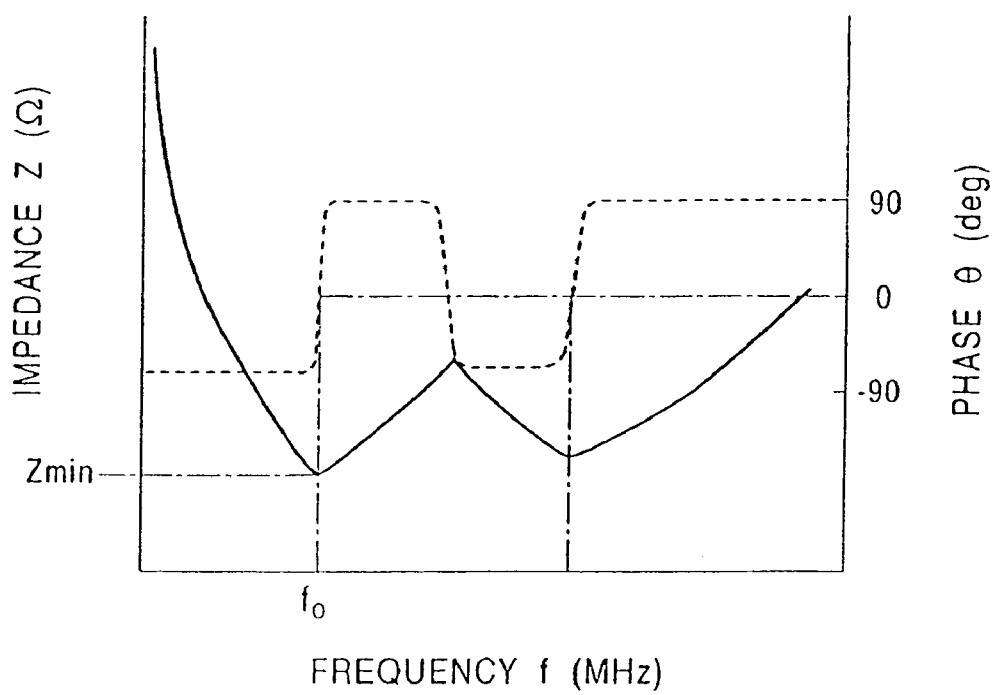
FIG. 5 is a graph showing the dependence of the impedance Z and the phase θ on the frequency for defining a first series resonant frequency $f_0$.

Next, as shown in FIG. 5, impedance Z and phase θ (deg) are plotted versus frequency f (MHz) on the same graph. In the graph, the abscissa corresponds to the frequency f, the ordinate at the left side corresponds to the impedance Z (Ω), and the ordinate at the right side corresponds to the phase θ (deg). Referring to the impedance characteristic curve and the phase curve in FIG. 5, the first series resonant frequency $f_0$ is defined as the lowest frequency among the frequencies at minima $Z_{min}$ of the impedance.

Referring to FIG. 3, the following radiofrequency electrical factors within the above-described measured region contribute to the first series resonant frequency $f_0$ measured as above:

Inductance $L_f$ and resistance $R_f$ of the feed plate 3;
Plasma electrode capacitance $C_e$ between the plasma excitation electrode 4 and the susceptor electrode 8;
Inductance $L_C$ and resistance $R_C$ of the shaft 13;
Inductance $L_B$ and resistance $R_B$ of the bellows 11;
Inductance $L_A$ and resistance $R_A$ of the chamber wall 10;
Capacitance $C_A$ between the gas feeding tube 17 and the plasma excitation electrode 4 via the insulator 17a;
Capacitance $C_B$ between the plasma excitation electrode 4 and the chassis 21; and
Capacitance $C_C$ between the plasma excitation electrode 4 and the chamber wall 10.

These radiofrequency electrical factors are arranged as shown in FIG. 4 so as to form a circuit equivalent to the circuit to which radiofrequency power is supplied during plasma generation. More specifically, the inductance $L_f$ and resistance $R_f$ of the feed plate 3, the plasma electrode capacitance $C_e$ between the plasma excitation electrode 4 and the susceptor electrode 8, the inductance $L_C$ and resistance $R_C$ of the shaft 13, the inductance $L_B$ and resistance $R_B$ of the bellows 11, and the inductance $L_A$ and resistance $R_A$ of the chamber wall 10 are connected in series in that order while having the resistance $R_A$ grounded. Between the resistance $R_f$ and the plasma electrode capacitance $C_e$, the capacitance $C_A$, the capacitance $C_B$, and the capacitance $C_C$ are connected in parallel, one end of each being grounded. By determining the impedance characteristics of this equivalent circuit, the first series resonant frequency $f_0$ of this embodiment can be defined.

The plasma processing apparatus is designed and manufactured so as to set the initial value $f_{00}$ (a radiofrequency characteristic $A_0$) of the first series resonant frequency $f_0$ at such a value that three times $f_{00}$ is larger than the power frequency $f_e$ supplied from the radiofrequency generator 1. Moreover, the first series resonant frequency $f_{01}$ (a radiofrequency characteristic $A_1$) measured after the plasma processing apparatus which has been disassembled for transportation is reassembled at the customer site, after plasma processes are performed on workpieces using the apparatus, or after adjustment work such as overhauling, parts replacement, assembly with alignment, or the like is performed, is maintained to such a level that the absolute value of the difference $\Delta f_0$ ($\Delta A$) between $f_{00}$ and $f_{01}$ is less than 10% of $f_{00}$. If the absolute value of the difference $\Delta f_0$ is 10% or more of $f_{00}$, then a corrective action is performed.

Examples of the corrective action include
(1) Adjusting the shape and the length of the feed plate 3;
(2) Adjusting the overlapping area of the plasma excitation electrode 4 and the chamber wall 10;
(3) Adjusting the thickness of the insulating material between the plasma excitation electrode 4 and the chamber wall 10; and
(4) Connecting the susceptor electrode 8 and the chamber wall 10 with a conductor.

Figure 6:
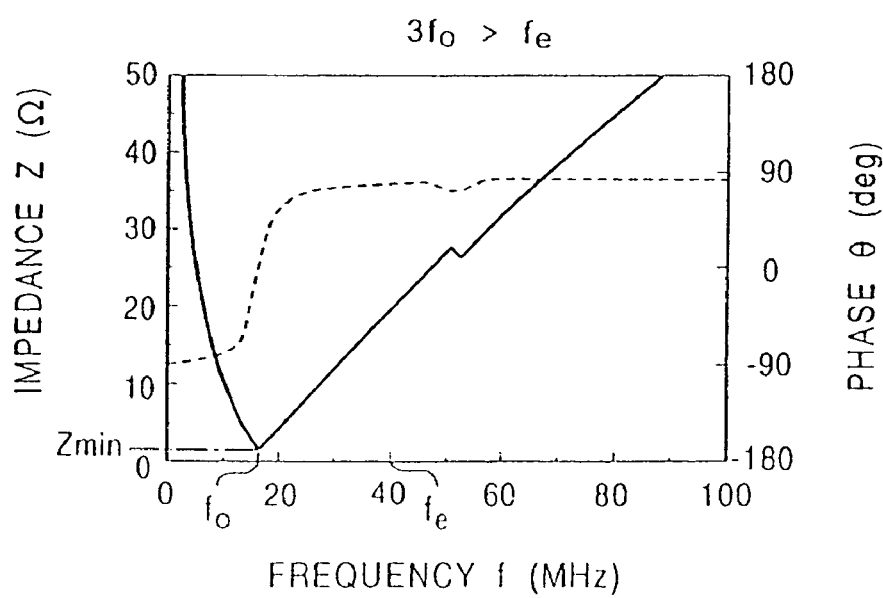
FIG. 6 is a graph illustrating the dependence of the impedance Z and the phase θ on the frequency for defining a first series resonant frequency $f_0$ of the plasma processing apparatus in accordance with the first embodiment.

For example, in the plasma processing apparatus of this embodiment, the power frequency $f_e$ is set at 40.68 MHz, and the impedance Z (Ω) and the phase θ (deg) relative to the frequency f (MHz) ranging from 0 to 100 MHz are measured to plot an impedance characteristic curve and a phase curve, as shown in FIG. 6. The initial first series resonant frequency $f_{00}$ is then set at 16.5 MHz so as to satisfy the relationship below:

$$3f_0 > f_e \qquad (1)$$

The plasma processing apparatus of this embodiment is maintained so as to keep the absolute value of the difference $\Delta f_0$ ($\Delta A$) between the initial $f_{00}$ and the $f_{01}$, which is measured after reassembly, during use (plasma processing), or after the adjustment work, at a value smaller than 10% of $f_{00}$. Thus, even if a phenomenon which may affect the radiofrequency electrical characteristics occurs at a certain time, it is possible to maintain the difference in radiofrequency characteristics of the plasma processing chamber CN before and after that time within a predetermined range. Accordingly, the effective power consumed in the plasma space can be sustained at substantially the same level.

As a result, even when the phenomenon which may affect the radiofrequency characteristics occurs, the same process recipe can be employed to obtain substantially the same plasma processing results before and after the occurrence. In other words, when deposition processes are performed at a certain time interval therebetween, the deposition characteristics such as layer thickness, isolation voltage, etching rate, and the like remain substantially the same, even over time. Particularly, because the absolute value of $\Delta f_0$ ($\Delta A$) is maintained at a value smaller than 10% of $f_{00}$, the variation in the thickness of the layers deposited in the plasma processing chamber CN using the same conditions can be maintained within ±5% regardless of whether there has been a reassembling process (disassembling, transferring, and reassembling the plasma processing chamber CN) or adjustment work, or regardless of how many times it has been used.

In this manner, the overall radiofrequency electrical characteristics of the plasma processing apparatus which have never been considered can be set, and a plasma can be stably generated. Thus, the plasma processing apparatus achieves superior operational stability.

When the plasma processing apparatus of this embodiment is incorporated into a multi-chamber type plasma processing apparatus having a plurality of plasma processing chambers or a plasma processing system having a plurality of plasma processing apparatuses, the plurality of plasma processing chambers can be maintained to achieve the same plasma processing results using the same process recipe.

Thus, it is no longer necessary to examine the correlation between the external parameters and the inspection results obtained through a conventional inspection method requiring a step of inspecting the actually treated substrates using an enormous amount of data in order to evaluate the process conditions.

Compared to the above-described conventional inspection method, according to this embodiment, the time required for adjusting the plasma processing chamber CN to minimize process variation and to constantly achieve the same processing results by using the same process recipe can be significantly reduced by measuring the first series resonant frequency $f_0$. Moreover, the plasma processing apparatus can be directly evaluated in situ within a shorter period of time, instead of by a two-step process of first evaluating the treated substrate and then evaluating the operation of the plasma processing apparatus. Moreover, in inspecting a multi-chamber type plasma processing apparatus, the inspection results of the plurality of chambers can be obtained almost simultaneously, which is an advantage that cannot be achieved by the conventional inspection method requiring individual inspections of processed substrates.

Thus, there is no need to stop the production line for days or weeks to validate and evaluate the operation of the plasma processing apparatus, and the productivity of the manufacturing line can be increased thereby. Moreover, the cost of substrates for inspection, the cost of processing the substrates for inspection, and the labor cost for workers involved with the adjustment can be reduced.

In the plasma processing chamber CN of this embodiment, the first series resonant frequency $f_0$ is so set that three times the first series resonant frequency $f_0$ is larger than the power frequency $f_e$ in order to optimize the overall radiofrequency electrical characteristics of the plasma processing chamber CN which have never been considered in conventional apparatuses. The operation of the plasma processing chamber CN can be stabilized thereby, and the radiofrequency power from the radiofrequency generator 1 can be efficiently fed to the plasma generation space between the plasma excitation electrode 4 and the susceptor electrode 8 even when the radiofrequency power of a frequency 13.56 MHz, which is the frequency conventionally used, or more is used. If the same frequency conventionally used is supplied, the effective power consumed in the plasma space can be increased compared to the conventional plasma processing apparatus, and the density of the generated plasma can be improved.

Consequently, the processing rate can be improved by increasing the plasma excitation frequency. When applied to a plasma-enhanced CVD process, the deposition rate can be improved and a plasma can be stably generated. The plasma processing apparatus with such a superior operational stability can also be incorporated in a multi-chamber plasma processing apparatus or in a plasma processing system.

When power is efficiently supplied to the plasma space, undesirable spreading of the plasma can be prevented. Thus, the uniformity in plasma processing in an in-plane direction of the substrate 16 can be improved. When applied to a deposition process, the layer thickness distribution in an in-plane direction can be improved.

When applied to a deposition process such as plasma enhanced CVD, sputtering, or the like, the deposition state, i.e., the layer characteristics such as isolation voltage of the deposited layer, resistance of the deposited layer against an etchant, density (hardness) of the deposited layer, and the like, can be improved by increasing effective power consumed in the plasma chamber.

Note that the density of the deposited layer is indicated as, for example, resistance against etching in a buffered hydrofluoric acid (BHF) solution.

According to this embodiment, the effective power consumed in the plasma space can be increased compared with conventional plasma processing apparatuses when the same frequency is supplied. Thus, the power consumption efficiency can be improved, and the power required to achieve the same processing rate or the layer characteristics can be reduced compared to conventional plasma processing apparatuses. These advantages can also be achieved when the plasma processing apparatus of this embodiment is applied to a multi-chamber plasma processing apparatus having a plurality of the plasma processing chambers or to a plasma processing system. In accordance with this embodiment, power loss can be reduced, the operating cost can be reduced, and the productivity can be increased. Because the time required for processing is also shortened, the total carbon dioxide emission due to power consumption during the plasma processing can be significantly decreased.

Figure 15:
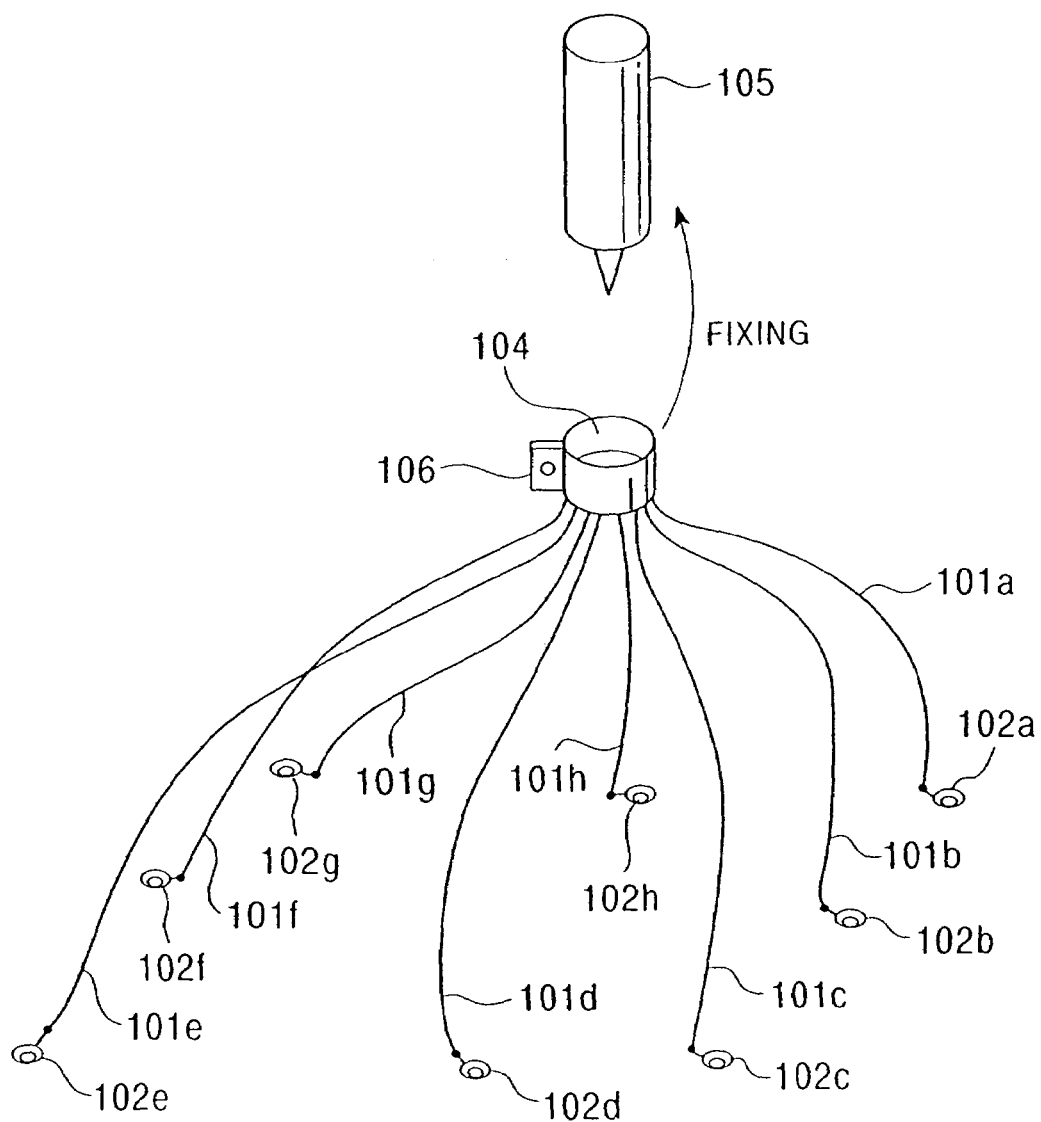
FIG. 15 is an isometric view of a probe for an impedance meter.

The impedance characteristic of the plasma processing chamber CN can also be measured by using a fixture shown in FIG. 15 comprising a plurality of conductive wires 101a to 101h, each having the same impedance, and a probe attachment 104, to which one end of each of the plurality of conductive wires 101a to 101h is attached, may be used to measure the impedance characteristics of the plasma chamber CN.

The probe attachment 104 is formed, for example, by shaping a 50 mm×10 mm×0.5 mm copper plate into a clamping portion 106 and a ring portion. The diameter of the ring portion is determined so that the ring portion is attachable to the circumference of the probe 105. One end of each of the conductive wires 101a to 101h is soldered to the probe attachment 104 to be electrically connected thereto.

Terminals (attachments) 102a to 102h which are attachable to and detachable from an object to be measured are installed at the other ends of the conductive wires 101a to 101h.

Figure 16:
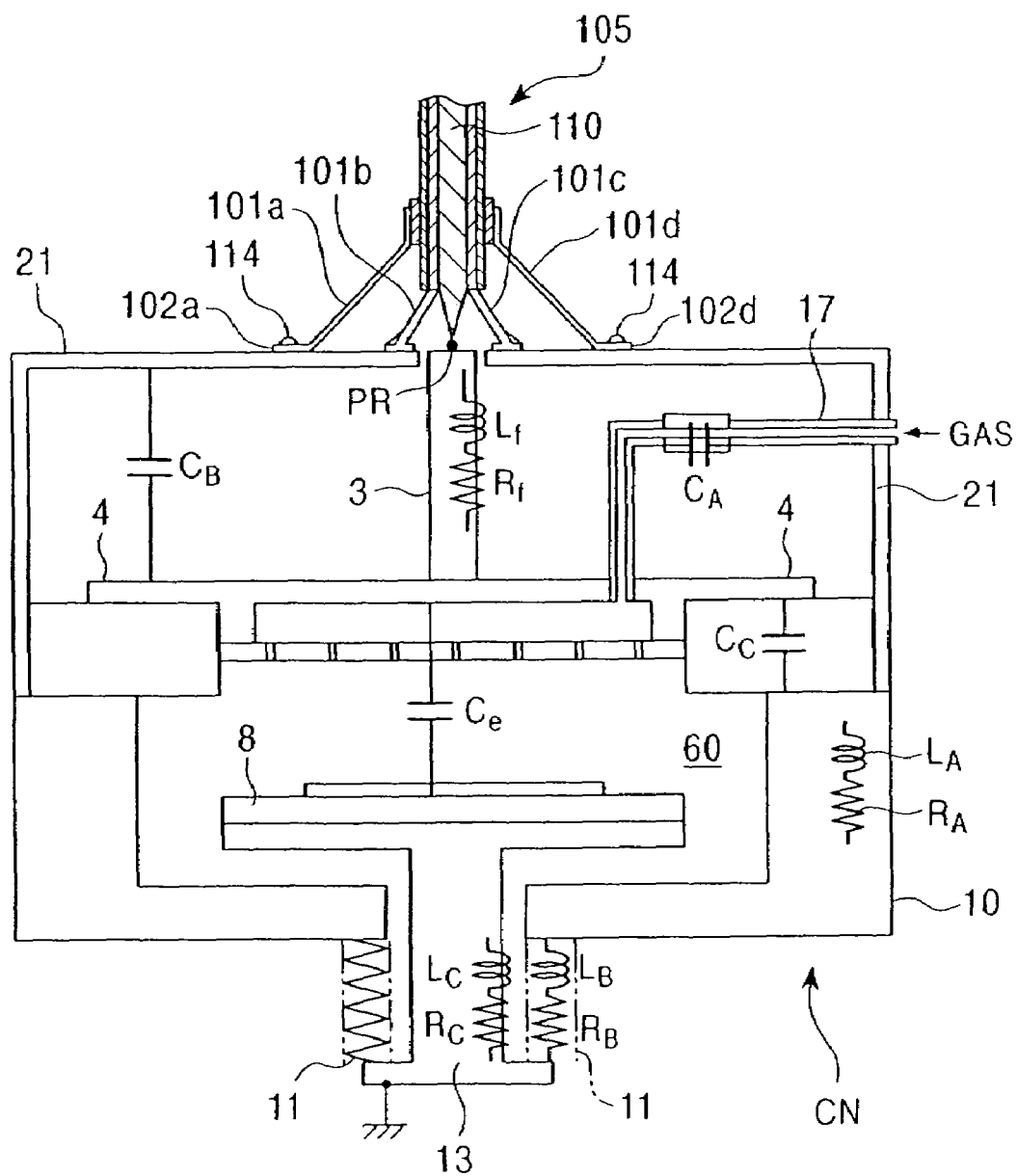
FIG. 16 is a schematic view illustrating connection of the probe for the impedance meter shown in FIG. 15.

When this fixture is used, the probe 105 is inserted into the ring portion of the probe attachment 104, and the probe 105 and the probe attachment 104 are clamped by the clamping portion 106. The conductive wires 101a to 101h are detachably fastened, preferably by screws, to the measured object in a substantially symmetrical manner about a point through the terminals 102a to 102h, as shown in FIG. 16.

The conductive wires 101a to 101h may be made of, for example, aluminum, copper, silver, or gold, or may be plated by silver or gold having a thickness of 50 μm or more.

The method for measuring impedance using this fixture is now explained with reference to FIGS. 1, 15, and 16.

First, the radiofrequency generator 1 and the matching box 2 of the plasma processing apparatus are removed from the plasma processing apparatus. The conductive line 110 of the probe 105 of the impedance meter is then connected to a conductive line 113 which connects the matching box 2 to the feed plate 3. The terminals 102a to 102h connected to the conductive wires 101a to 101h of the fixture of the impedance meter are screwed to the chassis 21 of the plasma processing apparatus in a symmetrical manner about the feed plate 3 using screws 114. After the impedance meter is set as above, a measuring signal is fed to the conductive line 110 of the impedance meter to measure the impedance of the path from the feed plate 3 of the plasma processing apparatus to the chassis 21 via the plasma space 60.

In this manner, a uniform current flows to the measuring object regardless of the size of the measuring object or the distance between two points to be measured. Also, by setting a residual impedance which does not affect the measurement of the impedance of the measuring object, the impedance measurement can be performed with precision.

In this embodiment, as shown in FIG. 1, the substrate 16 is placed on the susceptor electrode 8, and the first series resonant frequency $f_0$ and the power frequency $f_e$ are set in relation to the plasma excitation electrode 4. However, it is possible to place the substrate 16 on the plasma excitation electrode 4 serving as a cathode.

Second Embodiment

Figure 7:
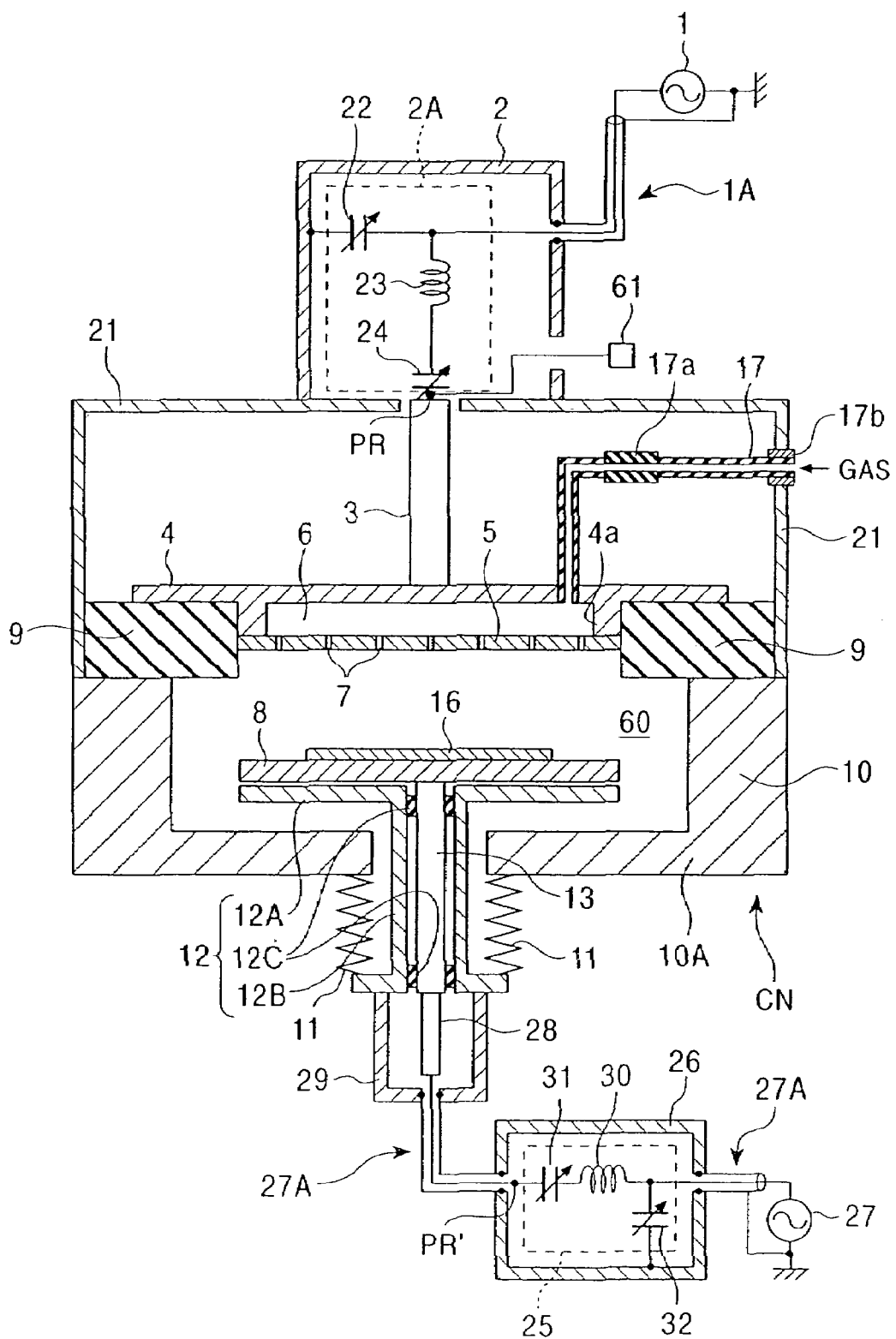
FIG. 7 is a schematic view of a plasma processing apparatus in accordance with a second embodiment of the present invention.

FIG. 7 is a cross-sectional view showing the outline of the structure of a plasma processing apparatus according to a second embodiment.

The plasma processing apparatus of the second embodiment is of a dual-frequency excitation type. The second embodiment differs from the first embodiment shown in FIGS. 1 to 4 in that power is supplied to a susceptor electrode 8 side and that there is a measuring terminal 61. A difference also lies in the setting of the first series resonant frequency $f_0$. Other corresponding components are given the same reference numerals and symbols and the description thereof is omitted to avoid duplication.

In the plasma processing apparatus of this embodiment, a first series resonant frequency $f_0$ of the plasma processing chamber CN measured at a measuring point PR which corresponds to the input end of the feed plate 3 and the output terminal of the matching circuit 2A is used as a radiofrequency characteristic A. The plasma processing apparatus is designed and manufactured so as to set the initial value $f_{00}$ (a radiofrequency characteristic $A_0$) of the first series resonant frequency $f_0$ at such a value that 1.3 times $f_{00}$ is larger than the power frequency $f_e$ supplied from the radiofrequency generator 1. Moreover, a first series resonant frequency $f_{01}$ (a radiofrequency characteristic $A_1$) measured after the plasma processing apparatus which has been disassembled for transportation is reassembled at the customer site or during use is maintained at such a level that the absolute value of the difference $\Delta f_0$ ($\Delta A$) between $f_{00}$ and $f_{01}$ is less than 10% of $f_{00}$.

The plasma processing apparatus of this embodiment is designed and manufactured to set $f_{00}$ (radiofrequency characteristic $A_0$) at such a value that 1.3 times a first series resonant frequency $f_0$ (radiofrequency characteristic A) of a plasma processing chamber CN measured at the measuring point PR is larger than a power frequency $f_e$ supplied from the radiofrequency generator 1 to the plasma processing chamber CN. A first series resonant frequency $f_{01}$ (radiofrequency characteristic $A_1$) measured after the plasma processing apparatus is disassembled for transfer and reassembled at the customer site or during use is maintained at such a level that the absolute value of the difference $\Delta f_0$ ($\Delta A$) between $f_{01}$ and $f_{00}$ is less than 10% of $f_{00}$.

Referring to FIG. 7, the plasma processing apparatus of this embodiment has a susceptor shield 12 disposed under a susceptor electrode 8 and a bellows 11 for vertically moving the susceptor electrode 8 and the susceptor shield 12. The distance between a plasma excitation electrode 4 and the susceptor electrode 8 is thereby adjustable. The susceptor electrode 8 is connected to a second radiofrequency generator 27 through a feed plate 28 connected to the bottom end of a shaft 13 and a matching circuit 25 housed in a susceptor-electrode-side matching box 26 made of a conductor.

The feed plate 28 is covered by a chassis 29 connected to the bottom end of a cylindrical support 12B of the susceptor shield 12. The chassis 29 is connected to the matching box 26 by a shielding line of a feed line 27A which is a coaxial cable, and is grounded together with the matching box 26. Thus, the susceptor shield 12, the chassis 29, and the matching box 26 have the same DC potential.

The matching circuit 25 matches the impedance between the second radiofrequency generator 27 and the susceptor electrode 8. Referring to FIG. 7, the matching circuit 25 has, as passive elements, a coil 30 and a tuning capacitor 31 connected in series between the second radiofrequency generator 27 and the feed plate 28, and a load capacitor 32 connected in parallel with the tuning coil 30 and the tuning capacitor 31. One end of the load capacitor 32 is connected to the matching box 26. In short, the matching circuit 25 has substantially the same structure as that of the matching circuit 2A. The matching box 26 is set to a ground potential through a shielding line of the feed line 27A, and the end of the load capacitor 32 is grounded thereby. Alternatively, another tuning coil may be connected in series to the tuning coil 30, and another load capacitor may be connected in parallel to the load capacitor 32.

The feed plate 28 is identical to the feed plate 3. The input end of the feed plate 28 is attached to the matching circuit 25, and the output end is attached to the shaft 13. As above, the feed plate 28 may be attached in a similar fashion as the feed plate 3, preferably screwed, or any manner known in the art.

The tuning capacitor 24 is the passive element located at the last output stage among the passive elements constituting the matching circuit 2A, and the measured region of the plasma processing chamber CN of this embodiment starts from the measuring point PR which corresponds to the position of the output terminal of this tuning capacitor 24, as in the first embodiment. The impedance measuring terminal (resonant frequency measuring terminal) 61 of the plasma processing chamber CN is disposed outside the chassis 21 and is connected to the measuring point PR via a conductor extending from the measuring point PR.

In the plasma processing apparatus of this embodiment, a substrate 16 to be treated is placed on the susceptor electrode 8, radiofrequency voltage is applied to the plasma excitation electrode 4 from a first radiofrequency generator 1 and to the susceptor electrode 8 from the second radiofrequency generator 27, while a reactive gas is fed into a chamber space 60 through a gas feeding tube 17 and shower holes 7 to generate a plasma, and plasma processing such as deposition or the like is performed on the substrate 16. During the process, radiofrequency power of approximately 13.56 MHz or more, and more specifically, a radiofrequency power of 13.56 MHz, 27.12 MHz, 40.68 MHz, or the like, is supplied from the first radiofrequency generator 1. The second radiofrequency generator 27 may supply either the same radiofrequency power as does the first radiofrequency generator 1 or a radiofrequency power of a different frequency, e.g., 1.6 MHz.

Figure 8:
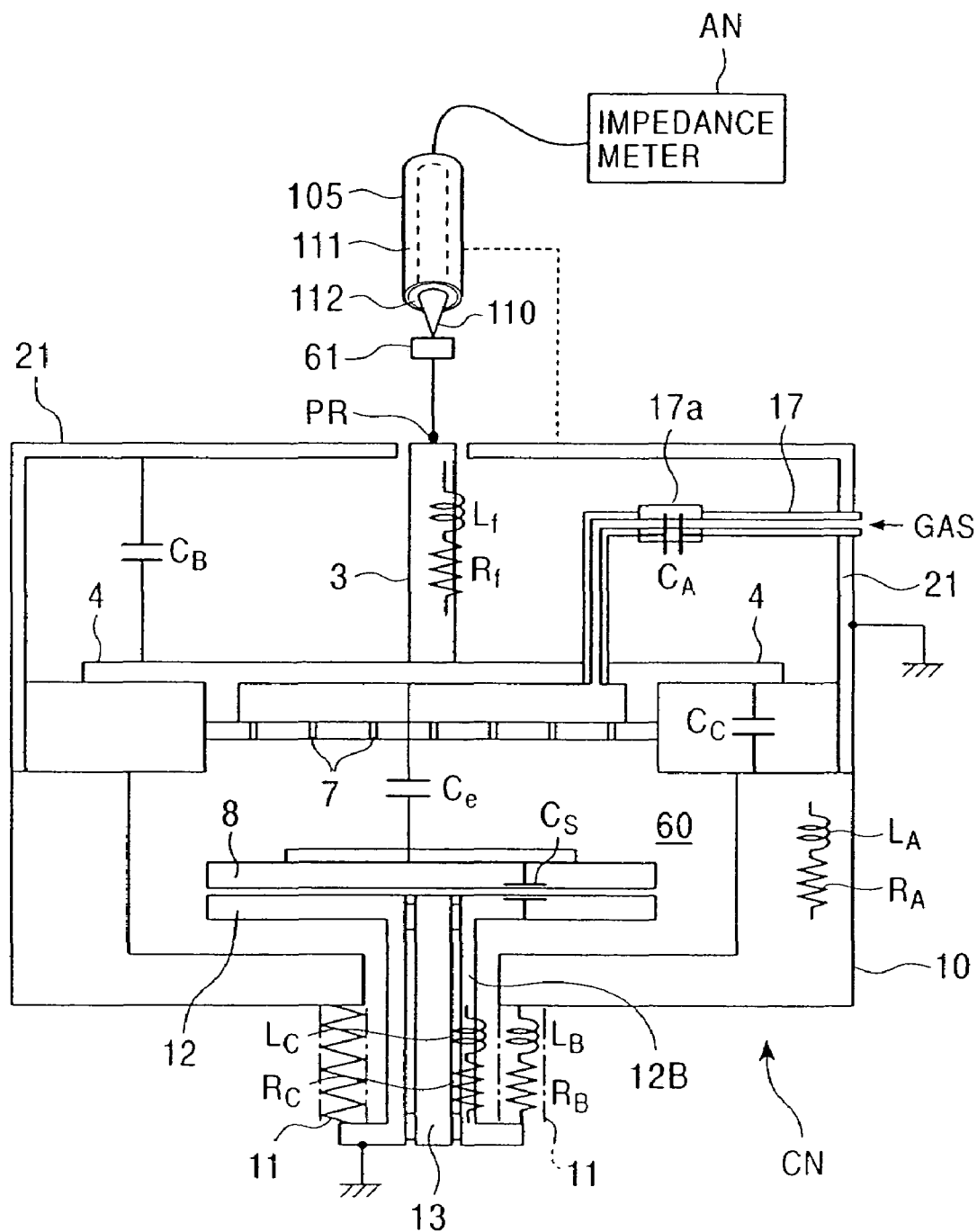
FIG. 8 is a schematic view for illustrating impedance characteristics of the plasma processing apparatus of the second embodiment.
Figure 9:
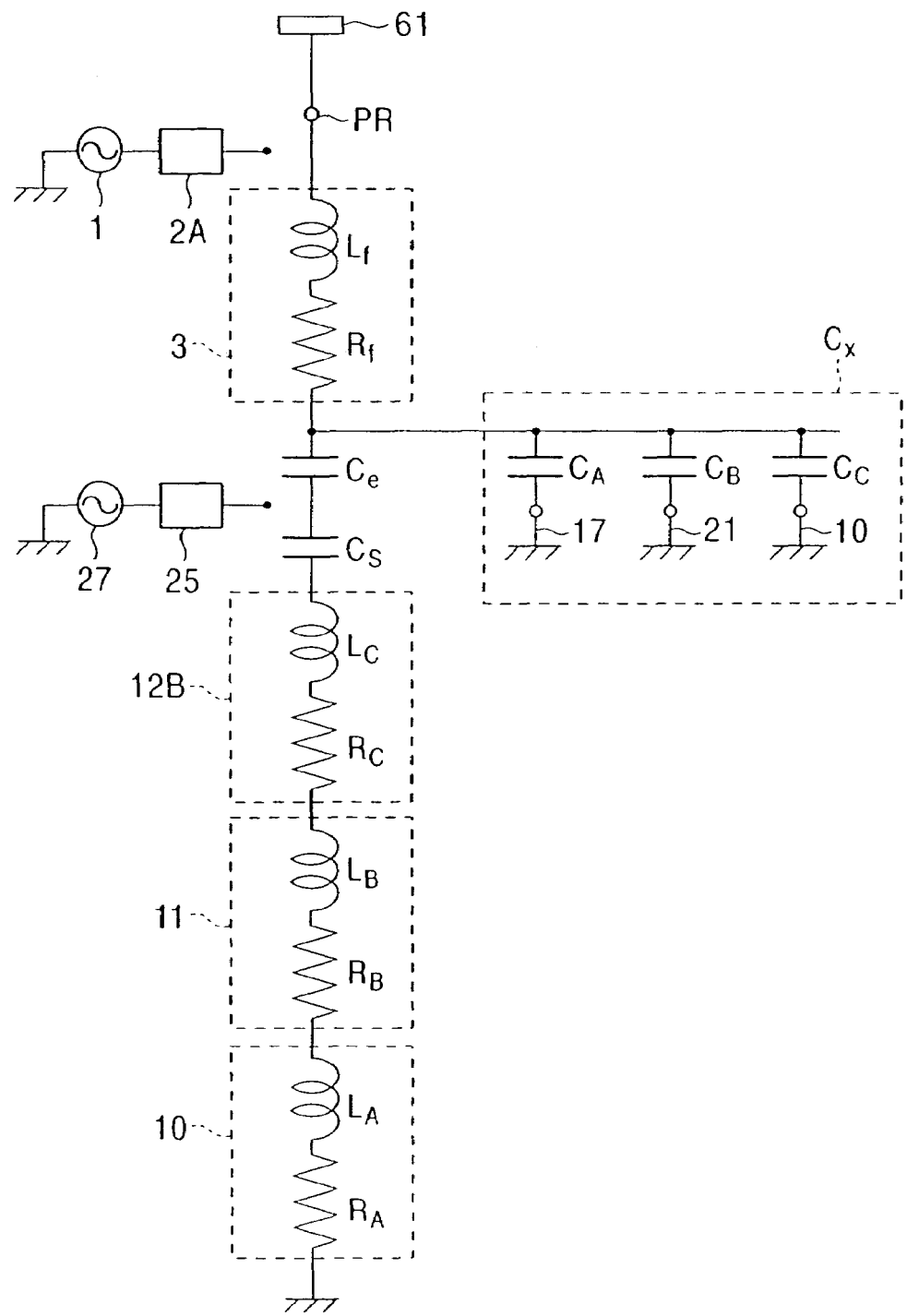
FIG. 9 is an equivalent circuit diagram of the plasma processing apparatus shown in FIG. 8.

The first series resonant frequency $f_0$ of the plasma processing apparatus of this embodiment is defined by measurement, as in the first embodiment, and more specifically, as shown in FIGS. 8 and 9.

FIG. 8 is an illustration for explaining the impedance characteristics of the plasma processing apparatus of this embodiment. FIG. 9 is an equivalent circuit of FIG. 8.

The state of the plasma chamber as viewed from the impedance measuring terminal 61 is measured in this embodiment. In other words, as shown in FIG. 9, the measured region includes the impedance measuring terminal 61 which is not included in the measured region of the first embodiment. The impedance measuring terminal 61 is connected in series to the measuring point PR.

Illustrations of the first radiofrequency generator 1 and the second radiofrequency generator 27 in the drawing aim to show the arrangement of the matching circuit 2A and the matching circuit 25 and do not imply the power is being fed to the circuit. The impedance characteristics cannot be measured while power is being supplied.

As shown by a broken line in FIG. 8, a probe 105 of an impedance meter AN is connected to the impedance measuring terminal 61 and to a ground position of the plasma chamber CN, for example, a chassis 21. At this stage, the frequency oscillated by the impedance meter AN is varied over the range of 1 to 100 MHz so as to measure the vector quantity $(Z, \theta)$ of the impedance of the above-described measured region of the plasma chamber CN.

Figure 10:
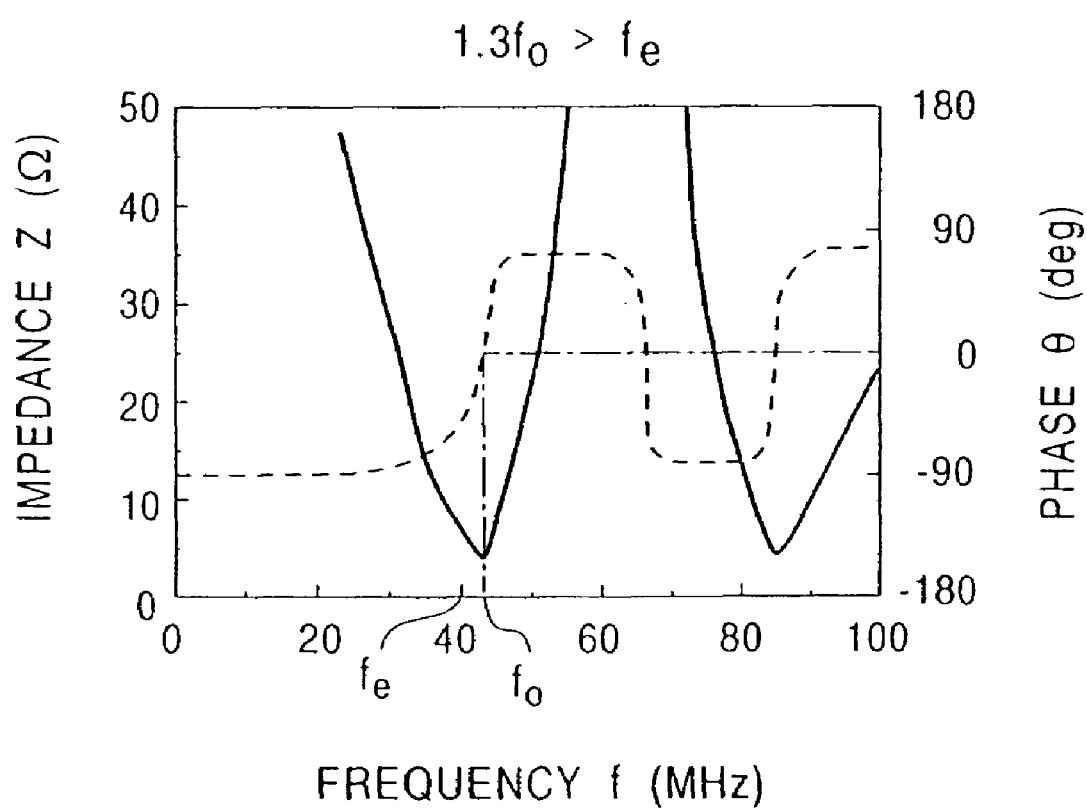
FIG. 10 is a graph illustrating the dependence of the impedance Z and the phase θ on the frequency for defining a first series resonant frequency $f_0$ of the plasma processing apparatus in the second embodiment.

Next, as shown in FIG. 10, both impedance Z (Ω) and phase $\theta$ (deg) are plotted versus frequency f (MHz) on the same graph. In the graph, the abscissa corresponds to the frequency f (MHz), the ordinate at the left side corresponds to the impedance Z (Ω), and the ordinate at the right side corresponds to the phase $\theta$ (deg). Referring to the impedance characteristic curve (solid line) and the phase curve (broken line), the first series resonant frequency $f_0$ is defined as the lowest frequency among the frequencies at the minima $Z_{min}$ of the impedance.

Referring to FIG. 8, the following radiofrequency electrical factors within the above-described measured region contribute to the first series resonant frequency $f_0$ measured as above:

Inductance $L_f$ and resistance $R_f$ of the feed plate 3;

Plasma electrode capacitance $C_e$ between the plasma excitation electrode 4 and the susceptor electrode 8;

Capacitance $C_s$ between the susceptor electrode 8 and the susceptor shield 12;

Inductance $L_C$ and resistance $R_C$ of the cylindrical support 12B of the susceptor shield 12;

Inductance $L_B$ and resistance $R_B$ of the bellows 11;

Inductance $L_A$ and resistance $R_A$ of the chamber wall 10;

Capacitance $C_A$ between the gas feeding tube 17 and the plasma excitation electrode 4 via the insulator 17a;

Capacitance $C_B$ between the plasma excitation electrode 4 and the chassis 21; and Capacitance $C_C$ between the plasma excitation electrode 4 and the chamber wall 10.

These radiofrequency factors are arranged as below to form a circuit equivalent to the circuit in which radiofrequency current flows during plasma emission, as shown in FIG. 9. The inductance $L_f$ and resistance $R_f$ of the feed plate 3, the plasma electrode capacitance $C_e$ between the plasma excitation electrode 4 and the susceptor electrode 8, the capacitance $C_s$ between the susceptor electrode 8 and the susceptor shield 12, the inductance $L_C$ and resistance $R_C$ of the cylindrical support 12B of the susceptor shield 12, the inductance $L_B$ and resistance $R_B$ of the bellows 11, and the inductance $L_A$ and resistance $R_A$ of the chamber wall 10 are connected in series in that order having the resistance $R_A$ at the last stage grounded. In addition to these, each of the capacitance $C_A$, the capacitance $C_B$, and the capacitance $C_C$ is connected in parallel between the resistance $R_f$ and the plasma electrode capacitance $C_e$ and has one end thereof grounded. By measuring the impedance characteristics of this equivalent circuit, the first series resonant frequency $f_0$ of this embodiment is defined.

The plasma processing apparatus of this embodiment is designed and manufactured to set the initial value $f_{00}$ (radiofrequency characteristic $A_0$) of the first series resonant frequency $f_0$ at such a value that 1.3 times $f_{00}$ is larger than the power frequency $f_e$ fed from the radiofrequency generator 1. The first series resonant frequency $f_{01}$ measured subsequent to reassembling the plasma processing apparatus disassembled for transfer, performing a plasma process on workpieces, or performing adjustment work such as overhauling, parts replacement, and assembly with alignment, is maintained to such a level that the absolute value of the difference $\Delta f_0$ ($\Delta A$) between $f_{01}$ and $f_{00}$ is less than 10% of $f_{00}$. When $\Delta f_0$ reaches 10% or more of $f_{00}$, a corrective action is performed.

Examples of the corrective action include the following:

(1) Adjusting the shape (length) of the feed plate 3;

(2) Adjusting the overlapping area between the plasma excitation electrode 4 and the chamber wall 10;

(3) Adjusting the thickness of the insulator between the plasma excitation electrode 4 and the chamber wall 10; and (4) Short-circuiting between the susceptor shield 12 and the chamber wall 10.

For example, in the plasma processing apparatus of this embodiment, the power frequency $f_e$ is set at 40.68 MHz and the impedance Z (Ω) and the phase $\theta$ (deg) relative to frequency f (MHz) ranging from 0 to 100 MHz are measured to give an impedance characteristic curve and a phase curve, as shown in FIG. 10. The first series resonant frequency $f_{00}$ is then set at 42.5 MHz so that relationship (2) below is satisfied.

$$1.3f_0 > f_e \qquad (2)$$

In this embodiment, because the impedance measuring terminal 61 is connected to the measuring point PR which corresponds to the input end of the feed plate 3, unlike the first embodiment, there is no need to mechanically detach the matching circuit 2A from the feed plate 3 in order to separate the matching circuit 2A from the plasma processing chamber CN. Thus, the operation of attaching a probe for measuring the impedance characteristics of the plasma processing chamber CN can be readily performed. Consequently, the plasma processing chamber CN of this embodiment achieves the advantage of improving the efficiency of measuring the first series resonant frequency $f_0$ in addition to the advantages described in the first embodiment.

When the frequency characteristics of the plasma processing chamber CN are measured by the impedance meter AN through the impedance measuring terminal 61 as above, the matching circuit 2A remains connected in series with the plasma processing chamber CN as viewed from the impedance measuring terminal 61. However, the effect of the matching circuit 2A to $f_0$ of the plasma processing chamber CN is so small that the impedance characteristics can still be accurately measured. That the effect is small can be demonstrated by comparing the first series resonant frequency $f_0$ obtained from the impedance curve plotted while having the matching circuit 2A connected with that obtained from the impedance curve plotted while having the matching circuit 2A disconnected. Thus, the first series resonant frequency $f_0$ can be easily measured.

In this embodiment, the impedance measuring terminal 61 penetrates the matching box 2. Alternatively, the radiofrequency generator 1 and the matching box 2 may be configured to be removable from the plasma processing apparatus during the impedance measuring, without having the impedance measuring terminal 61 penetrating the matching box 2. In this case also, the efficiency of measuring the first series resonant frequency $f_0$ can be improved since, unlike the first embodiment, there is no need to detach the matching circuit 2A from the power feeding line in order to separate the matching circuit 2A from the plasma processing chamber CN.

Third Embodiment

Now, a plasma processing apparatus according to a third embodiment of the present invention will be described with reference to the drawings.

Figure 11:
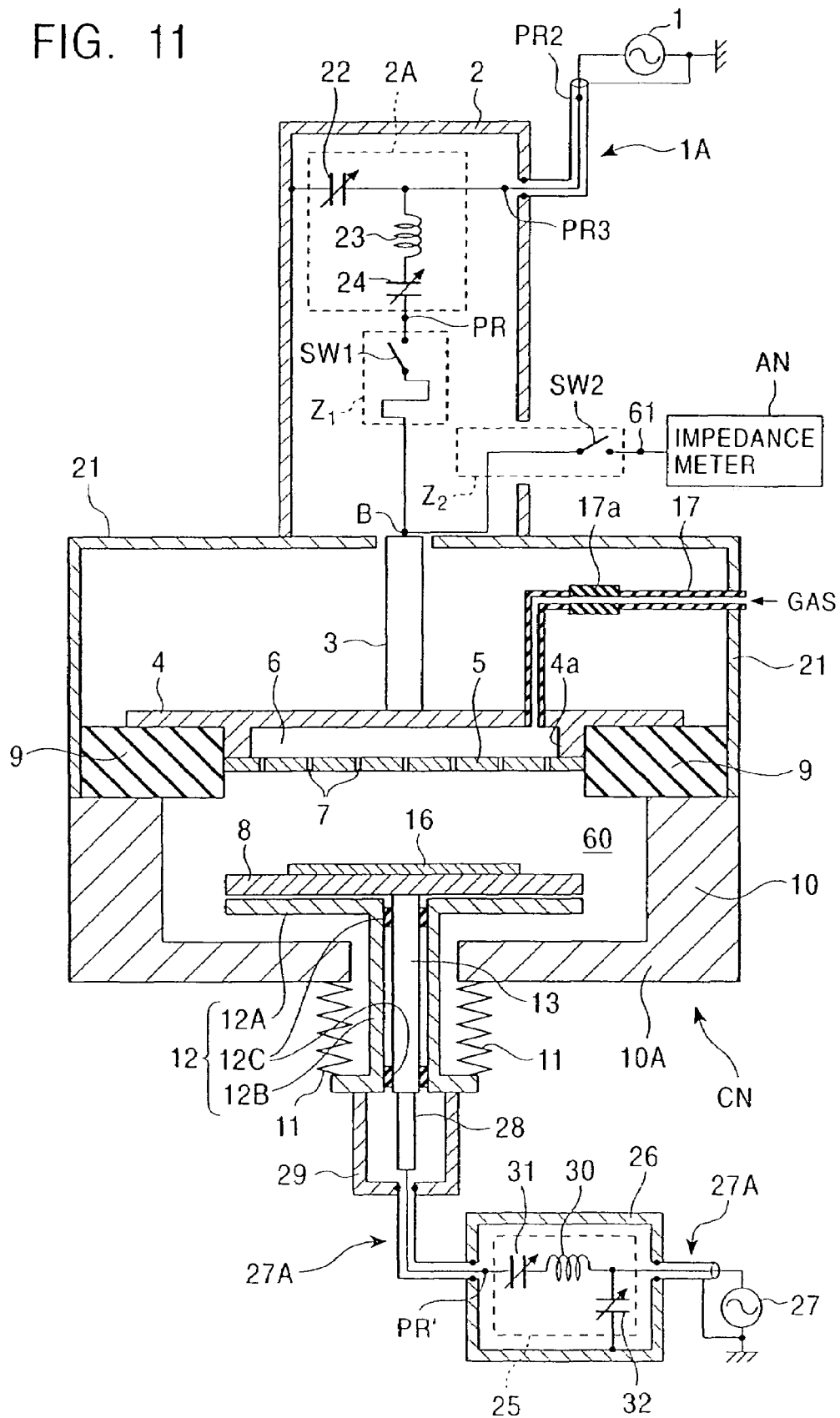
FIG. 11 is a schematic view of a plasma processing apparatus in accordance with a third embodiment of the present invention.

FIG. 11 is a cross-sectional view showing the outline of the structure of the plasma processing apparatus of the third embodiment.

The plasma processing apparatus of this embodiment is of a dual-frequency excitation type. The third embodiment differs from the second embodiment shown in FIGS. 7 to 9 in the structure around the impedance measuring terminal 61 and settings of the first series resonant frequency $f_0$ and a series resonance frequency $f_0'$. Other corresponding elements are represented by the same reference numerals and the explanation thereof is omitted.

The plasma processing apparatus of this embodiment is designed and manufactured to give a first series resonant frequency $f_{00}$ (radiofrequency characteristic $A_0$) larger than three times a power frequency $f_e$ supplied to the plasma processing chamber CN from the radiofrequency generator 1. The first series resonant frequency $f_{00}$ is the initial value of the first series resonant frequency $f_0$ (radiofrequency characteristic A) which is measured at a measuring point PR which corresponds to the position of the input end of the feed plate 3 and the output terminal of a matching circuit 2A.

As described below, the plasma processing apparatus of this embodiment is designed so that an initial value $f_{00}'$ (radiofrequency characteristic $A_0$) of the series resonant frequency $f_0'$ which is defined by the capacitance $C_e$ between a plasma excitation electrode 4 and a susceptor electrode 8 is larger than a power frequency $f_e$ multiplied by the square root of (interelectrode distance d/total distance of the portions not emitting plasma δ).

A first series resonant frequency $f_{01}$ measured after reassembling the plasma processing apparatus, which has been disassembled for the purpose of transfer, at the customer site or during the use of the apparatus is maintained to such a level that the absolute value of a difference $\Delta f_0$ ($\Delta A$) between $f_{01}$ and $f_{00}$ is less than 10% of $f_{00}$. Also, the series resonant frequency $f_{01}'$ (radiofrequency characteristic $A_1'$) measured at that time is maintained at such a level that the absolute value of a difference $\Delta f_0'$ ($\Delta A'$) between $f_{01}'$ and $f_{00}'$ is less than 10% of $f_{00}'$.

As shown in FIG. 11, the plasma processing apparatus of this embodiment comprises switches for switching the matching circuit 2A to/from an impedance measuring terminal (resonant frequency measuring terminal) 61, the switches being disposed in the vicinity of the measuring point PR. More specifically, a switch SW1 disposed between the matching circuit 2A and a feed plate 3 and a switch SW2 disposed between the impedance measuring terminal 61 and the feed plate 3 are provided.

During plasma excitation, the switch SW2 disconnects the impedance measuring terminal 61 from the input end of the feed plate 3 and the switch SW1 connects the output terminal of the matching circuit 2A (the measuring point PR) to the input end of the feed plate 3. During measurement of the resonant frequency of the plasma processing chamber CN, the switch SW2 connects the impedance measuring terminal 61 to the input end of the feed plate 3 and the switch SW1 disconnects the feed plate 3 from the measuring point PR.

The impedance characteristics (resonant frequency characteristics) measured at the measuring point PR while closing the switch SW1 and opening the switch SW2 are set equal to the impedance characteristics (resonant frequency characteristics) measured at the impedance measuring terminal 61 while opening the switch SW1 and closing the switch SW2. As described below with reference to FIG. 11, an impedance $Z_1$ in the vicinity of the switch SW1 and an impedance $Z_2$ in the vicinity of the switch SW2 are set to be equal to each other.

In other words, the resonant frequency characteristics measured at the output terminal of the matching circuit 2A (the measuring point PR) while cutting the electrical connection between the end of the feed plate 3 and the impedance measuring terminal 61 and securing the electrical connection between the end of the feed plate 3 and the output terminal of the matching circuit 2A are set to be equal to the resonant frequency characteristics measured at the impedance measuring terminal 61 while securing the electrical connection between the end of the feed plate 3 and the impedance measuring terminal 61 and cutting the electrical connection between the end of the feed plate 3 and the output terminal of the matching circuit 2A.

More particularly, the impedance $Z_1$ in the measuring point PR side, i.e., the region between the measuring point PR and a branching point B which branches to the switch SW2 when the switch SW1 is closed and the switch SW2 is opened is set to be equal to the impedance $Z_2$ at the impedance measuring terminal 61 side, i.e., the region between the impedance measuring terminal 61 and the branching point B which branches to the switch SW1 when the switch SW2 is closed and the switch SW1 is opened.

A probe of an impedance meter AN is detachably connected to the impedance measuring terminal 61, as in the second embodiment shown in FIG. 8. The probe is also detachably connected to the ground position of the plasma processing chamber CN, for example, a chassis 21.

Figure 12:
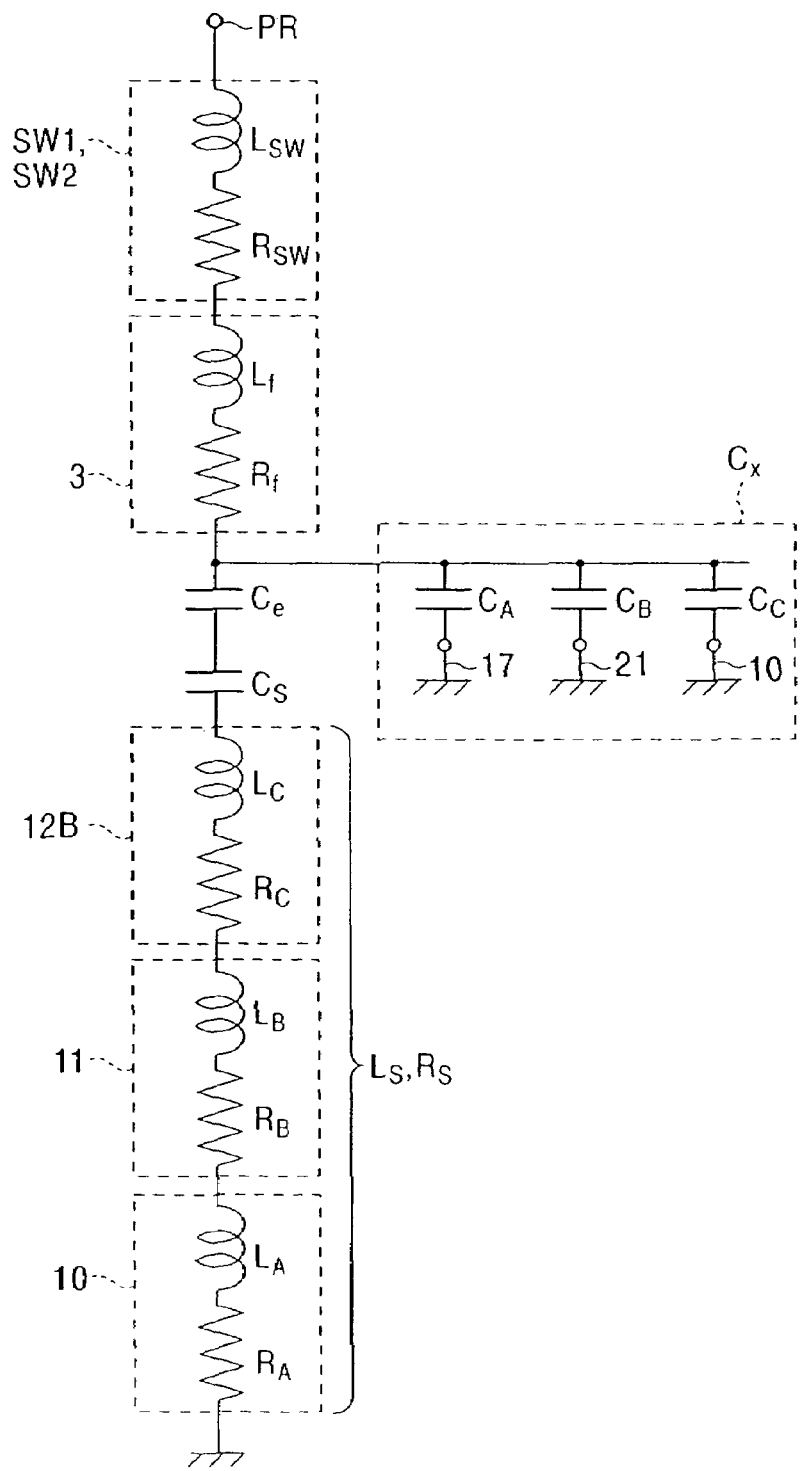
FIG. 12 is an equivalent circuit diagram of the plasma processing apparatus shown in FIG. 11.

A first series resonant frequency $f_0$ of the plasma processing apparatus of this embodiment is defined by measurement as in the second embodiment, more particularly, as shown in FIGS. 11 and 12.

FIG. 12 is a circuit diagram for measuring the impedance characteristics of the plasma processing apparatus of this embodiment shown in FIG. 11.

In the plasma processing apparatus of this embodiment, while closing the switch SW1 and opening the switch SW2, the substrate 16 to be treated is placed on the susceptor electrode 8, radiofrequency voltage is applied to the plasma excitation electrode 4 and the susceptor electrode 8 from a first radiofrequency generator 1 and the second radiofrequency generator 27, respectively, while a reactive gas is fed into a chamber space 60 through a gas feeding tube 17 and shower holes 7 to generate a plasma, and plasma processing such as deposition or the like is performed on the substrate 16, as in the second embodiment shown in FIGS. 7 to 9. During this process, a radiofrequency voltage of approximately 13.56 MHz or more, and more specifically, a radiofrequency voltage of 13.56 MHz, 27.12 MHz, 40.68 MHz, or the like, is supplied from the first radiofrequency generator 1. The second radiofrequency generator 27 may supply either the same radiofrequency power as does the first radiofrequency generator 1 or a radiofrequency power of a different frequency, e.g., 1.6 MHz.

The state of the plasma processing chamber CN as viewed from the impedance measuring terminal 61 is the measured region of the plasma processing chamber CN of this embodiment. Referring to FIG. 11, because the impedance $Z_1$ in the vicinity of the switch SW1 and the impedance $Z_2$ in the vicinity of the switch SW2 are set to be equal to each other, the above-described measured region is equivalent to the state of the plasma processing chamber CN viewed from the measuring point PR.

As shown in FIG. 11, unlike the second embodiment, the matching circuit 2A can be eliminated from the measured region by operating the switch SW1. Thus, the impedance characteristics of the plasma processing chamber CN can be further accurately measured. The switch SW2, which is not included in the measured region of the second embodiment, is included in this embodiment in order to compensate for the contribution of the switch SW1, which is closed during plasma emission, to the impedance characteristics. By allowing the vicinity of the switch SW2 having the impedance $Z_2$ equal to the impedance $Z_1$ in the vicinity of the switch SW1 to be included in the measured region, the measured region of the plasma processing chamber CN viewed from the impedance measuring terminal 61 can be made substantially the same as the state of the circuit in which a radiofrequency current flows during plasma generation, thereby improving the accuracy of the impedance measurement.

Having the switch SW2 closed and the switch SW1 opened, a frequency oscillated from the impedance meter AN is varied over the range of, for example, 1 MHz to 150 MHz so as to measure the vector quantity (Z, θ) of the impedance within the above-described measured region of the plasma processing chamber CN, as in the second embodiment shown in FIGS. 7 to 9. Since the impedance meter AN is detachably connected to the impedance measuring terminal 61, it is possible to measure the impedance characteristics and the first series resonant frequency $f_0$ by merely operating the switches SW1 and SW2 without having have to detach the matching circuit 2A from the plasma processing chamber CN or detach/attach the impedance measuring probe 105 shown in FIG. 8 in the second embodiment.

Figure 13:
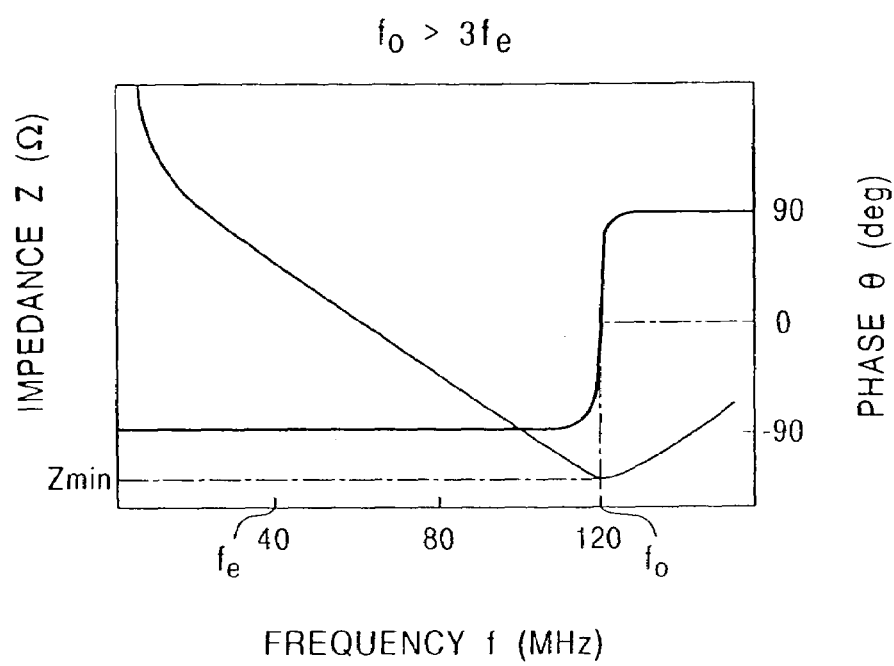
FIG. 13 is a graph illustrating the dependence of the impedance Z and the phase θ on the frequency for defining a first series resonant frequency $f_0$ of the plasma processing apparatus in the third embodiment.

Next, as shown in FIG. 13, impedance Z and phase θ (deg) are plotted versus frequency f (MHz) on the same graph. In the graph, the abscissa corresponds to the frequency f, the ordinate at the left side corresponds to the impedance Z (Ω), and the ordinate at the right side corresponds to the phase θ (deg). Referring to the impedance characteristic curve and the phase curve, the first series resonant frequency $f_0$ is defined as the lowest frequency among the frequencies at minima $Z_{min}$ of the impedance.

Referring to FIG. 12, the following radiofrequency electrical factors within the above-described measured region contribute to the first series resonant frequency $f_0$ measured as above:

Inductance $L_{SW}$ and resistance $R_{SW}$ of the switch SW2;
Inductance $L_f$ and resistance $R_f$ of the feed plate 3;
Plasma electrode capacitance $C_e$ between the plasma excitation electrode 4 and the susceptor electrode 8;
Capacitance $C_s$ between the susceptor electrode 8 and a susceptor shield 12;
Inductance $L_C$ and resistance $R_C$ of a cylindrical support 12B of the susceptor shield 12;
Inductance $L_B$ and resistance $R_B$ of a bellows 11;
Inductance $L_A$ and resistance $R_A$ of a chamber wall 10;
Capacitance $C_A$ between a gas feeding tube 17 and the plasma excitation electrode 4 via an insulator 17a;
Capacitance $C_B$ between the plasma excitation electrode 4 and the chassis 21; and
Capacitance $C_C$ between the plasma excitation electrode 4 and the chamber wall 10.

These radiofrequency factors are arranged as below to form a circuit equivalent to the circuit in which radiofrequency current flows during plasma emission, as shown in FIG. 9. The inductance $L_{SW}$ and resistance $R_{SW}$ of the switch SW2, the inductance $L_f$ and resistance $R_f$ of the feed plate 3, the plasma electrode capacitance $C_e$ between the plasma excitation electrode 4 and the susceptor electrode 8, the inductance $L_C$ and resistance $R_C$ of the shaft 13, the inductance $L_B$ and resistance $R_B$ of the bellows 11, and the inductance $L_A$ and resistance $R_A$ of the chamber wall 10 are connected in series in that order while having the resistance $R_A$ at the last stage grounded. Between the resistance $R_f$ and the plasma electrode capacitance $C_e$, the capacitance $C_A$, the capacitance $C_B$, and the capacitance $C_C$ are connected in parallel, one end of each being grounded. By determining the impedance characteristics of this equivalent circuit, the first series resonant frequency $f_0$ of this embodiment can be defined.

The plasma processing apparatus of this embodiment is designed and manufactured so that an initial value $f_{00}$ (radiofrequency characteristic $A_0$) of the series resonant frequency $f_0$ is larger than three times a power frequency $f_e$ supplied from the radiofrequency generator 1. Moreover, the plasma processing chamber CN is maintained so that a first series resonant frequency $f_{01}$ (radiofrequency characteristic $A_1$) measured after reassembling the plasma processing apparatus, which is disassembled for the purpose of transfer, at the customer site, after plasma processes are performed on workpieces using the apparatus, or after adjustment work such as overhauling, parts replacement, assembly with alignment, or the like is performed, is maintained at such a level that the absolute value of a difference $\Delta f_0$ ($\Delta A$) between $f_{00}$ and $f_{01}$ is smaller than 10% of $f_{00}$. If the absolute value of the difference $\Delta f_0$ is 10% or more of $f_{00}$, a corrective action is performed.

Examples of the corrective action include the followings:
(1) Adjusting the shape and the length of the feed plate 3;
(2) Adjusting the overlapping area of the plasma excitation electrode 4 and the chamber wall 10;
(3) Adjusting the thickness of the insulating material between the plasma excitation electrode 4 and the chamber wall 10; and
(4) Short-circuiting between the susceptor shield 12 and the chamber wall 10 using a conductor.

For example, in the plasma processing apparatus of this embodiment, the power frequency $f_e$ is set at 40.68 MHz and the impedance Z (Ω) and the phase θ (deg) relative to a frequency f (MHz) varied over the range of 0 to 150 MHz are measured to give an impedance characteristic curve and a phase curve, as shown in FIG. 13. The initial value $f_{00}$ of the first series resonant frequency $f_0$ is then set at 123.78 MHz satisfying the relationship below:

$$f_0 > 3f_e \quad (3)$$

In this embodiment, an initial value $f_{00}'$ of a series resonant frequency $f_0'$ defined by the plasma electrode capacitance $C_e$ between the plasma excitation electrode 4 and the susceptor electrode 8 is set at a value larger than three times the power frequency $f_e$ described above.

$$f_0' > 3f_e \quad (4)$$

The series resonant frequency $f_0'$ is defined from the impedance characteristic between the plasma excitation electrode 4 and the susceptor electrode 8, as in determining the first series resonant frequency $f_0$ described above.

To be more specific, the impedance characteristic is measured at one end of the plasma excitation electrode 4 while grounding one end of the susceptor electrode 8, and the lowest frequency among the frequencies at minima $Z_{min}$ of the impedance is defined as the series resonant frequency $f_0'$.

The series resonant frequency $f_0'$ is an electrical radiofrequency characteristic dependent on the mechanical shape of the plasma excitation electrode 4 and the susceptor electrode 8 and is in proportion to the reciprocal of the square root of the plasma electrode capacitance $C_e$ between the plasma excitation electrode 4 and the susceptor electrode 8. By using the series resonant frequency $f_0'$, the frequency characteristics of the plasma excitation electrode 4 and the susceptor electrode 8 for generating plasma can be directly controlled. Consequently, power can be efficiently fed to the plasma emission space, thereby improving the power consumption efficiency and the process efficiency.

Alternatively, in this embodiment, the initial value $f_{00}'$ of the series resonant frequency $f_0'$ defined by plasma electrode capacitance $C_e$ between the plasma excitation electrode 4 and the susceptor electrode 8 is set to a level satisfying relationship (5) relative to the power frequency $f_e$ below:

$$f_0' > (d/\delta)^{1/2} f_e \quad (5)$$

wherein d represents the distance between the plasma excitation electrode (plasma excitation electrode) 4 and the susceptor electrode (counter electrode) 8 and δ represents the total of the distance between the plasma excitation electrode 4 and the generated plasma and the distance between the susceptor electrode 8 and the generated plasma, as will be described in detail below.

Figure 14:
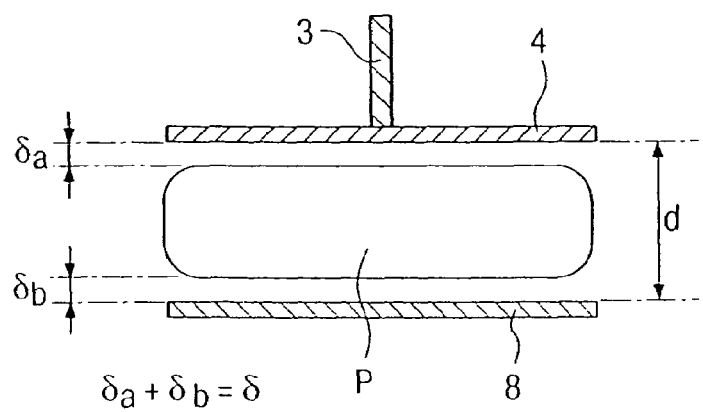
FIG. 14 is a schematic view of a plasma emission state between two electrodes.

FIG. 14 is a diagram showing the state of the space between two electrodes when a plasma is being emitted.

As shown in FIG. 14, the plasma excitation electrode 4 and the susceptor electrode 8 are of a parallel plate type and the distance therebetween is represented by d. The total of the distance between the plasma excitation electrode 4 and the generated plasma and the distance between the susceptor electrode 8 and the generated plasma is represented by δ. In other words, distance $\delta_a$ of the plasma non-emitting portion between the plasma excitation electrode 4 and a plasma emitting region P, which can be visually recognized during plasma emission, and distance $\delta_b$ of the plasma non-emitting portion between the plasma emitting region P and the susceptor electrode 8 satisfy relationship (6) below:

$$\delta_a + \delta_b = \delta \quad (6)$$

Herein, a model capacitance $C_0''$ between the electrodes 4 and 8 during plasma emission can be obtained from the distance d between the electrodes 4 and 8 and the total δ of the distances of the portions not emitting plasma between the electrodes 4 and 8.

The plasma emitting region P between the parallel plate electrodes 4 and 8 can be regarded as a conductor during plasma emission. Thus, the distance between the electrodes 4 and 8 can be regarded as δ during the plasma emission. Since capacitance $C_0''$ between the parallel plate electrodes 4 and 8 during plasma emission is inversely proportional to the distance between the electrodes 4 and 8, the apparent capacitance $C_0''$ during plasma emission is d/δ times the capacitance $C_0$ wherein $C_0$ is the capacitance when the plasma is not emitted.

$$C_0 \propto 1/d \quad (7)$$
$$C_0'' \propto 1/\delta$$
$$\therefore C_0'' \propto d/\delta \cdot C_0$$

Since the series resonant frequency $f_0'$ is proportional to the reciprocal of the square root of the capacitance $C_0$, the series resonant frequency $f_0''$ between the electrodes 4 and 8 during plasma emission is proportional to the reciprocal of the square root of the capacitance $C_0''$, i.e., proportional to the reciprocal of the square root of d/δ.

$$f_0' \propto 1/\sqrt{C_0} \quad (8)$$
$$f_0'' \propto 1/\sqrt{C_0''}$$
$$\therefore f_0'' \propto (d/\delta)^{-1/2} \cdot f_0'$$

The relationship between the series resonant frequency $f_0''$ between the electrodes 4 and 8 during plasma emission and the power frequency $f_e$ is set the same as the relationship between the first series resonant frequency $f_0$ and power frequency $f_e$.

$$f_0'' > f_e \quad (9)$$

Using relationship (8), relationship (9) can be rewritten as relationship (5) described above.

When the series resonant frequency $f_0'$ and the power frequency $f_e$ satisfy relationship (5), the relationship between the series resonant frequency $f_0''$ defined from the model capacitance $C_0''$ during plasma emission and the series resonant frequency $f_0'$ defined from the capacitance between the electrodes 4 and 8 when no plasma is emitted can be optimized. When the value of the series resonant frequency $f_0'$ multiplied by the reciprocal of the square root of d/δ is set to be larger than the power frequency $f_e$, it becomes possible to adjust the series resonant frequency $f_0'$ between the electrodes 4 and 8 during plasma emission relative to power frequency $f_e$, thereby improving the power consumption efficiency during plasma emission.

The plasma processing apparatus of this embodiment has the following advantages in addition to the advantages similar to the first embodiment. Because the switches SW1 and SW2 are provided while an impedance meter is detachably attached to the impedance measuring terminal 61 and the impedances $Z_1$ and $Z_2$ thereof are set equal to each other, the measurement of the impedance characteristic and determining the first series resonant frequency $f_0$ can be readily performed by simply operating the switches SW1 and SW2 without having to separate the matching circuit 2A from the plasma chamber CN. Moreover, the impedance determined at the impedance meter AN connected to the impedance measuring terminal 61 can be considered equal to the impedance measured at the measuring point PR; hence, neither correction nor reduction is necessary to yield the first series resonant frequency $f_0$. Thus, the efficiency of operation can be improved, and the first series resonant frequency $f_0$ can be further accurately measured.

Moreover, by setting the series resonant frequency $f_0'$ and the power frequency $f_e$, the frequency characteristic of the above-described electrodes 4 and 8 for plasma emission can be controlled, voltage can be effectively applied to the plasma emission space, and the power consumption efficiency and the process efficiency can be further improved.

In this embodiment, two switches SW1 and SW2, are provided. Alternatively, a single switch may be used to switch the connections as long as the impedance between the branching point and the measuring point PR and the impedance between the branching point and the probe are set to be equal to each other.

Furthermore, in each of the above-described first to third embodiments, the power frequency $f_e$ and the first series resonant frequency $f_0$ are set in relation to the plasma excitation electrode 4. Alternatively, they may be set in relation to the susceptor electrode 8. In such a case, a measuring point PR' which corresponds to the output terminal of the matching circuit 25 may be set to define the region in which the impedance is measured, as shown in FIGS. 7 and 11. When the impedance characteristic of the plasma chamber CN is measured from the susceptor electrode 8 side, the matching circuit 25 is removed from the plasma chamber CN at the measuring point PR'.

Moreover, in addition to the plasma processing apparatus using the parallel plate type electrodes 4 and 8, the present invention can be applied to an inductive coupled plasma (ICP) excitation type plasma processing apparatus, a radial line slot antenna (RLSA) type plasma processing apparatus, and a reactive ion etching (RIE) type processing apparatus.

Fourth Embodiment

A performance management system for a plasma processing apparatus in accordance with a fourth embodiment will now be described with reference to the drawings.

Figure 17:
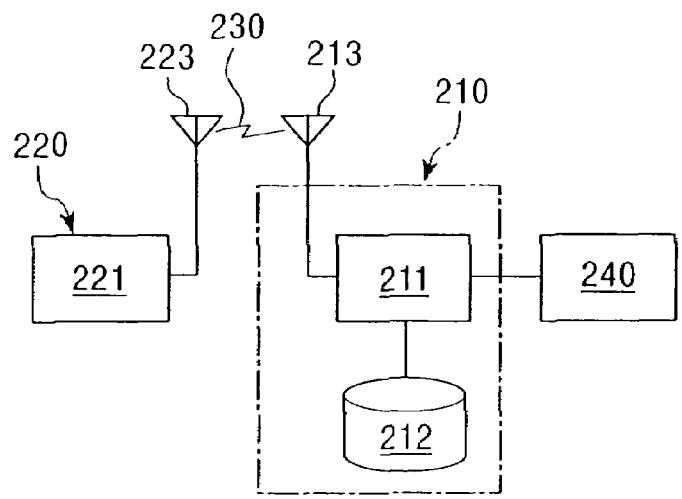
FIG. 17 is a block diagram of a performance management system for a plasma processing system in accordance with a fourth embodiment of the present invention.
Figure 18:
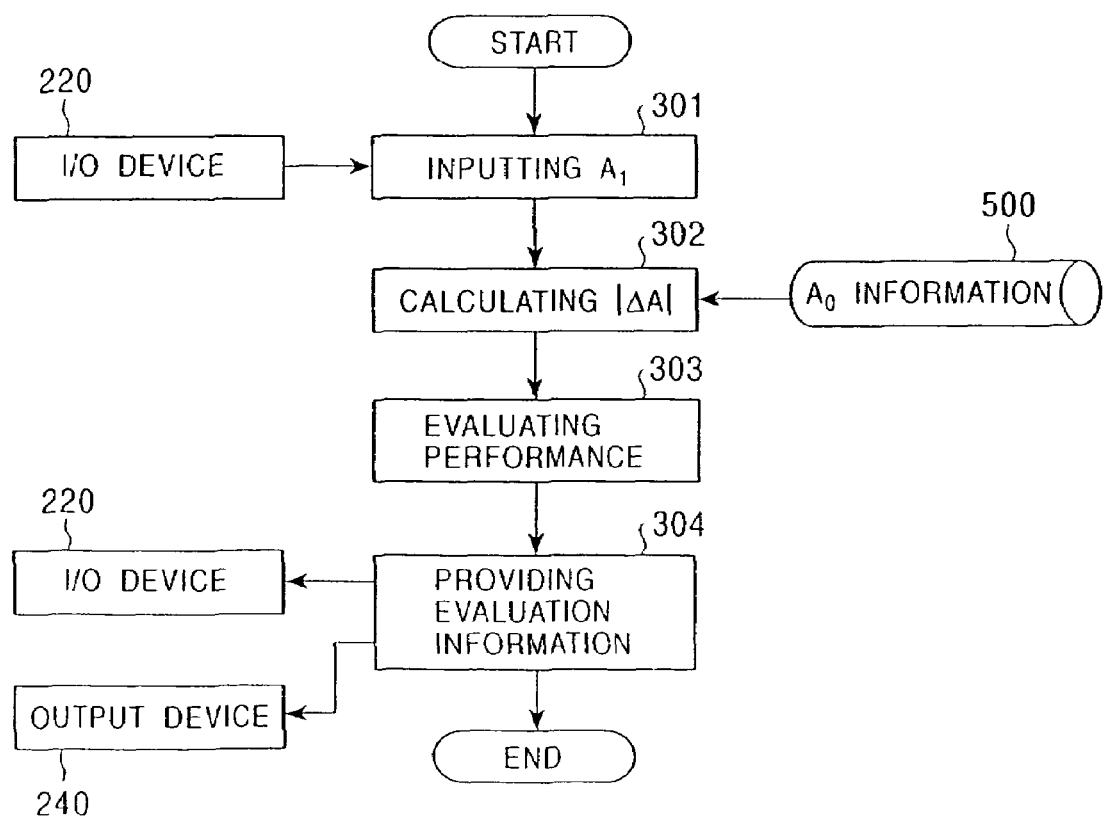
FIG. 18 is a flowchart illustrating a method for providing evaluation information which is prepared by the performance management system shown in FIG. 17.

FIG. 17 is a block diagram of a performance management system for a plasma processing system of this embodiment, and FIG. 18 is a flowchart illustrating a method for providing evaluation information which is prepared by this performance management system.

The performance management system shown in FIG. 17 includes a server 210, a customer I/O device 220, a communication line 230 for linking the server 210 and the customer I/O device 220, and an output device 240 at a delivery site, the output device 240 being linked to the server 210.

The server 210 is controlled at a delivery site, for example, by a manufacturer of the plasma processing apparatus, a distributor, or a maintenance company. Thus, the server 210 is preferably placed at the delivery site. The server 210 is preferably provided with a high-speed computer for simultaneously providing services to a plurality of customer I/O devices 220 and a high-capacity memory unit for storing information regarding a variety of services and plasma processing apparatuses at customer sites. Examples of such machines are large computers and high-performance workstations.

The server 210 includes a computer 211, a memory unit 212 linked to the computer 211, and a transmitter/receiver 213 linked to the communication line 230. The output device 240 has an output device 240 at the delivery site.

The customer I/O device 220 at the customer site is used by the customer and a maintenance engineer visiting the customer. The customer I/O device 220 is placed at the customer site or is brought to the customer site. Any type of the customer I/O device 220 may be used without limitation as long as the device can perform transmitting/receiving of signals to/from the server 210 via the communication line 230. Examples of such devices are personal computers, dedicated terminals, and telephones.

The customer I/O device 220 includes a body 221 and a transmitter/receiver 223 linked to the communication line 230.

The communication line 230 may be of any form which can perform transmitting/receiving of signals between the server 210 and the customer I/O device 220 which are distant from each other. Examples of communication lines 230 are communication media, such as cables, optical fiber lines, satellite circuits, telephone lines, and the Internet.

Referring to FIG. 17, the operation of this embodiment will now be described according to the flowchart shown in FIG. 18. A user, for example, a customer at a delivery site or a maintenance engineer who visits the customer, of the performance management system inputs observed radiofrequency characteristics $A_1$ of plasma processing chambers of the plasma processing apparatus at the customer site through the customer I/O device 220 (Step 301). The input radiofrequency characteristics $A_1$ are transmitted to the server 210 via the communication line 230.

The server 210 calls up data 500 of the particular radiofrequency characteristic $A_0$ which is stored in the memory unit 212 to calculate the absolute value $|\Delta A|$ of the difference between $A_0$ and $A_1$ (Step 302).

The particular radiofrequency characteristic $A_0$ is determined at the delivery site before disassembling the plasma processing apparatus for transporting to the customer. For example, the radiofrequency characteristic $A_0$ is the first series resonant frequency $f_{00}$ satisfying equation (1) described above.

The server 210 compares $|\Delta A|$ with $A_0$ to evaluate the performance of the plasma processing apparatus. When $|\Delta A|$ is less than 10% of $A_0$, the server 210 determines that the plasma processing apparatus maintains a required level of performance. When $|\Delta A|$ is not less than 10% of $A_0$, the server 210 determines that the plasma processing apparatus does not maintain the required level of performance (Step 303).

Next, the server 210 provides the results of the performance evaluation to both the customer I/O device 220 and the output device 240 at the delivery site (Step 304).

The server 210 transmits print, display, or sound alarm signals to the customer I/O device 220. When the server 210 determines that the required level of performance is maintained, the server 210 outputs, for example, a message "this apparatus still exhibits a required level of performance sufficient for practical use." When the server 210 determines that the required level of performance is not maintained, the server 210 outputs, for example, a message "Please adjust this apparatus according to the manual included because the performance may not be maintained at the required level." These messages may be output for the customer or the maintenance engineer by printing, by display on a screen, or by voice.

Also, the server 210 transmits print, display, or sound alarm signals to the output device 240 when the server 210 determines that the required level of performance is not maintained. The output device 240 outputs a maintenance command by printing or displaying a message or providing a signal or alarm. It is preferable that the identification number of the plasma processing chamber be received from the customer I/O device 220 and be output from the output device 240 so that the apparatus requiring the maintenance can be specified at the delivery site. Alternatively, the identification number or phone number of the customer I/O device 220 may be used to determine the identification number of the plasma processing chamber and to output the results from the output device 240.

As a result, the customer or the maintenance engineer who visits the customer can evaluate the plasma processing apparatus without actually inspecting the substrates used for layer deposition in this apparatus.

Moreover, the plasma processing apparatus can be directly evaluated in situ in a short period of time, instead of a two-stage evaluation, i.e., processing of the substrates and confirmation and evaluation of the operation of the plasma processing apparatus based on the evaluation of the processed substrates. If an inspection process by layer deposition on the substrates is employed in a plasma processing apparatus having a plurality of plasma processing chambers, these plasma processing chambers can be simultaneously evaluated.

Since no substrate with deposited layers is used for checking, the performance management system for the plasma processing apparatus does not require shutdown of the production line for several days to several weeks, thereby improving productivity of the production line. The production line, therefore, has high productivity with reduced expenses for substrates used in the inspection, processing of these substrates, and labor during the inspection operations.

The manufacturer and so on at the delivery site can immediately identify the problems of the plasma processing apparatus at the customer site by the maintenance command, thus providing a satisfactory repair service.

When the server 210 provides the evaluation information to both the customer I/O device 220 and the output device 240 at the delivery site as in this embodiment, the predetermined value provided to the customer I/O device 220 may be different from the predetermined value provided to the output device 240. For example, the predetermined value for the customer I/O device 220 is set at 10% of the radiofrequency characteristic $A_0$ to transmit a signal indicating that the required level of performance is not maintained when the observed value is 10% or more. On the other hand, the predetermined value for the output device 240 is set at 3% of the radiofrequency characteristic $A_0$ to output a maintenance command when the observed value is 3% or more. By outputting the maintenance command based on such an evaluation standard at the delivery site which is more severe than that at the customer site, the maintenance engineer can provide maintenance service before the performance of the plasma processing apparatus significantly varies, namely, preventive service.

Fifth Embodiment

Another performance management system for a plasma processing apparatus in accordance with a fifth embodiment will now be described with reference to the drawings.

Figure 19:
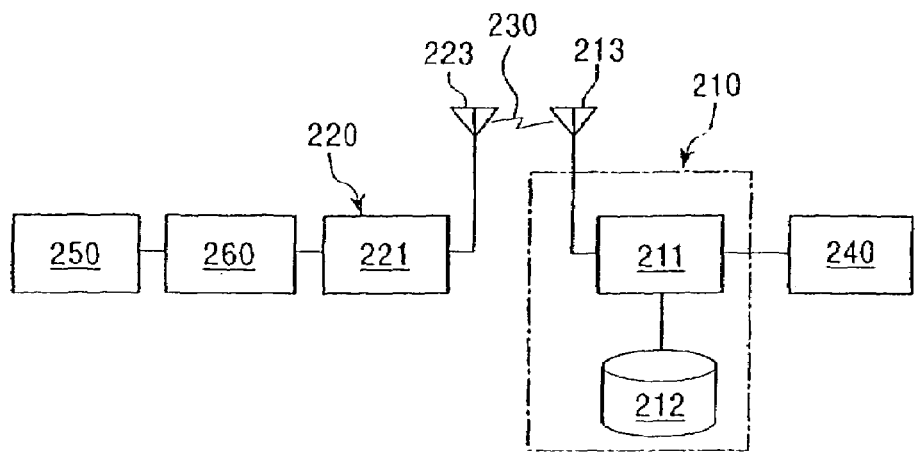
FIG. 19 is a block diagram of a performance management system for a plasma processing apparatus in accordance with a fifth embodiment of the present invention.
Figure 20:
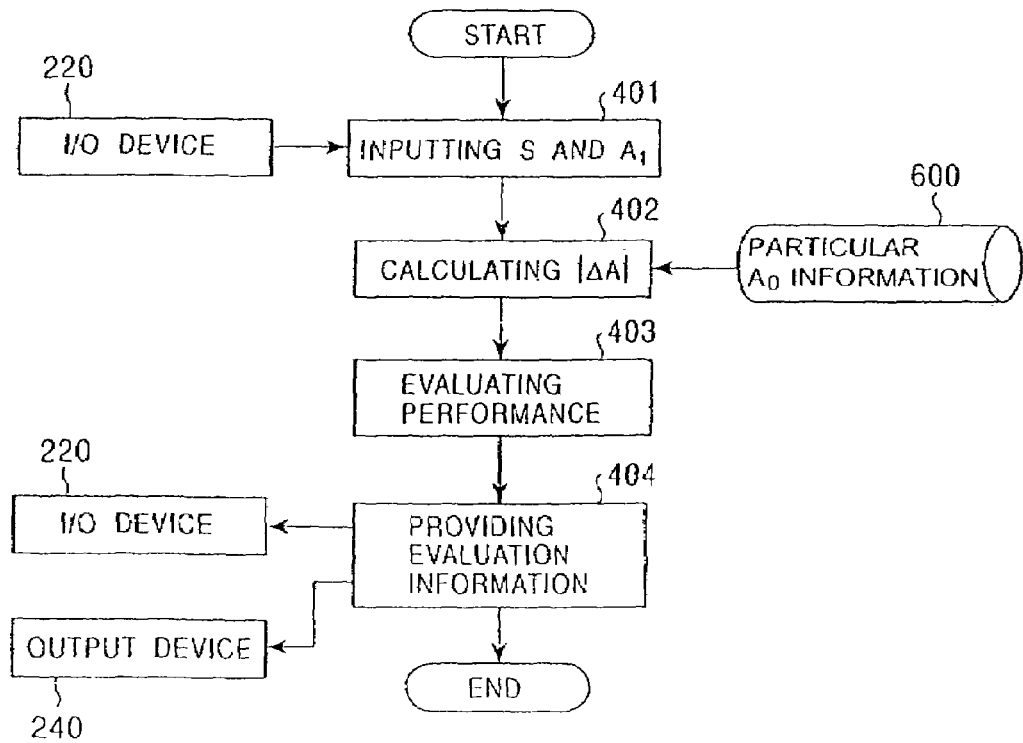
FIG. 20 is a flowchart illustrating a method for providing evaluation information which is prepared by the performance management system shown in FIG. 19.

FIG. 19 is a block diagram of a performance management system for a plasma processing apparatus of this embodiment, and FIG. 20 is a flowchart illustrating a method for providing evaluation information which is prepared by this performance management system. In these drawings, the components shown in FIGS. 17 and 18 are referred to with the same reference numerals and the description thereof is omitted.

The performance management system shown in FIG. 19 includes a server 210, a customer I/O device 220, a communication line 230 linking the server 210 and the customer I/O device 220, and an output device 240 at a delivery site, the output device 240 being linked to the server 210. The performance management system further includes an impedance meter 260.

In this embodiment, the output terminal of the impedance meter 260 is connected to the customer I/O device 220 so that the radiofrequency characteristics of the plasma processing apparatus 250 are measured by the impedance meter 260 and are directly transmitted to the server 210 via the customer I/O device 220 and the communication line 230 without input by an operator. The customer I/O device 220 is programmed so as to read the measured impedance in response to the input of an identification number S of a plasma processing chamber.

The procedure in this embodiment will now be described based on the flowchart shown in FIG. 20, with reference to FIG. 19.

A user of this performance management system, for example, a customer or a maintenance engineer who visits the customer, connects the impedance meter 260 to the customer I/O device 220, and inputs the identification number S of the plasma processing chamber from the customer I/O device 220. The radiofrequency characteristic $A_1$ of the plasma processing chamber is automatically input into the customer I/O device 220 from the impedance meter 260 according to the program stored in the customer I/O device 220 (Step 401).

The identification number S and the radiofrequency characteristic $A_1$ are transmitted to the server 210 via the communication line 230.

The server 210 then calls up information 500, stored in a memory device 212, on the particular radiofrequency characteristic $A_0$ of the plasma processing chamber corresponding to the identification number S, and calculates the absolute value $|\Delta A|$ of the difference between $A_0$ and $A_1$ (Step 402).

Herein, the particular radiofrequency characteristics $A_0$ of the plasma processing chambers are designed and measured when these chambers are manufactured, and are stored in connection with the respective identification numbers S in the memory unit 212.

The server 210 compares $|\Delta A|$ with $A_0$ to evaluate the performance of the plasma processing apparatus. When $|\Delta A|$ is less than 10% of $A_0$, the server 210 determines that the plasma processing apparatus maintains a required level of performance. When $|\neq A|$ is not less than 10% of $A_0$, the server 210 determines that the plasma processing apparatus does not maintain the required level of performance (Step 403).

Next, the server 210 provides the results of the performance evaluation to both the customer I/O device 220 and the output device 240 at the delivery site (Step 404).

The server 210 transmits print, display or sound alarm signals to the customer I/O device 220. When the server 210 determines that the required level of performance is maintained, the server 210 outputs, for example, a message "this apparatus still exhibits a required level of performance sufficient for practical use." When the server 210 determines that the required level of performance is not maintained, the server 210 outputs, for example, a message "Please adjust this apparatus according to the manual included because the performance may not be maintained at the required level." These messages may be output for the customer or the maintenance engineer by printing, by display on a screen, or by voice.

Also, the server 210 transmits print, display, or sound alarm signals to the output device 240 when the server 210 determines that the required level of performance is not maintained. The output device 240 outputs a maintenance command by printing or displaying a message or providing a signal or alarm. The server 210 also provides the identification number S of the plasma processing chamber to the output device 240 so that the apparatus requiring the maintenance can be specified at the delivery site.

The performance management system for the plasma processing apparatus of this embodiment exhibits the same advantages as those in the fourth embodiment. Since the observed values are stored in connection with the identification numbers S of the plasma processing chambers, the plasma processing chambers can be more precisely controlled. The manufacturer and so on at the delivery site can immediately specify the relevant plasma processing apparatus or the plasma processing chamber.

In a plasma processing apparatus or system having a plurality of plasma processing chambers, it is preferable that the same radiofrequency characteristics be set for these plasma processing chambers such that substantially the same film characteristics are achieved using the same process recipe under the same operating conditions. Although the plasma processing chambers preferably have the same particular radiofrequency characteristic $A_0$, these plasma processing chambers may have different radiofrequency characteristics $A_0$ depending on various factors at the customer site etc.

Sixth Embodiment

Another performance management system for a plasma processing apparatus in accordance with a sixth embodiment will now be described with reference to the drawings.

The system configuration of the performance management system in this embodiment is also shown in FIG. 19 for the fifth embodiment. The configuration in this embodiment differs from that in the fifth embodiment in that the server 210 stores maintenance engineer information 601 which includes performance levels, such as fault levels, which correspond to predetermined ranges, and maintenance engineer's names which are registered in response to the fault levels. Table 1 shows an example of the maintenance engineer information 601.

TABLE 1

Maintenance Engineer Information

| $|\Delta A|$ | Performance Level | Maintenance Engineer |
|---|---|---|
| $|\Delta A| \geq 100\%$ | Fault level 1 | Engineer A, Engineer B |
| $100\% > |\Delta A| \geq 50\%$ | Fault level 2 | Engineer C, Engineer D |
| $50\% > |\Delta A| \geq 10\%$ | Fault level 3 | Engineer E, Engineer F |
| $10\% > |\Delta A| \geq 3\%$ | Good | Engineer G |
| $3\% > |\Delta A|$ | Best | — |

Figure 21:
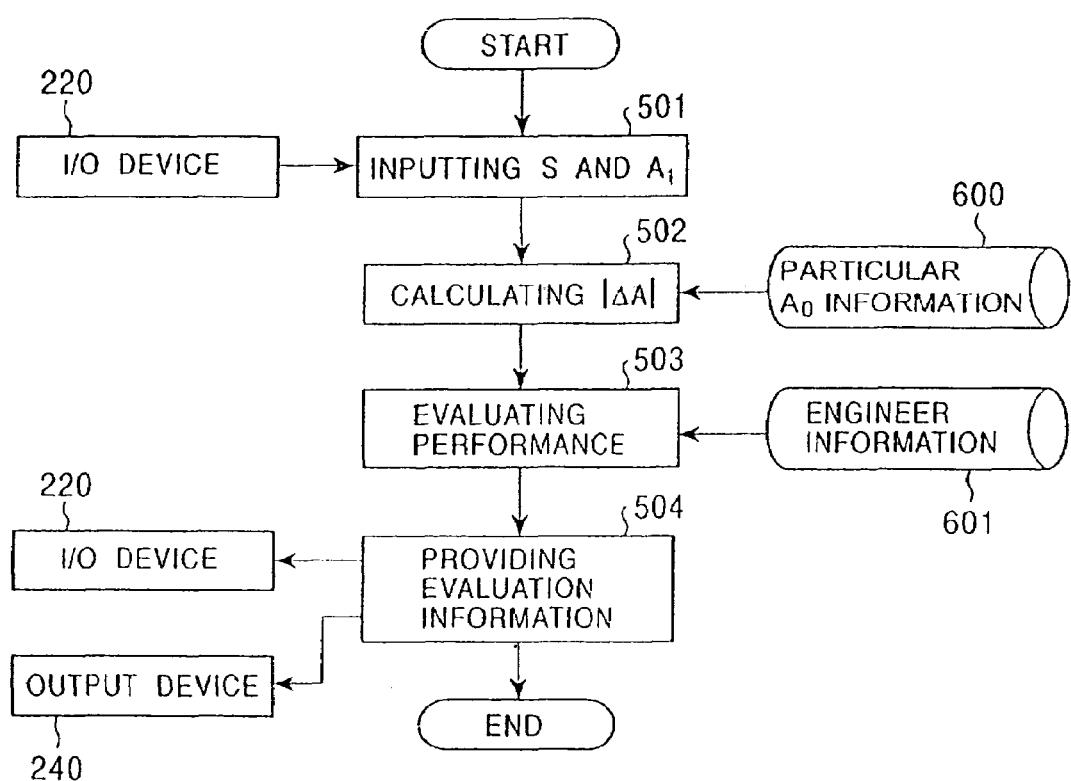
FIG. 21 is a flowchart illustrating another method for providing evaluation information which is prepared by the performance management system in accordance with the fifth embodiment.
Figure 22:
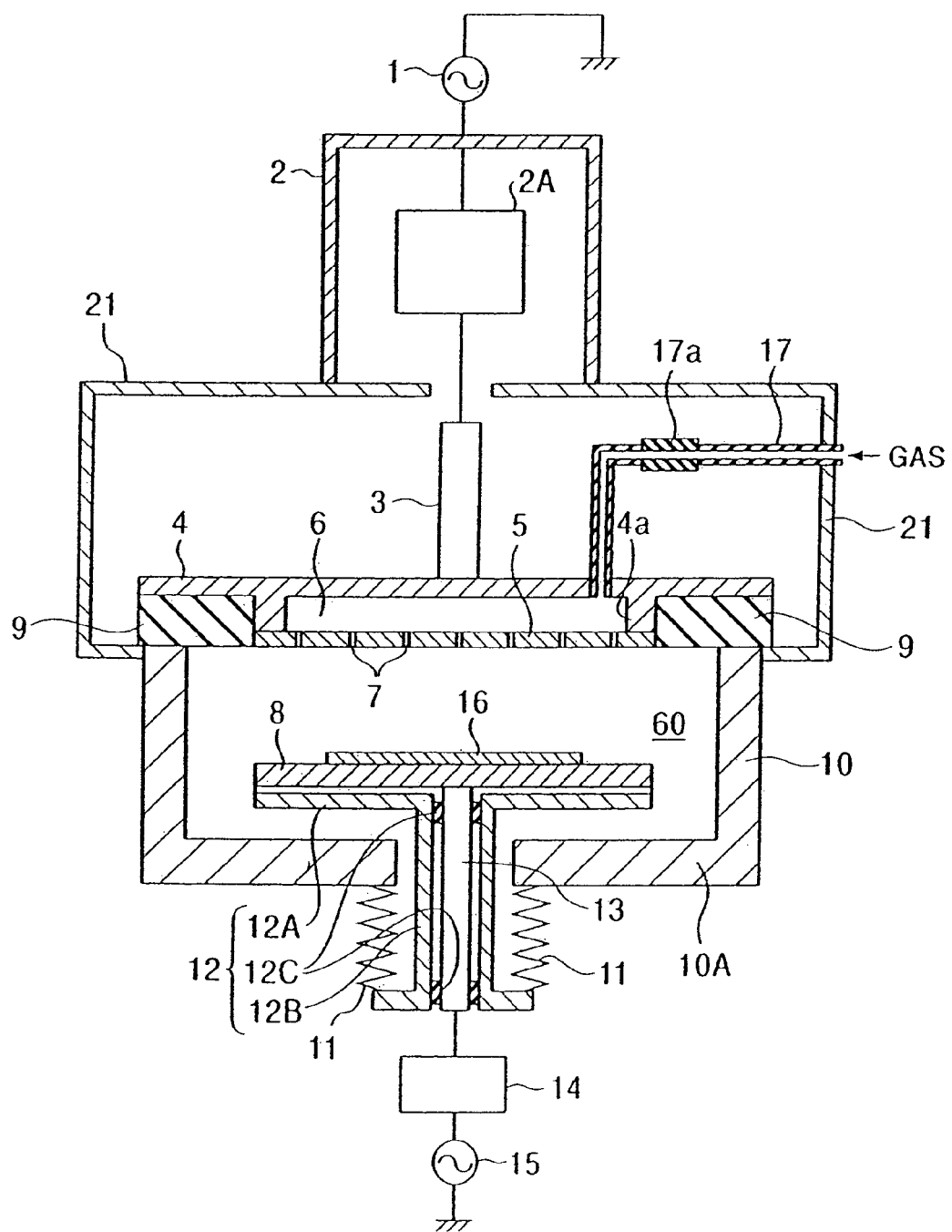
FIG. 22 is a schematic view of a conventional plasma processing apparatus.
Figure 23:
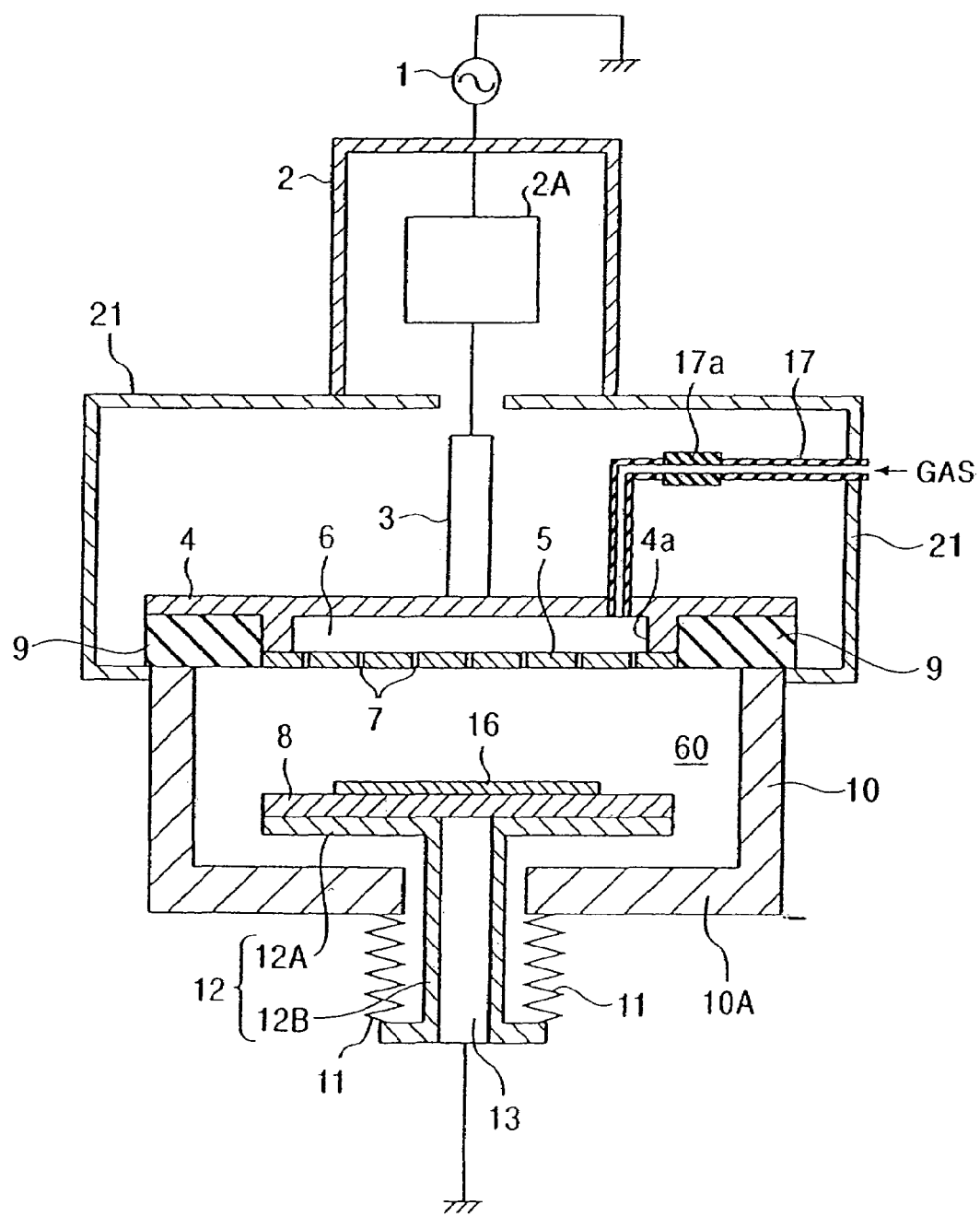
FIG. 23 is a schematic view of another conventional plasma processing apparatus.

The procedure in this embodiment will now be described based on the flowchart shown in FIG. 21, with reference to FIG. 19. The description regarding Steps 501 and 502 in the flowchart shown in FIG. 21 are omitted because these steps are the same as Steps 401 and 402, respectively, in FIG. 20.

The server 210 calculates $|\Delta A|$ in Step 502 and evaluates the performance level of the plasma processing apparatus with reference to the engineer information 601. When the server 210 determines that the apparatus is in any one of fault levels 1 to 3, the server 210 calls up the maintenance engineer's names contained in the engineer information 601 (Step 503).

The server 210 provides the resulting performance level to both the customer I/O device 220 and the output device 240 at the delivery site (Step 404).

In detail, the server 210 transmits the performance level (fault level) in the form of print or display on a screen or as voice signals.

When the performance level is at the best, the customer I/O device 220 outputs a message "this apparatus still exhibits a required level of performance sufficient for practical use." When the performance level is good, the customer I/O device 220 outputs a message "although this apparatus still maintains the required level of performance, you should inspect the apparatus soon." When the performance level is any one of fault levels 1 to 3, the customer I/O device 220 outputs a message "this apparatus is in fault level 2. Please request adjustment to your maintenance engineer to restore the performance to the original state".

At the delivery site, the server 210 outputs the performance level, the maintenance engineer's names corresponding to the performance level, and a maintenance command.

According to the performance management system for the plasma processing apparatus of this embodiment, the maintenance command is output with the fault level and the maintenance engineer's names corresponding to the fault level at the delivery site.

Thus, the fault level of the plasma processing apparatus at a distant place can be identified at the delivery site in order to send a maintenance engineer having skill which is suitable for the fault level, thus providing rapid and adequate maintenance services with an efficient engineer distribution. Accordingly, the maintenance system after installation becomes rationalized.

Seventh Embodiment

Next, a performance validation system of a plasma processing apparatus according to an embodiment of the present invention will be described below with reference to the drawings. In the following description, a person who distributes and maintains the plasma processing apparatus is referred to as a "maintenance engineer".

Figure 24:
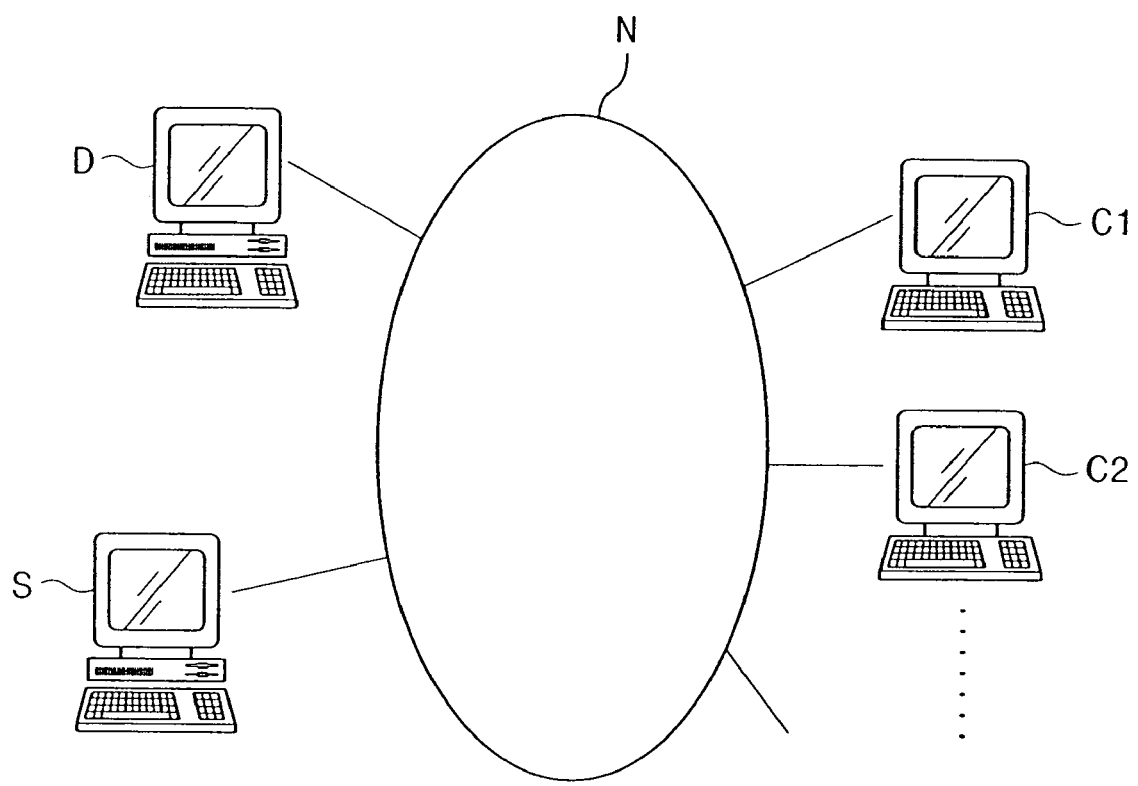
FIG. 24 is a schematic view illustrating a performance validation system of a plasma processing apparatus in accordance with the present invention.

FIG. 24 is a diagram illustrating the configuration of the performance validation system of the plasma processing apparatus according to the present invention.

Referring to FIG. 24, the performance validation system comprises a customer terminal (client terminal) C1, an engineer terminal (client terminal) C2, a server computer (hereinafter simply referred to as "server") S which functions as operational performance information providing means, a database computer (hereinafter simply referred to as "database") D which stores information, and a public line N. The customer terminal C1 and the engineer terminal C2, the server S, and the database D are linked to one another via the public line N.

The terminals C1 and C2 have a function to communicate with the server S using a widespread Internet communication protocol, such as TCP/IP or the like. The customer terminal C1 serves as a customer-side information terminal for validating, via the public line N, the state of the performance of the plasma chamber CN which the customer purchased from the maintenance engineer. The customer terminal C1 also has a function to view an information web page which is a "plasma chamber CN performance information page" stored in the server S. The engineer terminal C2 which allows the maintenance engineer to upload "first series resonant frequency $f_0$ information" which partially constitutes the "performance information" and to receive e-mail sent from the customer through the customer terminal C1.

Herein, the structure of the plasma processing apparatus or the plasma processing system to be evaluated is identical to any one of the structures according to the above-described first to third embodiment. The structure of the plasma processing apparatus including the number of chambers can be set as desired.

Communication with the server S is achieved through a modem when the public line N is an analog line or through a dedicated terminal adapter or the like when the public line N is a digital line such as an integrated services digital network (ISDN).

The server S is a computer that provides performance information. The server S transmits the performance information to the customer terminal C1 using an Internet communication protocol upon request from the customer terminal C1 requesting the display of the information. Herein, each of the customers who purchased the plasma chambers receives a "browsing password" for viewing the performance information before the plasma processing apparatus is delivered to the customer from the maintenance engineer. The password is required when the customer wishes to view operation and maintenance information which is part of the performance information, and the server S sends the operation and maintenance information to the customer terminal C1 only when a registered browsing password is provided.

The above-described "performance information", details of which will be described in a later section, comprises information regarding models of the plasma processing chambers of the plasma processing apparatus or plasma processing system available from the maintenance engineer, information regarding quality and performance of each model in the form of specifications, information regarding parameters indicative of quality and performance of specific apparatuses delivered to customers, and information regarding parameters and maintenance history.

The latter two types of information among the information described above, i.e., the information regarding quality and performance of specific apparatuses and the information regarding parameters and maintenance history, are accessible only from the customers provided with "browsing passwords".

The performance information described above is provided in the form of "operation and maintenance information" and "standard performance information". The operation and maintenance information is a type of information provided from the maintenance engineer or the customer to the server S to indicate the actual state of operation and maintenance. The standard performance information is a type of information stored in the database D and serves as a catalog accessible from potential customers. The "standard performance information" is an objective description regarding the performance of the plasma processing performed in the plasma chamber and allows prediction of the deposition state when applied to deposition processes such as plasma-enhanced CVD and sputtering processes.

In this embodiment, the "standard performance information" is stored in the database D.

Upon the request from the customer terminal C1 to view the "performance information", the server S retrieves the requested "standard performance information" from the database D and sends the information to the customer terminal C1 of the customer in the form of a performance information page. When a customer sends a request to view the "performance information" along with the browsing password of the customer, the server S retrieves the requested "standard performance information" from the database D as described above, composes the "performance information" by combining the retrieved "standard performance information" and the "operation and maintenance information" provided from the maintenance engineer through the engineer terminal C2, and sends the "performance information page" to the customer terminal C1 of the customer.

The database D stores the "standard performance information", which is part of the "performance information", according to the models of the plasma chambers of the plasma processing apparatus or plasma processing system, reads out the "standard performance information" in response to a search request sent from the server S, and transmits the retrieved information to the server S. Although only one server S is illustrated in FIG. 24, a plurality of servers are provided in this embodiment. In this respect, it is useful to store general purpose "standard performance information" in the database D instead of these servers in order for the information to be shared among the plurality of servers managed by maintenance engineers from different locations.

Figure 25:
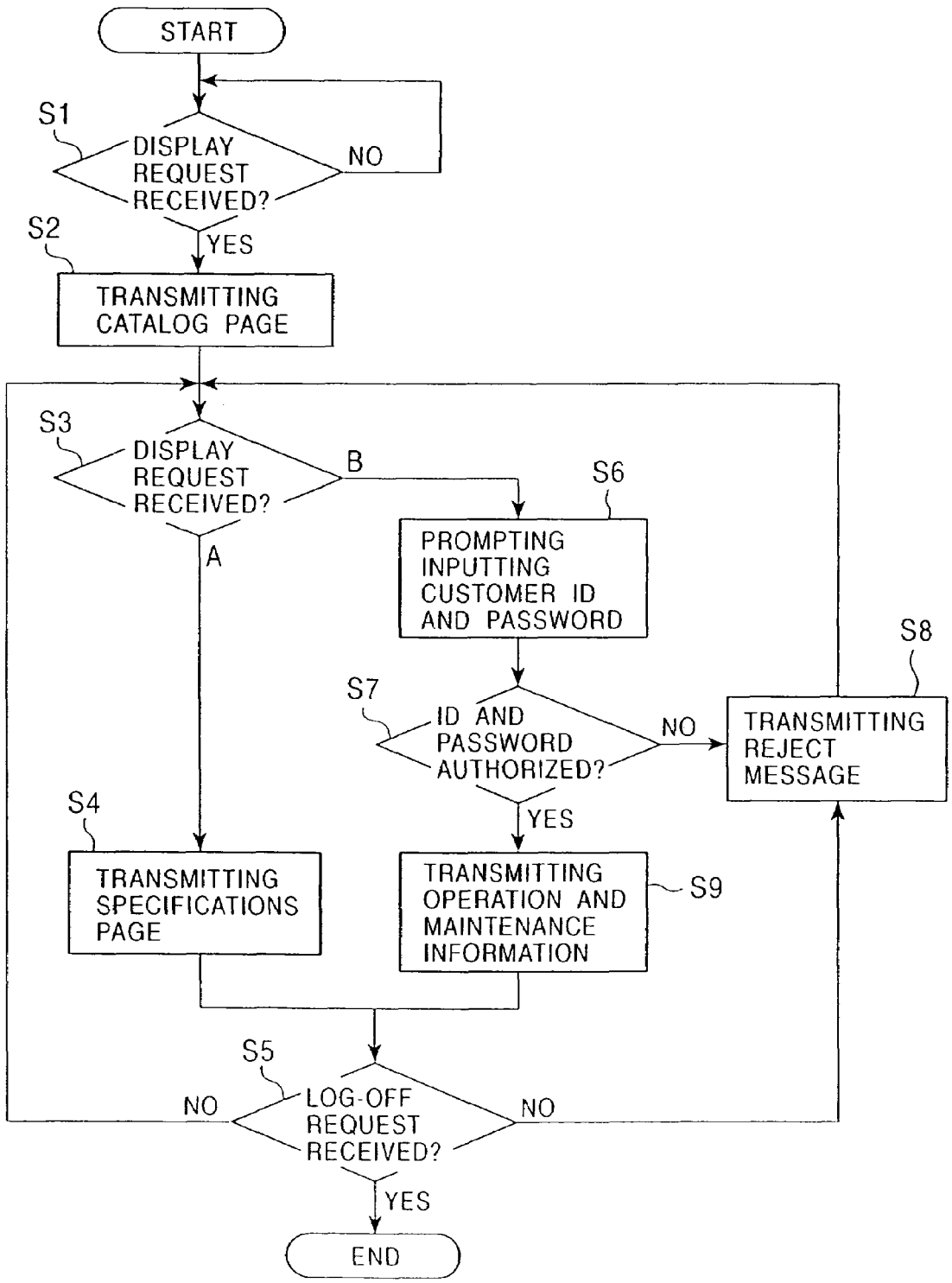
FIG. 25 is a flowchart illustrating processing for providing performance information from a server in the perfor-mance validation system of the plasma processing apparatus in accordance with the present invention.

Next, an operation of the performance validation system for the plasma processing apparatus or the plasma processing system having the above-described structure will be explained in detail with reference to the flowchart shown in FIG. 25. The flowchart illustrates the process of providing the "performance information" executed at the server S.

Generally, the maintenance engineer presents, as a reference for purchase, the "standard performance information" contained in the "performance information" of a model of the plasma chamber the maintenance engineer is attempting to sell to the customer. The customer is able to understand the performance of the plasma chamber and possible plasma processes using the plasma chamber through this "standard performance information".

The customer who purchased the plasma processing apparatus of the plasma processing system are provided with the "standard operation information", which serves as the reference during the use of the plasma chambers, and the "operation and maintenance information", which serves as the parameters of the operation. The customer, i.e., the user of the plasma chambers, may validate the operation of his/her plasma chambers by comparing the "standard performance information" and the "operation and maintenance information" so as to be informed of the state of the plasma processing and to determine whether it is necessary to perform maintenance.

For example, a customer who is considering purchasing a new plasma chamber from the maintenance engineer may access the server S to easily confirm the "standard performance information" of the plasma chamber the customer is intending to purchase as follows.

The customer who wishes to view the "performance information" first sends from the customer terminal C1 a request for access to the server S based on an IP address of the server S set in advance.

Upon receiving the request for access (Step S1), the server S transfers a main page CP to the customer terminal C1 (Step S2).

Figure 26:
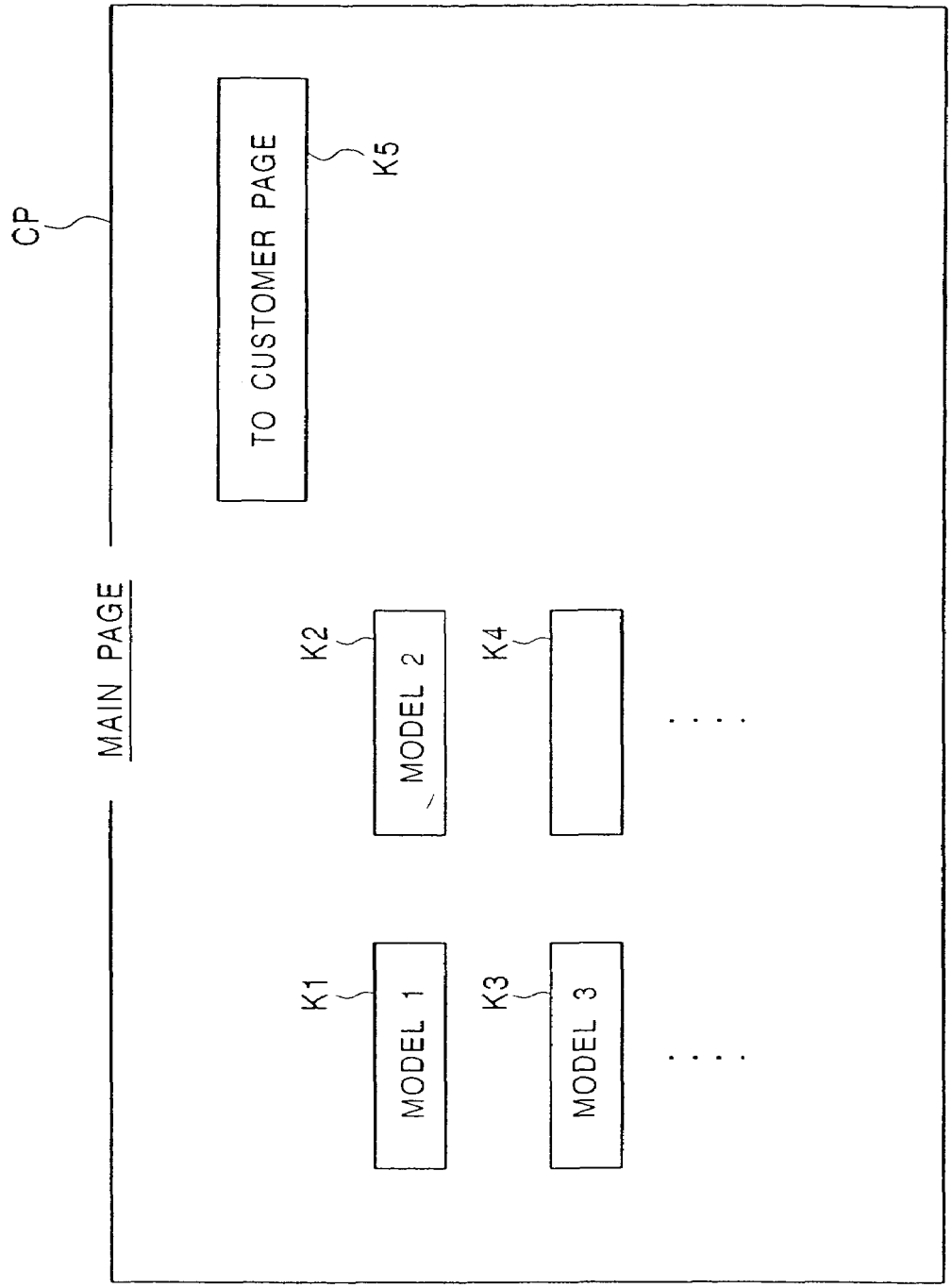
FIG. 26 shows an output form of a main page CP in accordance with the performance validation system of the plasma processing apparatus of the present invention.

FIG. 26 shows an example of the main page CP sent from the server S to the customer terminal C1 through the steps described above. The main page CP comprises model selection buttons K1 to K4 for displaying the "standard performance information" contained in the "performance information" according to models available from the maintenance engineer and a user button K5 for requesting the display of a customer page exclusive to the customer to whom the maintenance engineer delivered the plasma chamber.

For example, a customer may select one of the model selection buttons K1 to K4 using a pointing device (for example, a mouse) of the customer terminal C1 so as to specify which model of the plasma chamber the customer desires to obtain the information about. Such a selection is regarded as the request for accessing the "standard performance information" among the "performance information", and a request to that effect is sent to the server S.

Upon receipt of the request (Step S3), the server S sends the customer terminal C1 a subpage containing the requested information on the selected model. That is, when display of "standard performance information" is requested by specifying a model (A in FIG. 25), the server S retrieves data such as "vacuum performance", "gas charge/discharge performance", "temperature performance", "electrical performance of the plasma processing chamber", and the like, and data regarding variations in these parameters effected in the plasma processing apparatus or plasma processing system from the database D and sends the customer terminal C1 a specifications page CP1 shown in FIG. 27 containing these data (Step S4).

Figure 27:
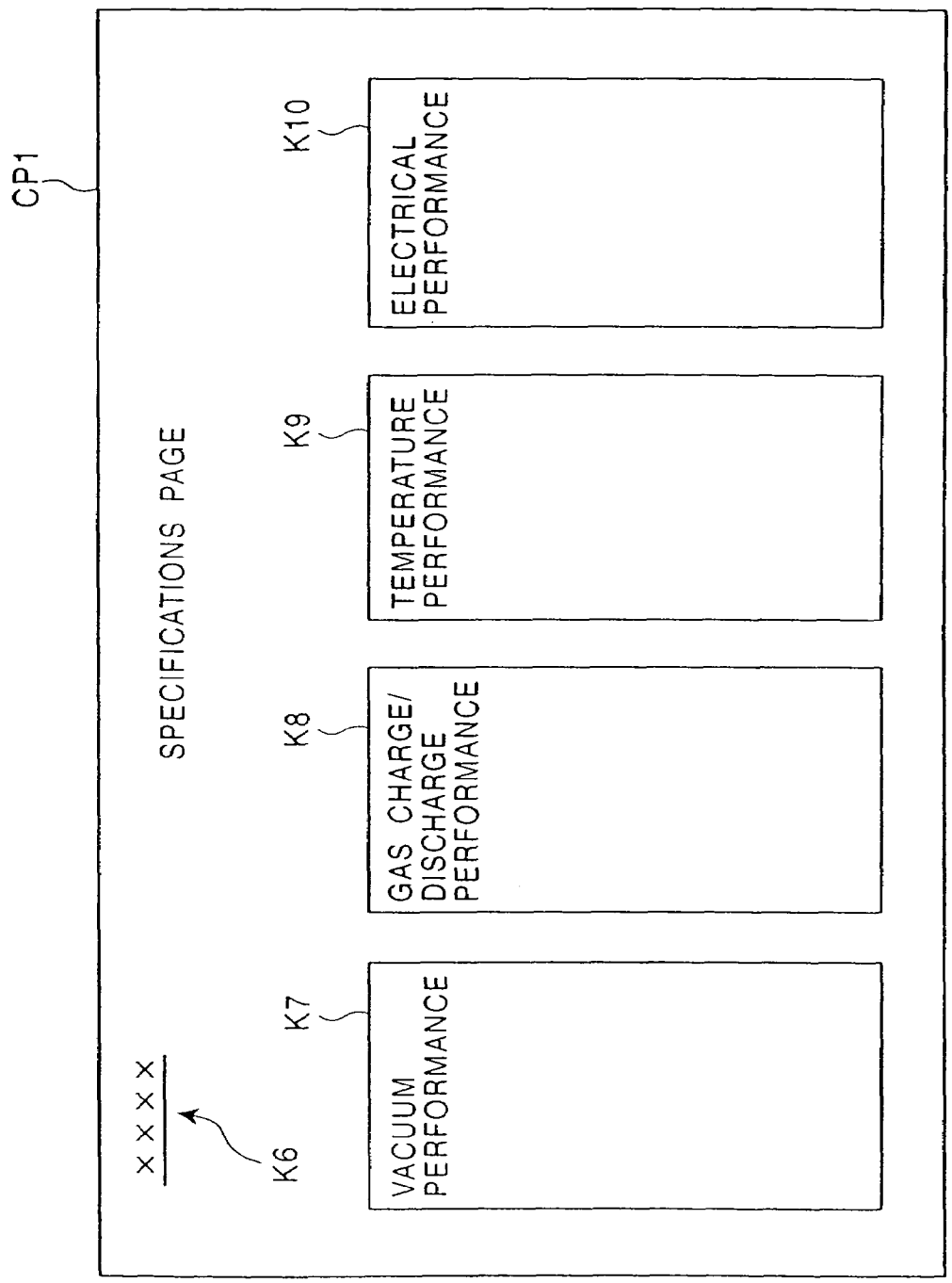
FIG. 27 shows an output form of a subpage CP1 in accordance with the performance validation system of the plasma processing apparatus of the present invention.

As shown in FIG. 27, the specifications page CP1 comprises an apparatus model section K6 indicating the selected model of the apparatus, a vacuum performance section K7, a gas charge/discharge performance section K8, a temperature performance section K9, and an electrical performance section K10 indicating the electrical performance of the plasma processing chamber. These constitute the "standard performance information" of the selected model and each contains the following descriptions.

The vacuum performance section K7 contains below:
ultimate degree of vacuum: $1 \times 10^{-4}$ Pa or less; and
operational pressure: 30 to 300 Pa.

The gas supply/discharge performance section K8 contains below:

| maximum gas flow rates: | |
|---|---|
| $SiH_4$ | 100 SCCM, |
| $NH_3$ | 500 SCCM, |
| $N_2$ | 2,000 SCCM; and | discharge property: 20 Pa or less at a flow of 500 SCCM.
The temperature performance section K9 contains below:
heater temperature: 200 to 350±10° C.; and
chamber temperature: 60 to 80±2.0° C.

Herein, the SCCM (standard cubic centimeters per minute) values represent the corrected gas flow rates at standard conditions (0° C. and 1,013 hPa) and the unit thereof is cm³/min.

A variation in each of the above-described parameters P among the plurality of plasma chambers constituting the plasma processing apparatus or the plasma processing system is to be defined by relationship (10B) below:

$$(P_{max}-P_{min})/(P_{max}+P_{min}) \quad (10B)$$

wherein $P_{max}$ represents the maximum value of a particular parameter among the plurality of the plasma processing chambers and $P_{min}$ represents the minimum value of the particular parameter among the plurality of the plasma processing chambers. The upper limit of the variation in the plasma processing apparatus or system is displayed for each of the parameters.

In the electrical performance section K10, a value of the first series resonant frequency $f_0$ described in the first to third embodiment above and the relationship between the setting range of the first series resonant frequency $f_0$ and the power frequency $f_e$ are described. In addition to these, values such as resistance $R_e$ and reactance $X_e$ of the plasma chamber at the power frequency $f_e \propto$, plasma capacitance $C_0$ between the plasma excitation electrode 4 and the susceptor electrode 8, loss capacitance $C_x$ between the plasma excitation electrode 4 and each of the components which serve as ground potential of the plasma chamber, and the like are included in the description. Furthermore, the specification page CP1 includes a performance guarantee statement such as "we guarantee that each of the parameters is within the setting ranges described in this page upon the delivery of the plasma chamber".

In this manner, the overall radiofrequency electrical characteristics of the plasma chamber and the variation in the electrical characteristics of the plasma chambers can be presented to a potential purchaser as a novel reference which has never been considered before. The performance information can be printed out at the customer terminal C1 or the engineer terminal C2 to make a hard copy thereof so that the information can be presented in the form of a catalog or specifications describing the performance information containing the above-described detailed information. When settings of the first series resonant frequency $f_0$, resistance $R_e$, reactance $X_e$, capacitances $C_0$, $C_x$ and the like, and the performance guarantee statement are presented to a potential purchaser through a terminal such as customer terminal C1, through a catalog, or through a specification, the potential purchaser may judge the performance of the plasma chamber just as if he/she is examining electrical components and may then purchase the plasma chamber from the maintenance engineer based on that judgement.

After the server S completes the transmission of the above-described subpage to the customer terminal C1, the server S waits for the request to display another subpage if a log-off request from the customer terminal C1 is not received (Step S5). If a log-off request from the customer terminal C1 is received by the server S, the server S terminates the interaction with the customer terminal C1.

The customer who purchased and obtained the plasma chamber from the maintenance engineer can easily check the "performance information" of the specific plasma chambers of the plasma processing apparatus or system that the customer purchased, by accessing the server S as below.

When the customer and the maintenance engineer exchange a sales contract, a customer ID, which is unique to the individual customer and a "customer password (browsing password)" for accessing the "operation and maintenance information" of the plasma processing apparatus or system or the plasma chambers thereof are given to the individual customer by the maintenance engineer. The customer ID may be associated with the serial number of the purchased plasma processing apparatus or system or with the serial number of the plasma chambers constituting the plasma processing apparatus or system. The server S sends the "operation and maintenance information" to the customer terminal C1 only when the registered browsing password is provided.

A customer who wishes to access the information selects the user button K5 in the above-described main page CP to send the request for the display of a customer page to the server S.

Figure 28:
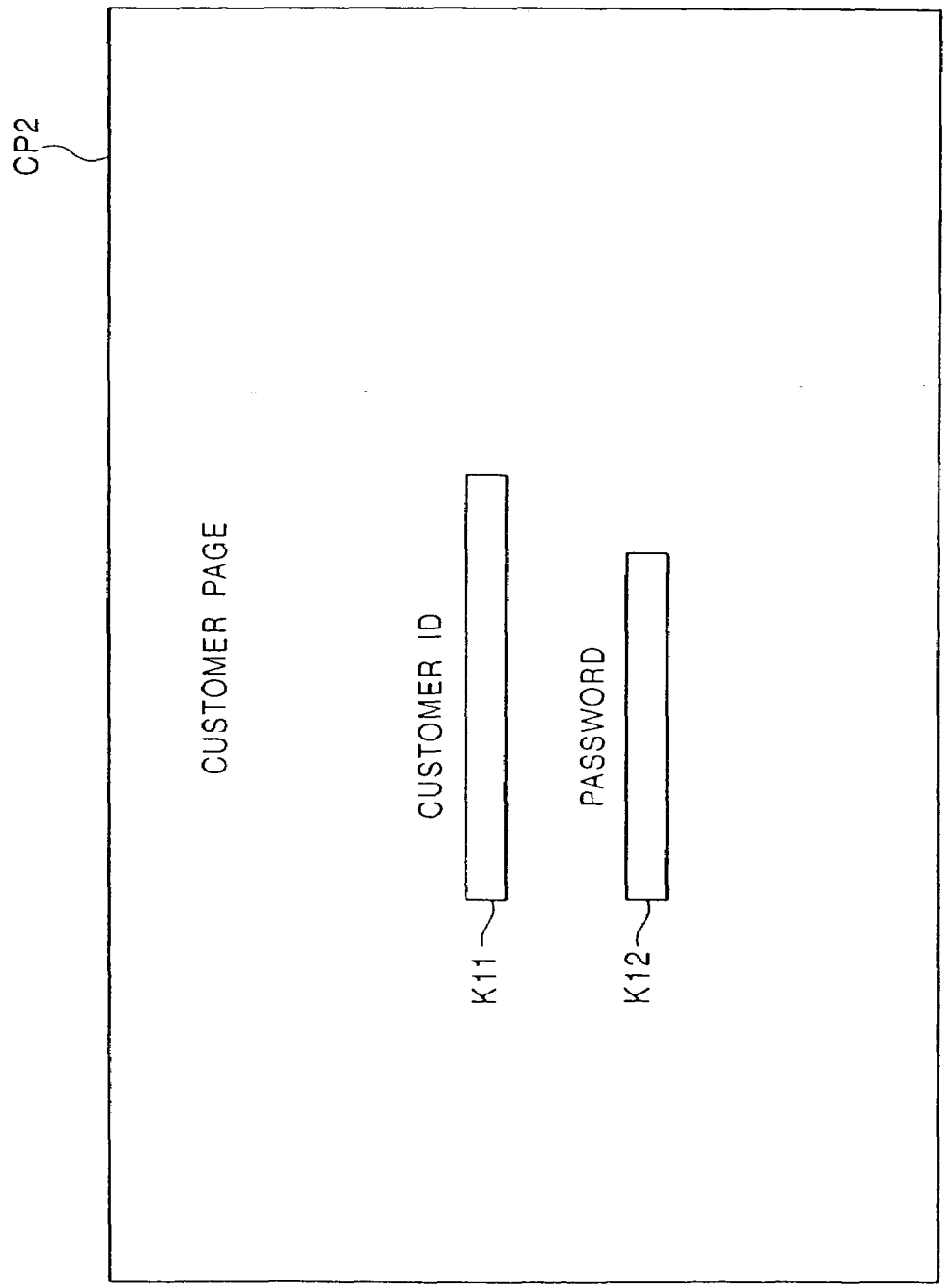
FIG. 28 shows an output form of a subpage CP2 in accordance with the performance validation system of the plasma processing apparatus of the present invention.

Upon receiving the request for the display (Step S3-B), the server S sends a subpage prompting the customer to input his/her "browsing password" (Step S6). FIG. 28 is an illustration of a customer page CP2. The customer page CP2 comprises a customer ID input field K11 and a password input field K12.

The customer page CP2 prompting the customer to input is displayed at the customer terminal C1. In response to the prompt, the customer enters the "browsing password" and the "customer ID", which are provided from the maintenance engineer, through the customer terminal C1 so as to allow the server S to identify the plasma processing apparatus or system and the plasma chambers thereof that the customer has purchased.

At this stage, the customer enters the customer ID into the customer ID input field K11 shown in FIG. 28 and the browsing password into the password input field K12 shown in FIG. 28. The server S sends the "operation and maintenance information" subpage previously associated with that "browsing password" to the customer terminal C1 (Step S9), only when the server S receives the registered "customer ID" and the "browsing password" from the customer terminal C1 (Step S7).

In other words, the "operation and maintenance information" is accessible only by the specific customer who exchanged the sales contract for the plasma processing apparatus or system, i.e., who is in possession of the registered "browsing password". A third party using the server S cannot access the "operation and maintenance information". Although the maintenance engineer often exchanges sales contracts with a plurality of customers simultaneously and delivers a plurality of plasma chambers CN for these customers simultaneously, each of the customers is provided with a browsing password" unique to the customer, unique to the plasma processing apparatus or system, or unique each one of the plasma chambers constituting the plasma processing apparatus or system and is capable of individually accessing the "operation and maintenance information" associated with the "browsing password" assigned to that customer.

Thus, it becomes possible to securely prevent confidential information regarding the purchase of the plasma chamber from being made available to other customers. Furthermore, the plasma processing apparatus, the plasma processing system, the plasma processing chambers thereof can be separately identified even when they are delivered simultaneously.

If the server S does not receive a registered "browsing password" (Step S7), a message refusing the access and prompting the customer to re-enter the "browsing password" is sent to the customer terminal C1 (Step S8). If the customer erroneously entered the "browsing password", the customer may take this opportunity to re-enter a correct password to access the "operation and maintenance information".

When the ID and the password are verified (Step S7), the server S retrieves data corresponding to the requested information from the database D and sends it to the customer terminal C1 in the form of a subpage. That is, when the server S receives a request from the customer terminal C1 requesting display of the "standard performance information" and the "operation and maintenance information" of the specific plasma processing apparatus or system and the plasma processing chambers thereof identified by the customer ID, data such as "vacuum performance", "gas charge/discharge performance", "electrical performance of the plasma processing chamber", and the like are retrieved from the database D by specifying the apparatus model, and a specification page (subpage) CP3 containing these data is sent to the customer terminal C1 (Step S9).

Figure 29:
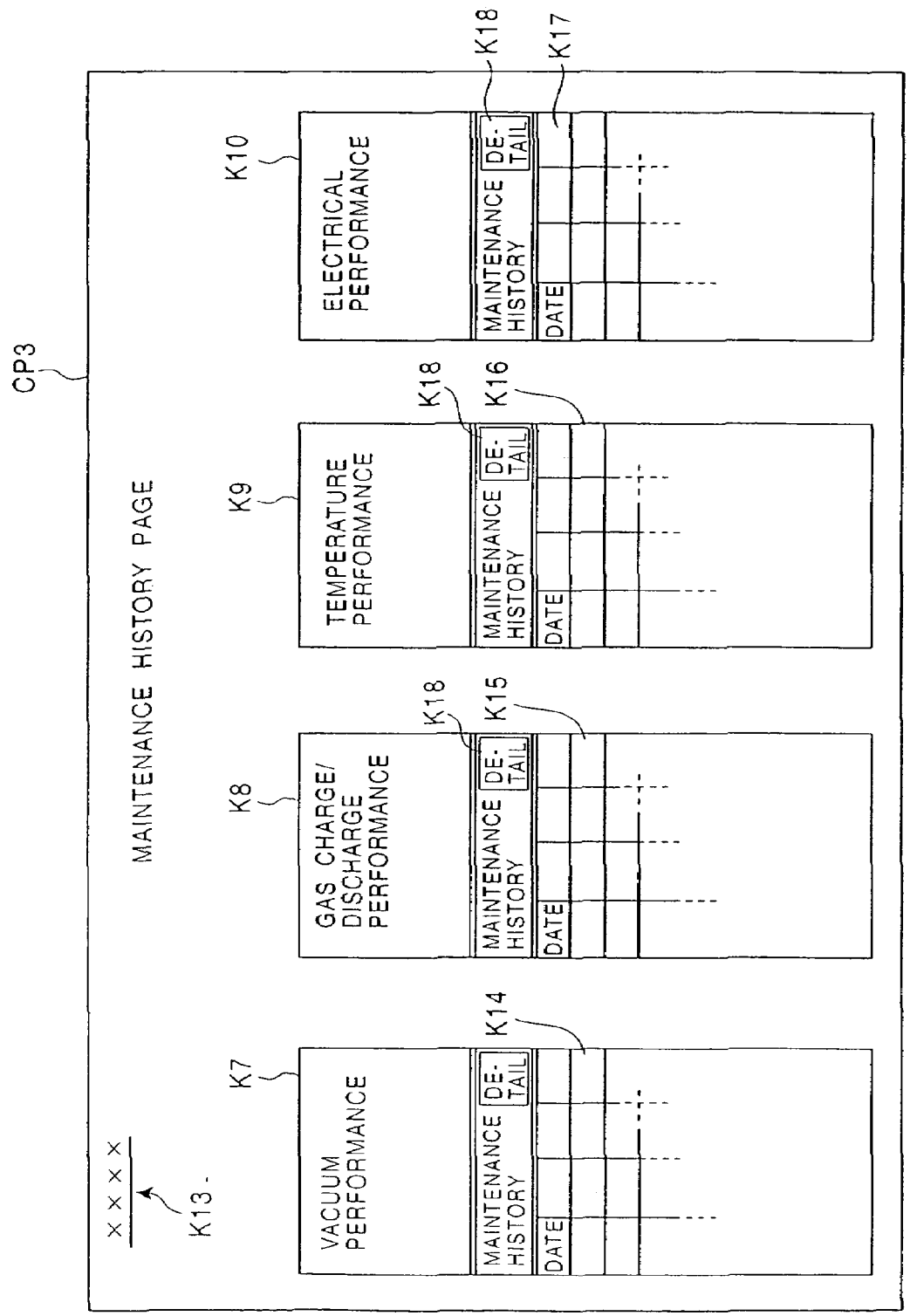
FIG. 29 shows an output form of a subpage CP3 in accordance with the performance validation system of the plasma processing apparatus of the present invention.
Figure 31:
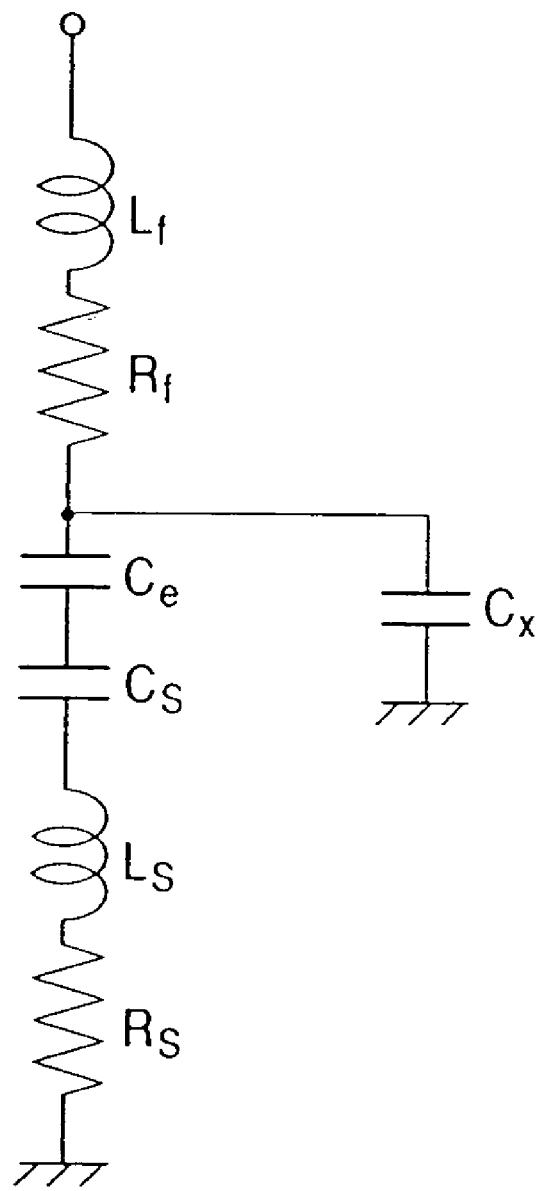
FIG. 31 is an equivalent circuit diagram of a plasma processing apparatus in accordance with the present invention.

FIG. 29 is an illustration of a maintenance history page (subpage) CP3 containing "operation and maintenance information", which is sent from the server S to the customer terminal C1. As shown in FIG. 29, the maintenance history page CP3 comprises a serial number section K13 indicating the serial numbers of the plasma processing apparatus or system and the plasma processing chambers thereof, the vacuum performance section K7, the gas charge/discharge performance section K8, the temperature performance section K9, the electrical performance section K10, a vacuum performance maintenance section K14, a gas charge/discharge performance maintenance section K15, a temperature performance maintenance section K16, and an electrical property maintenance section K17. These constitute the "standard performance information" and the "operation and maintenance information" of the specific plasma chamber that is purchased.

An example of the description contained in the vacuum performance maintenance section K14 is as follows:

ultimate degree of vacuum: $1.3 \times 10^{-5}$ Pa or less;

operational pressure: 200 Pa.

An example of the description contained in the gas charge/discharge performance maintenance section K15 is as follows:

| gas flow rates: | |
|---|---|
| $SiH_4$ | 40 SCCM, |
| $NH_3$ | 160 SCCM, |
| $N_2$ | 600 SCCM; and | discharge property: $6.8 \times 10^{-7}$ Pa·m³/sec.

An example of the description contained in the temperature performance maintenance section K16 is as follows:

heater temperature: 302.3±4.9° C.; and chamber temperature: 80.1±2.1° C.

The variation in each of the above-described parameters P among the plurality of the plasma chambers constituting the plasma processing apparatus or the plasma processing system is to be defined by relationship (10B) below:

$$(P_{max}-P_{min})/(P_{max}+P_{min}) \tag{10B}$$

wherein $P_{max}$ represents the maximum value of a particular parameter among the plurality of the plasma processing chambers and $P_{min}$ represents the minimum value of the particular parameter among the plurality of the plasma processing chambers. The variation is calculated as above using the measured values and is displayed for each of the parameters P.

A "detail" button K18 is provided in each of the sections K14, K15, K16, and K17. The customer may access the detailed information of the desired section by selecting one of the "detail" buttons K18 provided in the desired section.

When the customer submits a display request by selecting the "detail" button K18, a detailed maintenance page CP4 including detailed information on the maintenance history is transmitted from the server S to the customer terminal C1.

FIG. 30 shows the detailed maintenance page CP4 (subpage) transmitted from the server S to the customer terminal C1.

In FIG. 30, the detailed maintenance page CP4 of the electrical performance section K10 is illustrated.

As shown in FIG. 30, the detailed maintenance page CP4 comprises the serial number display sections K13 for displaying the serial numbers of the purchased plasma processing apparatus or system and the plasma chambers thereof, the electrical performance section K10, and the electrical property maintenance section K17. In the electrical property maintenance section K17, the values of the parameters P measured at the time of maintenance and the values of the variation among these measured values of the parameters P are displayed according to the serial numbers of the plasma processing chambers constituting the plasma processing apparatus or system.

In the electrical performance section K10, as is described earlier in relation to the first to fourth embodiments, the value of the first series resonant frequency $f_0$, the setting range of the first series resonant frequency $f_0$, and the relationship between the first series resonant frequency $f_0$ and the power frequency $f_e$ are displayed. In addition to these, the resistance $R_e$ and reactance $X_e$ of the plasma processing chamber at the power frequency $f_e$, the plasma capacitance $C_0$ between the plasma excitation electrode 4 and the susceptor electrode 8, the loss capacitance $C_X$ between the plasma excitation electrode 4 and the grounded potential portion of the plasma chamber, etc., are also displayed.

As shown in FIGS. 29 and 30, in both the maintenance history page CP3 and the detailed maintenance page CP4, the "operation and maintenance information" and the "standard performance information" comprising data such as the "vacuum performance", "gas charge/discharge performance", "temperature performance", "electrical performance", etc. retrieved from the database D, are displayed together. Thus, the customer can view the "operation and maintenance information" while referring to the "standard performance information". The customer may use the "standard performance information" as the reference during use and the "operation and maintenance information" as the parameter indicative of the actual state of the operation. By comparing the "standard performance information" to the "operation and maintenance information", the customer can validate the operation of the plasma processing apparatus or system and the plasma processing chambers thereof, determine whether it is necessary to perform maintenance, and be informed of the state of the plasma processing.

If the server S does not receive a log-off request from the customer terminal C1 after transmission of the subpages CP3 and CP4 to the customer terminal C1 (Step S5), the server S transmits an invalid connection message to the customer terminal C1 (Step S8) to prompt reentry of the "customer password" or to wait for the next display request (Step S3). If the server S receives the log-off request from the customer terminal C1 (Step S5), the communication with the customer terminal C1 is terminated.

As described above, according to the present invention, the performance validation system for the above-described plasma processing apparatus comprises a customer terminal, an engineer terminal, and information providing means. The customer terminal requests browsing of performance information at the time $t_0$ and the later time $t_1$ to the information providing means via a public line, a maintenance engineer uploads the performance information to the information providing means through the engineer terminal, and the information providing means provides the performance information uploaded from the engineer terminal to the customer terminal upon the request from the customer terminal. The performance information includes variations in various parameters such as the first series resonant frequency $f_0$ according to the plasma processing chambers constituting the plasma processing apparatus or system and can be output as a catalog or a specification document so that a customer may be provided with a basis for making purchasing decisions. The customer may also view the performance information comprising the standard performance information and the operation and maintenance information at the information terminal via a public line. Thus, it is possible to readily provide the customer with the information regarding the operation, performance, and maintenance of the plasma processing chambers of the plasma processing apparatus or system in use.

Moreover, because the performance information includes the information regarding the variations in various parameters among the plasma processing chambers, the parameters including the first series resonant frequency $f_0$, the basis for determining the operation of the plasma processing chambers of the plasma processing apparatus or system purchased by the customer can be readily provided to the customer. For the customer considering of purchasing a new plasma processing apparatus, the information serves as a basis for making purchasing decisions.

Eighth Embodiment

A performance evaluation method for the plasma processing apparatus in accordance with an eighth embodiment of the present invention will now be described with reference to the drawings.

The matching circuit of the plasma processing apparatus used in this performance evaluation method is shown in FIGS. 1 and 2 and is described in the first embodiment. The performance evaluation method for this embodiment evaluates whether or not three times a first series resonant frequency $f_0$ of the plasma processing chamber CN measured at the input end PR of the feed plate 3 is larger than the power frequency $f_e$ supplied to the plasma processing chamber CN from the radiofrequency generator 1. The first series resonant frequency $f_0$ used in this method is defined in the first embodiment.

The performance of the plasma processing apparatus is determined by whether or not three times the first series resonant frequency $f_0$ is larger than the power frequency $f_e$ supplied from the radiofrequency generator 1. That is, this evaluation method determines that the required level of performance is not maintained when three times the first series resonant frequency $f_0$ is not larger than the power frequency $f_e$. In such a case, corrective action to restore the first series resonant frequency $f_0$ is performed as follows:

(1) Adjusting the shape (length) of the feed plate 3;

(2) Adjusting the overlapping area of the plasma excitation electrode 4 and the chamber wall 10;

(3) Adjusting the thickness of the insulating material between the plasma excitation electrode 4 and the chamber wall 10; and (4) Connecting the susceptor electrode 8 and the chamber wall 10 with a conductor.

For example, in this plasma processing apparatus, as shown in FIG. 6, the power frequency $f_e$ is set at 40.68 MHz and the impedance $Z$ ($\Omega$) and the phase $\theta$ (deg) are measured while varying the frequency f from 0 to 100 MHz to depict an impedance characteristic curve and a phase curve. The first series resonant frequency $f_0$ is then set to, for example, 16.5 MHz so that relationship (1) is satisfied:

$$3f_0 > f_e \qquad (1)$$

In the performance validation method of this embodiment, corrective action is readily performed so that three times the first series resonant frequency $f_0$ of the plasma processing chamber CN is larger than the power frequency $f_e$ supplied from the radiofrequency generator 1. As a result, the overall radiofrequency characteristics of the plasma processing chamber CN can be optimized. Such a performance evaluation method has not been considered in conventional processes.

Thus, electrical power from the radiofrequency generator can be effectively fed into the plasma space between the plasma excitation electrode 4 and the susceptor electrode 8 even if the input radiofrequency is higher than 13.56 MHz, which is conventionally used. If the same frequency is supplied, the electrical power is more efficiently consumed in the plasma space of the present invention compared with conventional plasma processing apparatuses. As a result, the processing rate is improved by the higher-frequency plasma excitation. In other words, the deposition rate of the layer is improved in the plasma enhanced CVD or the like.

After a proper corrective action based on the performance evaluation of this embodiment, radiofrequency power is effectively fed into the plasma space, suppressing undesirable spread of the plasma. Since the substrate 16 can be uniformly treated in the planar direction, the layer thickness deposited by the plasma processing exhibits high in-plain uniformity.

Moreover, feeding of higher radiofrequency enables the plasma potential to be reduced, avoiding damage by ions. Thus, the layer quality is improved in layer deposition treatments such as plasma enhanced CVD and sputtering. That is, the higher-wave radiofrequency contributes to improvements in isolation voltage, etching resistance in etching solutions, and density or hardness of the resulting layer. The layer density is represented by, for example, etching resistance in a BHF solution.

After the above corrective action, electrical power with a certain frequency will be more effectively supplied to the plasma space compared with conventional plasma processing apparatus, improving electrical consumption efficiency. Thus, a desired deposition rate and a desired layer property are achieved by reduced power input, resulting in reduced operation costs. Moreover, the processing time is reduced, thus improving productivity and contributing to carbon dioxide emission reduction due to reduced electrical power consumption.

According to the performance evaluation method of this embodiment, the first series resonant frequency $f_0$ is measured with the impedance meter AN at the installation site of the plasma processing apparatus. The performance of the plasma processing apparatus can be thereby checked and evaluated within a short time. Since no substrate with deposited layers is used for checking, the performance validation and evaluation of the plasma processing apparatus does not require shutdown of the production line for several days to several weeks, thereby improving productivity of the production line.

Since the first series resonant frequency $f_0$ mainly depends on the mechanical structure, thus the individual plasma processing chambers have different first series resonant frequencies $f_0$. By setting the first series resonant frequency $f_0$ to the above-described range, the overall radiofrequency characteristics of the plasma chambers can be optimized, achieving stable plasma generation. Consequently, the plasma processing apparatus exhibits improved operation stability.

Because the performance evaluation is performed after the apparatus is disassembled at the engineer site, is transferred to the customer site, and is reassembled at the customer site, the performance of the apparatus can be readily checked for a short time in view of factors which adversely affect the performance, such as misalignment due to vibration during transfer and unsatisfactory reassembling. Moreover, a period from finding to solving the problem can be reduced; hence, the apparatus can be readily used in practice after a reduced amount of installation and set-up time.

The impedance may be measured by a method shown in FIG. 15 or 16.

In this embodiment, the substrate 16 is placed on the susceptor electrode 8 to determine the power frequency $f_e$ and the first series resonant frequency $f_0$ to the plasma excitation electrode 4. Alternatively, the substrate 16 may be placed on the plasma excitation electrode 4.

Ninth Embodiment

A performance validation method in accordance with ninth embodiment of the present invention will now be described with reference to the drawings.

The configuration of the plasma processing apparatus used in the performance evaluation method of this embodiment is substantially the same as that shown in FIG. 7.

This method evaluates whether or not three times the first series resonant frequency $f_0$ of the plasma processing chamber CN is larger than the power frequency $f_e$ supplied to the plasma processing chamber CN from the radiofrequency generator 1.

As shown in FIG. 8, in this embodiment, the radiofrequency characteristic of the plasma processing chamber CN is measured at the impedance measuring terminal 61, which is connected in series to the input end PR of the feed plate 3, that is, the output terminal of the tuning capacitor 24. That is, in the plasma generation mode, the matching circuit 2A, which is connected in parallel to the feed plate 3, and the matching circuit 25 is connected to the susceptor electrode 8. In the measuring mode for measuring the impedance characteristic, the matching circuit 2A is disconnected from the feed plate 3 at the measuring point PR, while the matching circuit 2A is disconnected from the susceptor electrode 8.

The performance of the plasma processing apparatus is determined by whether or not three times the first series resonant frequency $f_0$ is larger than the power frequency $f_e$ supplied from the radiofrequency generator 1. That is, this evaluation method determines that the required level of performance is not maintained when three times the first series resonant frequency $f_0$ is not larger than the power frequency $f_e$. In such a case, corrective action to restore the first series resonant frequency $f_0$ is performed as follows:

(1) Adjusting the shape (length) of the feed plate 3;

(2) Adjusting the overlapping area of the plasma excitation electrode 4 and the chamber wall 10;

(3) Adjusting the thickness of the insulating material between the plasma excitation electrode 4 and the chamber wall 10; and (4) Connecting the susceptor electrode 8 and the chamber wall 10 with a conductor.

For example, in this plasma processing apparatus, as shown in FIG. 10, the power frequency $f_e$ is set at 40.68

MHz and the impedance Z (Ω) and the phase θ (deg) are measured while varying the frequency f from 0 to 100 MHz to depict an impedance characteristic curve and a phase curve. Corrective action is then performed so as to satisfy relationship (1):

$$3f_0 > f_e \quad (1)$$

Preferably, the first series resonant frequency $f_0$ satisfies relationship (2):

$$1.3f_0 > f_e \quad (2)$$

In the corrective action, the first series resonant frequency $f_0$ may be set at, for example, 42.5 MHz.

The performance evaluation method of this embodiment has substantially the same advantages as those in the eighth embodiment. Moreover, the impedance measuring terminal 61, which is provided at the input end PR of the feed plate 3, facilitates probing for measuring the impedance characteristic of the plasma processing chamber CN. Accordingly, the first series resonant frequency $f_0$ can be measured with high efficiency after the plasma processing apparatus is disassembled at the delivery site, is transferred to the customer site, and is reassembled at the customer site.

The impedance measuring terminal 61 extends from the interior of the matching box 2 in this embodiment. Alternatively, the first series resonant frequency $f_0$ may be measured after the radiofrequency generator 1 and the matching box 2 are detached from the plasma processing apparatus.

Tenth Embodiment

A performance evaluation method for a plasma processing apparatus in accordance with a tenth embodiment of the present invention will now be described with reference to the drawings.

The configuration of the plasma processing apparatus used in the performance evaluation method of this embodiment is substantially the same as that shown in FIG. 11.

This method evaluates whether or not three times the first series resonant frequency $f_0$ of the plasma processing chamber CN is larger than the power frequency $f_e$ supplied to the plasma processing chamber CN from the radiofrequency generator 1. The method also evaluates whether or not the series resonant frequency $f_0'$ defined by the capacitance $C_e$ between the electrodes 4 and 8 is larger than the product of the power frequency $f_e$ and the square root of (distance d between the electrodes/total distance δ of portions not emitting plasma).

The performance of the plasma processing apparatus is determined by whether or not three times the first series resonant frequency $f_0$ is larger than the power frequency $f_e$ supplied from the radiofrequency generator 1. That is, this evaluation method determines that the required level of performance is not maintained when three times the first series resonant frequency $f_0$ is not larger than the power frequency $f_e$. In such a case, corrective action to restore the first series resonant frequency $f_0$ is performed as follows:

(1) Adjusting the shape (length) of the feed plate 3;

(2) Adjusting the overlapping area of the plasma excitation electrode 4 and the chamber wall 10;

(3) Adjusting the thickness of the insulating material between the plasma excitation electrode 4 and the chamber wall 10; and (4) Connecting the susceptor electrode 8 and the chamber wall 10 with a conductor.

For example, in this plasma processing apparatus, as shown in FIG. 13, the power frequency $f_e$ is set at 40.68 MHz and the impedance Z (Ω) and the phase θ (deg) are measured while varying the frequency f from 0 to 150 MHz to depict an impedance characteristic curve and a phase curve. Corrective action is then performed so as to satisfy relationship (1):

$$3f_0 > f_e \quad (1)$$

Preferably, the first series resonant frequency $f_0$ satisfies relationship (3):

$$f_0 > 3f_e \quad (3)$$

In the corrective action, the first series resonant frequency $f_0$ may be set at, for example, 123.78 MHz.

The performance of the plasma processing apparatus is also determined by whether or not the first series resonant frequency $f_0'$ defined by the plasma electrode capacitance $C_e$ between the electrodes 4 and 8 is larger than three times the power frequency $f_e$.

The series resonant frequency $f_0'$ is a radiofrequency characteristic dependent on the mechanical shape of the plasma excitation electrode 4 and the susceptor electrode 8 and is in proportion to the reciprocal of the square root of the plasma electrode capacitance $C_e$ between the plasma excitation electrode 4 and the susceptor electrode 8.

Since the frequency characteristics of the plasma excitation electrode 4 and the susceptor electrode 8, which generate a plasma, can be directly evaluated in this method, power can be efficiently fed to the plasma emission space, thereby improving the power consumption efficiency and the process efficiency.

Moreover, the performance of the plasma processing apparatus is determined by whether or not the first series resonant frequency $f_0'$ defined by the plasma electrode capacitance $C_e$ between the electrodes 4 and 8 and the power frequency $f_e$ satisfy relationship (5):

$$f_0' > (d/\delta)^{1/2} f_e \quad (5)$$

The series resonant frequency $f_0''$ between the electrodes 4 and 8 during plasma emission is in inverse proportion to the root of the $C_o''$, that is, d/δ:

$$f_0'' \propto (d/\delta)^{1/2} \cdot f_0' \quad (8)$$

The performance of the plasma processing apparatus is determined by whether or not the series resonant frequency $f_0''$ between the electrodes 4 and 8 during plasma emission and the power frequency $f_e$ satisfy relationship (9)

$$f_0'' > f_e \quad (9)$$

Relationship (5) above is derived from relationships (9) and (8).

When the first series resonant frequency $f_0'$ and the power frequency $f_e$ satisfy relationship (5), the correlation between the first series resonant frequency $f_0''$ defined by the model capacitance $C_o''$ when plasma is emitted and the first series resonant frequency $f_0'$ defined by the capacitance between the electrodes 4 and 8 when plasma is not emitted can be evaluated. Thus, by evaluating whether or not the first series resonant frequency $f_0'$ divided by the square root of d/δ is larger than the power frequency $f_e$, the correlation between the first series resonant frequency $f_0'$ of the electrodes 4 and 8 and the power frequency $f_e$ during plasma emission is evaluated. Thus, power consumption efficiency during plasma emission can be evaluated.

The performance evaluation method of this embodiment has substantially the same advantages as those in the eighth embodiment. Moreover, the detachable impedance meter is connected to the impedance measuring terminal 61 and the switches SW1 and SW2 having impedances $Z_1$ and $Z_2$, respectively, which are equal to each other, are provided. Thus, the impedance characteristics and the first series resonant frequency $f_0$ can be determined only by changing the switches SW1 and SW2 without detaching the plasma processing chamber CN, the matching circuit 2A and connecting the impedance measuring probe 105. Furthermore, the impedance determined by the impedance meter AN connected to the impedance measuring terminal 61 can be considered to be equal to the impedance measured at the input end PR of the feed plate 3; hence, the first series resonant frequency $f_0$ can be measured more precisely and efficiently without correction or conversion.

In addition, the radiofrequency characteristics of the electrodes 4 and 8 emitting the plasma are directly evaluated by comparing the first series resonant frequency $f_0'$ with the power frequency $f_e$. Power can, therefore, be more effectively fed into the plasma space. Accordingly, this method facilitates proper determination of power consumption efficiency and processing efficiency.

Eleventh Embodiment

A performance evaluation method for a plasma processing apparatus in accordance with an eleventh embodiment of the present invention will now be described with reference to the drawings.

Figure 32:
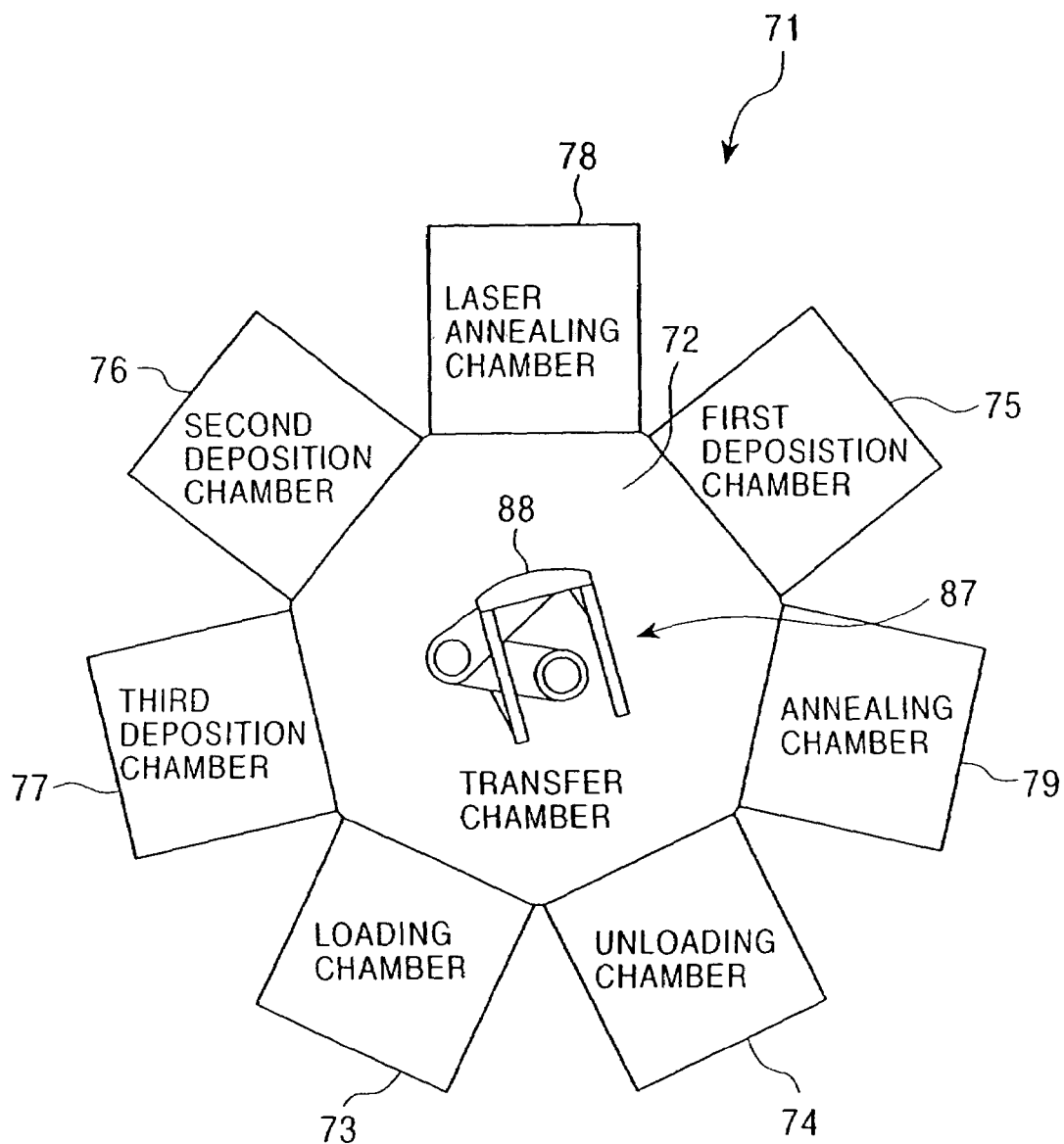
FIG. 32 is a schematic view of a plasma processing apparatus which is used in a performance evaluation method in accordance with an eleventh embodiment of the present invention.

FIG. 32 is a schematic view of a plasma processing apparatus which is used in the performance evaluation method in accordance with this embodiment.

In the plasma processing apparatus 71, five processing chamber units, one loading chamber 73, and one unloading chamber 74 are continuously arranged around a substantially heptagonal transfer chamber 72. The five processing chamber units are a first deposition chamber 75 for depositing an amorphous silicon layer, a second deposition chamber 76 for depositing a silicon oxide layer, a third deposition chamber 77 for depositing a silicon nitride layer, a laser annealing chamber 78 for annealing a processed substrate after deposition, and an annealing chamber 79 for performing a heat treatment of the processed substrate.

The processing chambers 75, 76, and 77 have the same configuration as that of the plasma processing apparatus described in the eighth embodiment with reference to FIGS. 1 and 2, and detailed description thereof is omitted.

In the deposition of the amorphous silicon layer, the silicon oxide layer, and the silicon nitride layer in the processing chambers 75, 76, and 77, respectively, as shown in FIG. 1, a substrate 16 to be treated is placed on a susceptor electrode 8. A radiofrequency voltage is applied to both a plasma excitation electrode 4 and the susceptor electrode 8 from a radiofrequency generator 1, while a reactive gas is supplied from a gas feeding tube 17 into a chamber space 60 through a shower plate 6 to generate a plasma. The target layer is thereby formed on the substrate 16.

Figure 33:
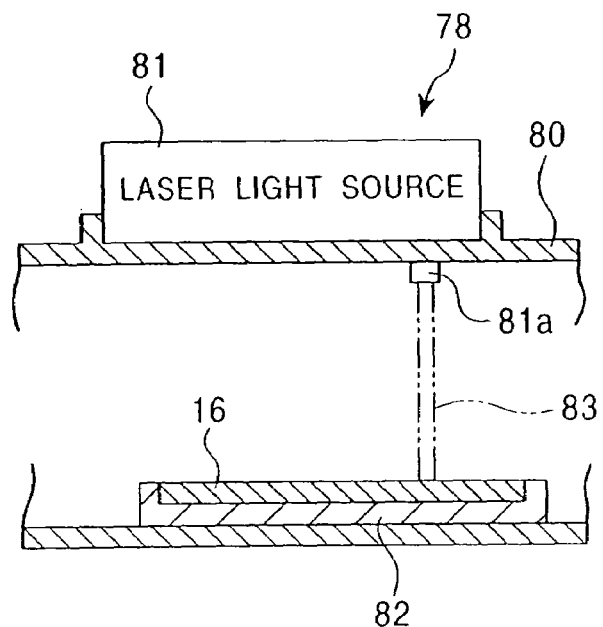
FIG. 33 is a cross-sectional view of a laser-annealing chamber shown in FIG. 32.

With reference to FIG. 33, the laser annealing chamber 78 is provided with a laser light source 81 on the upper wall 80 and a stage 82 for placing the substrate 16 to be treated on the bottom wall of the chamber. The stage 82 is horizontally movable in the orthogonal X and Y directions. Spot laser light 83 (shown by chain lines) is emitted from an aperture 81a of a laser light source 81, while the stage 82 supporting the substrate 16 horizontally moves in the X and Y directions so that the laser light 83 scans the entire surface of the substrate 16. Examples of the laser light sources 81 are gas lasers using halogen gases, such as XeCl, ArF, ArCl, and XeF.

The laser annealing chamber 78 may have any configuration as long as the spot laser beam from the laser light source can scan the entire surface of the substrate to be treated. Also, in this case, gas lasers using halogen gases, such as XeCl, ArF, ArCl, and $X_{ef}$ can be used as laser light sources. Alternatively, other laser light sources such as a YAG laser may be used depending on the type of the layer to be annealed. Laser annealing may be pulsed laser annealing or continuously oscillating laser annealing. The annealing chamber may have a configuration of, for example, a multistage electrical furnace type.

Figure 34:
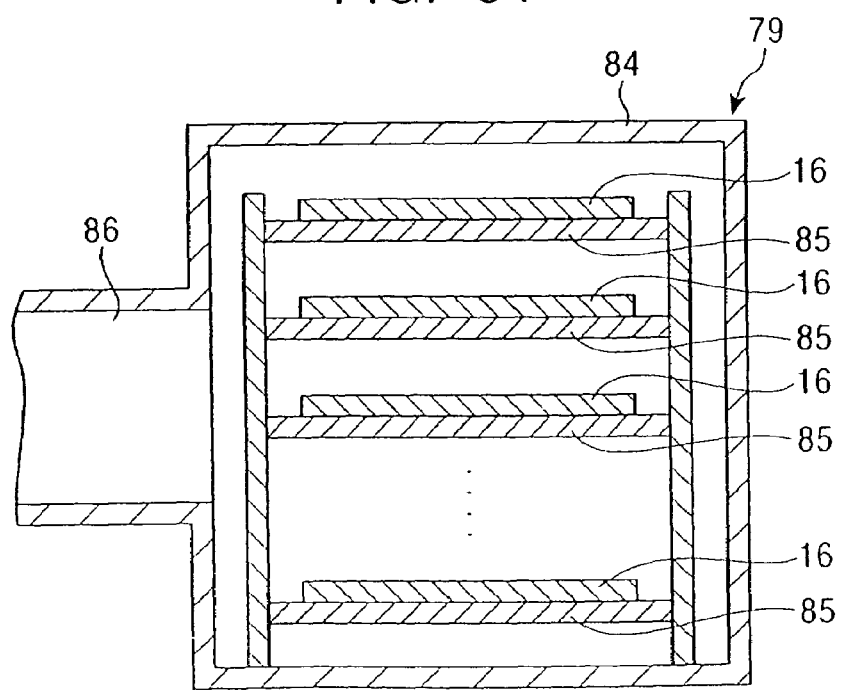
FIG. 34 is a cross-sectional view of an annealing chamber shown in FIG. 32.

With reference to FIG. 34, the annealing chamber 79 is of a multistage electrical furnace type. In the annealing chamber 79, a plurality of substrates 16 is placed on heaters 85 which are vertically arranged in the chamber. These heaters 85 are energized to heat the substrates 16. A gate valve is provided between the annealing chamber 79 and the transfer chamber 72.

With reference to FIG. 32, the loading chamber 73 and the unloading chamber 74 are provided with a loading cassette and an unloading cassette, respectively, which are detachable from these chambers. These cassettes can contain a plurality of substrates 16, that is, the loading cassette contains unprocessed substrates 16 whereas the unloading cassette contains processed substrates 16. A transfer robot 87 as means for transferring the substrates 16 is placed in the transfer chamber 72 which is surrounded by the processing chamber unit, the loading chamber 73, and the unloading chamber 74. The transfer robot 87 is provided with an arm 88 thereon. The arm 88 has an expandable and shrinkable link mechanism and can rotate and vertically move. The substrate 16 is supported and transferred by the end of the arm 88.

In this plasma processing apparatus 71, the operations of each component are automatically controlled by a control section, whereas various processing conditions, such as layer deposition conditions, annealing conditions, and heating conditions, and process sequences are controlled by an operator. In the operation of the plasma processing apparatus 71, untreated substrates 16 are set on the loading cassette, and are transferred from the loading cassette into each processing chamber by the transfer robot 87 based on the starting operation by the operator. After the substrates 16 are automatically and sequentially processed in each chamber, the substrates 16 are placed onto the unloading cassette by the transfer robot 87.

In the performance evaluation method for the plasma processing apparatus 71 of this embodiment, a variation $f_{01r}$ of the first series resonant frequencies $f_{01}$ of the plurality of processing chambers 75, 76, and 77 after the delivery is defined by the maximum $f_{01max}$ and the minimum $f_{01min}$ as follows:

$$f_{01r} = (f_{01max} - f_{01min}) / (f_{01max} + f_{01min}) \quad (10)$$

The required level of performance is determined by whether or not the variation is less than 0.1. That is, the method determine that required level of performance is maintained when the variation $f_{01r}$ is less than 0.1 or the required level of performance is not maintained when the variation $f_{01r}$ is 0.1 or more.

The first series resonant frequency $f_0$ and the corrective action thereof are described in the eighth embodiment.

This performance evaluation method facilitates corrective action of differences in radiofrequency characteristics between the processing chambers 75, 76, and 77. Since the radiofrequency characteristics of these processing chambers 75, 76, and 77 are controlled within a predetermined range, these processing chambers 75, 76, and 77 consume substantially the same electrical power.

Accordingly, substantially the same result is achieved from a single process recipe for these different processing chambers 75, 76, and 77. When layers are formed in these processing chambers 75, 76, and 77, these layers can have substantially the same characteristics, e.g., the thickness, the isolation voltage, and the etching rate. When the variation is controlled to be less than 0.1 under the same deposition conditions in the plasma chambers 75, 76, and 77, the variation in layer thickness can be controlled to be less than ±5%.

As a result, the overall radiofrequency characteristics of the plasma processing apparatus 71 can be optimized so as to generate a stable plasma. Thus, the operations of the processing chambers 75, 76, and 77 of the plasma processing apparatus 71 are stable and uniform. Such a performance evaluation method has not been considered in conventional processes.

The above-mentioned method does not require a determination of process conditions by the relationships between enormous amounts of data on these processing chambers 75, 76, and 77 and the results obtained by evaluation of actually processed substrates.

Thus, in installation of new systems and inspection of installed systems, the time required for obtaining substantially the same results using the same process recipe in these processing chambers 75, 76, and 77 can be significantly reduced by measuring the first series resonant frequency $f_0$ compared with an inspection method by actual deposition onto the substrate 16. Moreover, according to this evaluation method, the plasma processing apparatus 71 can be directly evaluated in situ in a short period of time, instead of a two-stage evaluation, i.e., processing of the substrates and confirmation and evaluation of the operation of the plasma processing apparatus 71 based on the evaluation of the processed substrates. If an inspection process by layer deposition on the substrates 16 is employed in this embodiment, these processing chambers 75, 76, and 77 can be simultaneously evaluated. In conventional methods, these plasma chambers must be independently evaluated.

Accordingly, the performance evaluation method of this embodiment does not require a shutdown of the production line for several days to several weeks in order to check and evaluate the operation of the plasma processing apparatus 71. The production line, therefore, has high productivity with reduced expenses for substrates used in the inspection, processing of these substrates, and labor during the inspection operations.

The performance evaluation methods described in the eighth to tenth embodiments are also applicable to the processing chambers 75, 76, and 77. By using both the evaluation based on the comparison of the first series resonant frequency $f_0$ of each processing chamber with the power frequency $f_e$ and the evaluation based on the variation $f_{01r}$, the overall radiofrequency characteristics of the processing chambers 75, 76, and 77, including a variation according to chambers, can be simultaneously optimized. These processing chambers 75, 76, and 77 thereby exhibit the same advantages as those in the eighth to tenth embodiments.

Twelfth Embodiment

A performance evaluation method for a plasma processing apparatus in accordance with a twelfth embodiment of the present invention will now be described with reference to the drawings.

Figure 35:
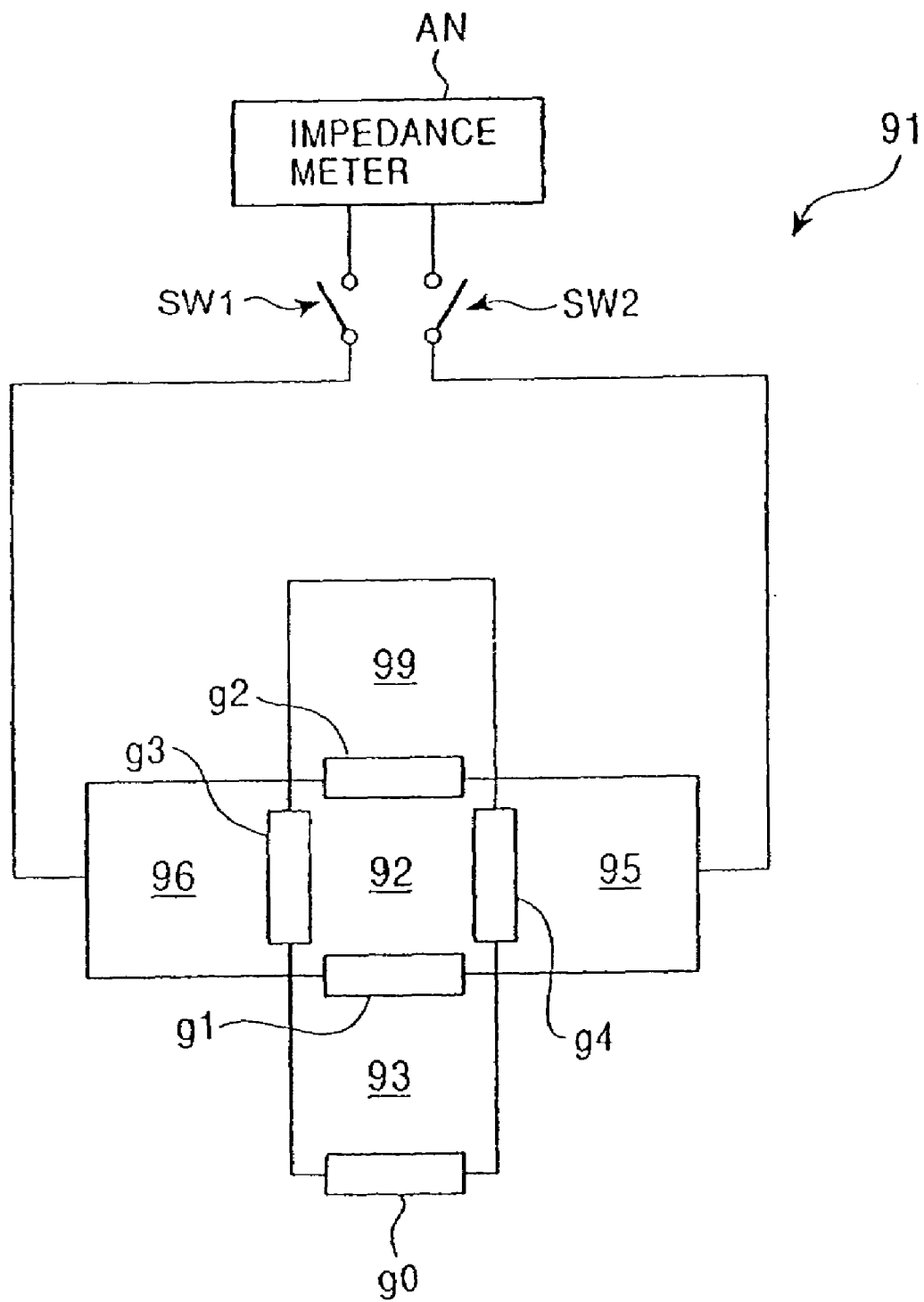
FIG. 35 is a schematic view of a plasma processing apparatus which is used in a performance evaluation method in accordance with a twelfth embodiment of the present invention.

FIG. 35 is a cross-sectional view of an outline configuration of a plasma processing apparatus 91 used in this performance evaluation method.

The plasma processing apparatus 91 has a load-lock chamber 93, a heating chamber 99, and processing chambers 95 and 96 which are provided around a substantially square transfer chamber (waiting chamber) 92. The transfer chamber 92 contains a transfer robot for transferring substrates and has gates g1, g2, g3, and g4 at the interfaces to the chambers. The transfer chamber 92, the heating chamber 99, and the processing chambers 95 and 96 are evacuated to high vacuum by individual high-vacuum pumps. The load-lock chamber 93 is evacuated to low vacuum by a low-vacuum pump.

The components of the plasma processing apparatus 91 of this embodiment correspond to those of the plasma processing apparatus 71 of the eleventh embodiment shown in FIGS. 32 to 34. That is, the transfer chamber 92 corresponds to the transfer chamber 72, the heating chamber 99 corresponds to the annealing chamber 79, and the load-lock chamber 93 corresponds to the loading chamber 73 and the unloading chamber 74. The components having the same configurations are not described.

The processing chambers 95 and 96 have substantially the same configuration as that of the dual-frequency plasma processing apparatus of the ninth embodiment shown in FIG. 7 and may perform different treatments for forming different layers or the same treatment using the same recipe.

In the plasma processing apparatus 91, a gate g0 is opened to transfer the substrate 16 into the load-lock chamber 93. The gate g0 is closed to evacuate the load-lock chamber 93 by a low-vacuum pump. The gates g1 and g2 are opened to transfer the substrate 16 from the load-lock chamber 93 to the heating chamber 99 by a transfer arm of a transfer robot in the transfer chamber 92. The gates g1 and g2 are closed to evacuate the transfer chamber 92 and the heating chamber 99 using a high-vacuum pump. After the substrate 16 is annealed, the gates g2 and g4 are opened to transfer the annealed substrate 16 to the processing chamber 95 by the transfer arm of the transfer robot. After the substrate 16 is processed in the processing chamber 95, the gates g3 and g4 are opened to transfer the substrate 16 to the plasma chamber 96 by the transfer arm of the transfer robot in the transfer chamber 92. After the substrate 16 is processed in the plasma chamber 96, the gates g1 and g3 are opened to transfer the substrate 16 to the load-lock chamber 93 by the transfer arm of the transfer robot in the transfer chamber 92.

Individual sections are automatically operated by a controller section, although the processing conditions such as layer deposition conditions in these processing chambers and the processing sequence are set by an operator. In the use of this plasma processing apparatus 91, an untreated substrate 16 is placed onto a loading cassette in the load-lock chamber 93 and the operator pushes a start switch. The substrate 16 is sequentially transferred from the loading cassette to processing chambers by the transfer robot. After a series of processing steps are performed in these processing chambers, the substrate 16 is placed into the unloading (loading) cassette by the transfer robot.

In these processing chambers 95 and 96, as shown in FIG. 7, the substrate 16 is placed on the susceptor electrode 8, and the radiofrequency generator 1 supplies a radiofrequency voltage to both the plasma excitation electrode 4 and the susceptor electrode 8 while a reactive gas is fed into the chamber space 60 from the gas feeding tube 17 via the shower plate 6 to generate a plasma for forming an amorphous silicon layer, a silicon oxide layer, or a silicon nitride layer on the substrate 16, as in the ninth embodiment.

As shown in FIG. 35, these processing chambers 95 and 96 are connected to an impedance meter (radiofrequency meter) AN via switches SW1 and SW2. In these processing chambers 95 and 96, a variation $f_{01r}$ between the maximum frequency $f_{01max}$ and the minimum frequency $f_{01min}$ among first series resonant frequencies $f_0$ after the delivery is defined as follows:

$$f_{01r} = (f_{01max} - f_{01min})/(f_{01max} + f_{01min})$$

The performance of these processing chambers is determined by whether or not the variation $f_{01r}$ is less than 0.03. That is, this evaluation method determines that the required level of performance is maintained when the variation $f_{01r}$ is less than 0.03 and that the required level of performance is not maintained when the variation $f_{01r}$ is 0.03 or more. In the latter case, corrective action to adjust the first series resonant frequency $f_0$ is performed as in the ninth embodiment.

The performance evaluation method of this embodiment exhibits the same advantages as those in the eleventh embodiment. Moreover, adequate corrective action is performed to these processing chambers 95 and 96 based on the evaluation of the variation $f_{01r}$ of the first series resonant frequencies $f_{01}$ after the delivery. Thus, the processing chambers 95 and 96 have substantially the same radiofrequency characteristics, such as impedance and resonant frequency. Since the radiofrequency characteristics of these processing chambers are controlled within a predetermined range, these processing chambers 95 and 96 consume substantially the same electrical power.

Accordingly, substantially the same result is achieved from a single process recipe for these different processing chambers 95 and 96. When layers are formed in these processing chambers 95 and 96, these layers can have substantially the same characteristics, e.g., the thickness, the isolation voltage, and the etching rate. When the variation is controlled to be less than 0.03 under the same deposition conditions in the plasma chambers 95 and 96, the variation in layer thickness can be controlled to be less than ±2%.

With reference to FIG. 7, in the plasma processing apparatus 91 of this embodiment, the impedance measuring terminal 61 is provided at the input end PR of the feed plate 3 in each of the processing chambers 95 and 96, and the impedance meter AN is detachably connected to the impedance measuring terminal 61. Moreover, the matching circuit 2A is disconnected from the processing chambers 95 and 96 by operating the switches SW1 and SW2 (FIG. 35) when the impedance characteristics of the processing chambers 95 and 96 are measured, as in the eleventh embodiment. Thus, the impedance characteristics of the processing chambers 95 and 96 can be measured without disconnecting the matching circuit 2A from the power supply line, unlike the eleventh embodiment. Accordingly, the radiofrequency characteristics including the first series resonant frequency $f_0$ of the processing chambers 95 and 96 can be readily measured with improved processing efficiency.

As described in the third embodiment, the impedance $Z_1$ is also equal to the impedance $Z_2$ in these processing chambers 95 and 96 in this embodiment; hence, switching between the measuring mode of the impedance characteristics and the first series resonant frequency $f_0$ and the operating mode of the plasma processing apparatus can be readily performed only by operating the switches SW1 and SW2, without connecting and disconnecting the matching circuit 2A and a probe 105 for measuring the impedance shown in FIG. 15. Thus, the measurements of the first series resonant frequencies $f_0$ of these processing chambers 95 and 96 can be efficiently performed, by operating the switches SW1 and SW2.

In addition, the impedance measured by the impedance meter AN connected to each impedance measuring terminal 61 is regarded as the impedance measured at the input end PR of the feed plate 3 in these processing chambers 95 and 96, no correction is required for calculating the first series resonant frequency $f_0$ in each plasma chamber. Thus, the first series resonant frequency $f_0$ can be exactly measured with improved efficiency and without correction of the observed value.

As in the tenth embodiment, corrective action based on the evaluation by the comparison of first series resonant frequency $f_0'$ of each processing chamber with the power frequency $f_e$ can optimize the radiofrequency characteristics of the electrodes 4 and 8 in each of the processing chambers 95 and 96. The electrical power can be more effectively supplied to the plasma excitation space between the electrodes 4 and 8, resulting in further improved power consumption efficiency and processing efficiency in the plasma processing apparatus 91.

In this embodiment, the two switches SW1 and SW2 are provided. However, since one feature of this embodiment is that the impedance from the branch to the measuring point PR is equal to the impedance from the branch to the probe, this requirement may be satisfied using one switch that may select the appropriate processing chamber.

The performance evaluation methods described in the eighth to tenth embodiments are also applicable to the processing chambers 95 and 96. By using both the evaluation based on the comparison of first series resonant frequency $f_0$ with the power frequency $f_e$ and the abovementioned evaluation based on the variation $f_{01r}$, the overall radiofrequency characteristics of the processing chambers processing chamber 95 and 96 can be simultaneously optimized. These processing chambers 95 and 96 thereby exhibit the same advantages as those in the eighth to tenth embodiments.

Thirteenth Embodiment

A performance evaluation method for a plasma processing system in accordance with a thirteenth embodiment of the present invention will now be described with reference to the drawings.

Figure 36:
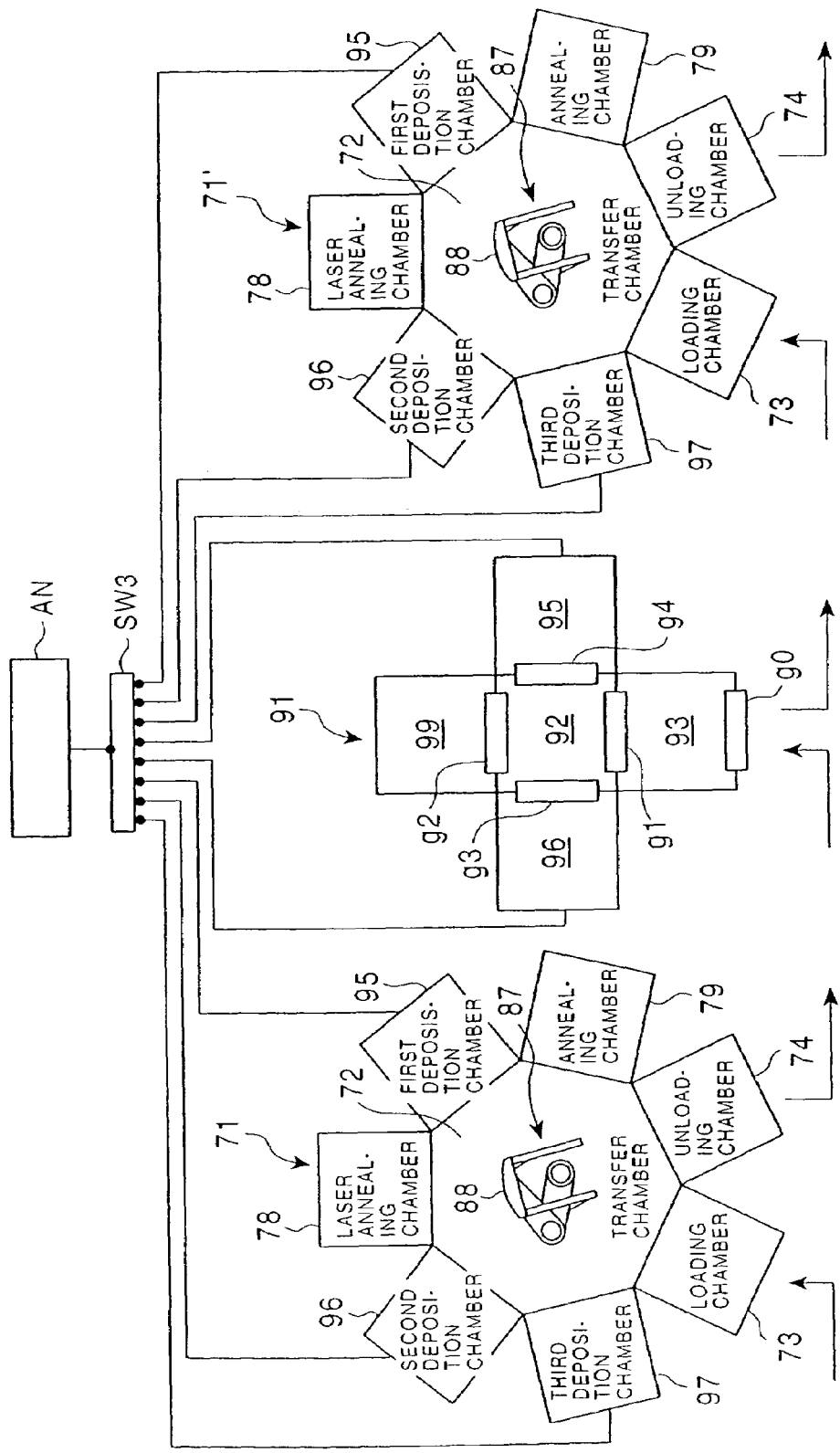
FIG. 36 is a schematic view of a plasma processing system which is used in a performance evaluation method in accordance with a thirteenth embodiment of the present invention.

FIG. 36 is a cross-sectional view of an outline configuration of a plasma processing system used in this performance evaluation method.

The plasma processing system of this embodiment is substantially a combination of plasma processing apparatuses 71 and 71' which correspond to the plasma processing apparatus 71 shown in FIG. 32 (see the eleventh embodiment) and a plasma processing apparatus 91 which corresponds to the plasma processing apparatus 91 shown in FIG. 35 (see the twelfth embodiment). Components having the same functions as in the eleventh and twelfth embodiments are referred to with the same reference numerals, and a detailed description thereof with reference to drawings has been omitted.

As shown in FIG. 36, the plasma processing system of this embodiment constitutes a part of a production line which includes the plasma processing apparatus 71, the plasma processing apparatus 91, and the plasma processing apparatus 71'. The plasma processing apparatus 71 has three plasma processing chambers 95, 96, and 97. The plasma processing apparatus 91 has two plasma processing chambers 95 and 96. The plasma processing apparatus 71' has three plasma processing chambers 95, 96, and 97. These plasma processing chambers 95, 96, and 97 in the plasma processing apparatuses 71, 71', and 91 have substantially the same configuration.

In the plasma processing system of the present invention, for example, a substrate 16, which has been preliminarily treated, is subjected to a first layer deposition treatment in the plasma processing chamber 95 of the plasma processing apparatus 71, is annealed in the annealing chamber 79, and is laser annealed in the laser annealing chamber 78. The treated substrate 16 is subjected to second and third layer deposition treatments in the plasma processing chambers 96 and 97.

The substrate 16 is transferred from this plasma processing apparatus 71 and a photoresist is applied thereto by a photolithographic step using another apparatus (not shown).

The substrate 16 is transferred into the plasma processing apparatus 91 and is plasma-etched in the processing chambers 95 and 96. Next, the substrate 16 is transferred to the plasma processing chamber 96 and is subjected to a layer deposition treatment therein.

The substrate 16 is transferred from the plasma processing apparatus 91. After the resist is removed, the substrate 16 is subjected to photolithographic patterning in another apparatus not shown in the drawing.

Finally, the substrate 16 is subjected to first, second, and third deposition treatments in the plasma processing chambers 95, 96, and 97 of the plasma processing apparatus 71', and is transferred to the subsequent step to complete the steps in the plasma processing system according to this embodiment.

With reference to FIG. 36, impedance measuring terminals of the plasma processing chambers 95, 96, and 97 are connected to an impedance meter AN via a switch SW3. In the measurement of the impedance, the switch SW3 connects only one of the plasma chambers 95, 96, and 97 to the impedance meter AN. Coaxial cables have the same length between the impedance measuring terminals of the plasma processing chambers 95, 96, and 97 and the switch SW3 so that the impedances from these impedance measuring terminals to the switch SW3 are the same. A detachable probe of an impedance meter AN is connected to the impedance measuring terminal, as shown in FIG. 7.

The first series resonant frequency $f_0$ of each of the plasma chambers 95, 96, and 97 is measured as in the twelfth embodiment by operating the switch SW3. In these processing chambers 95, 96, and 97, a variation $f_{01r}$ between the maximum frequency $f_{01max}$ and the minimum frequency $f_{01min}$ among first series resonant frequencies $f_0$ after delivery is defined as follows:

$$f_{01r} = (f_{01max} - f_{01min})/(f_{01max} + f_{01min})$$

The performance of these processing chambers is determined by whether or not the variation $f_{01r}$ is less than 0.03. That is, this evaluation method determines that the required level of performance is maintained when the variation $f_{01r}$ is less than 0.03 and that the required level of performance is not maintained when the variation $f_{01r}$ is 0.03 or more. In the latter case, corrective action to adjust the first series resonant frequency $f_0$ is performed as in the eighth and ninth embodiments.

The performance evaluation method of this embodiment exhibits the same advantages as those in the eleventh and twelfth embodiments. Moreover, adequate corrective action is performed to these processing chambers 95, 96, and 97 based on the evaluation of the variation $f_{01r}$ of the first series resonant frequencies $f_{01}$ after the delivery. Thus, the processing chambers 95, 96, and 97 have substantially the same radiofrequency characteristics, such as impedance and resonant frequency. Since the radiofrequency characteristics of these processing chambers 95, 96, and 97 are controlled within a predetermined range, these processing chambers 95, 96, and 97 consume substantially the same electrical power.

Accordingly, substantially the same result is achieved from a single process recipe for these different processing chambers 95, 96, and 97. When layers are formed in these processing chambers 95, 96 and 97, these layers can have substantially the same characteristics, e.g., the thickness, the isolation voltage, and the etching rate. When the variation is controlled to be less than 0.03 under the same deposition conditions in the plasma chambers 95, 96, and 97, the variation in layer thickness can be controlled to be less than ±2%.

As a result, the overall radiofrequency characteristics of the plasma processing system can be optimized so as to generate a stable plasma. As a result, the operations of the processing chambers 95, 96, and 97 of the plasma processing system are stable and uniform. Such a performance evaluation method has not been considered in conventional processes.

The above-mentioned method does not require a determination of process conditions by the relationships between enormous amounts of data on these processing chambers 95, 96, and 97 and the results obtained by evaluation of actually processed substrates.

Thus, in installation of new systems and inspection of installed systems, the time required for obtaining substantially the same results using the same process recipe in these processing chambers 95, 96, and 97 can be significantly reduced by measuring the first series resonant frequency $f_0$ compared with an inspection method by actual deposition onto the substrate 16. Moreover, according to this evaluation method, the plasma processing system can be directly evaluated in situ in a short period of time, instead of a two-stage evaluation, i.e., processing of the substrate and confirmation and evaluation of the operation of the plasma processing system based on the evaluation of the processed substrate. If an inspection process by layer deposition on the substrates 16 is employed in this embodiment, these processing chambers 95, 96, and 97 can be simultaneously evaluated. In conventional methods, these plasma chambers must be independently evaluated.

Accordingly, the performance evaluation method of this embodiment does not require a shutdown of the production line for several days to several weeks in order to check and evaluate the operation of the plasma processing system. The production line, therefore, has high productivity with reduced expenses for substrates used in the inspection, processing of these substrates, and labor during the inspection operations.

The performance evaluation methods described in the eighth to tenth embodiments are also applicable to the processing chambers 95, 96, and 97. By using both the evaluation based on the comparison of the first series resonant frequency $f_0$ of each processing chamber with the power frequency $f_e$ and the evaluation based on the variation $f_{01r}$, the overall radiofrequency characteristics of the processing chambers 95, 96, and 97, including a variation according to chambers, can be simultaneously optimized. These processing chambers 95, 96, and 97 thereby exhibit the same advantages as those in the eighth to tenth embodiments.

Figure 37:
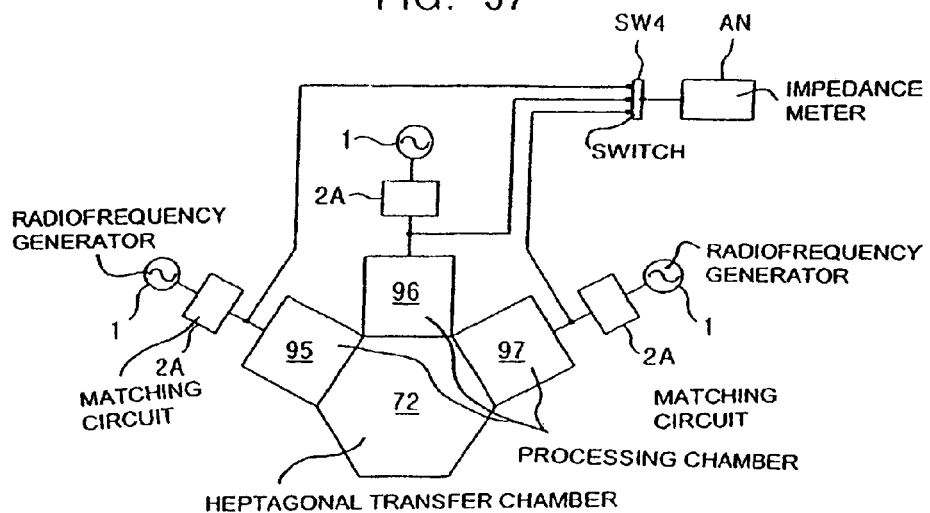
FIG. 37 is a schematic view of a plasma processing apparatus which is used in a performance evaluation method in accordance with the present invention.
Figure 38:
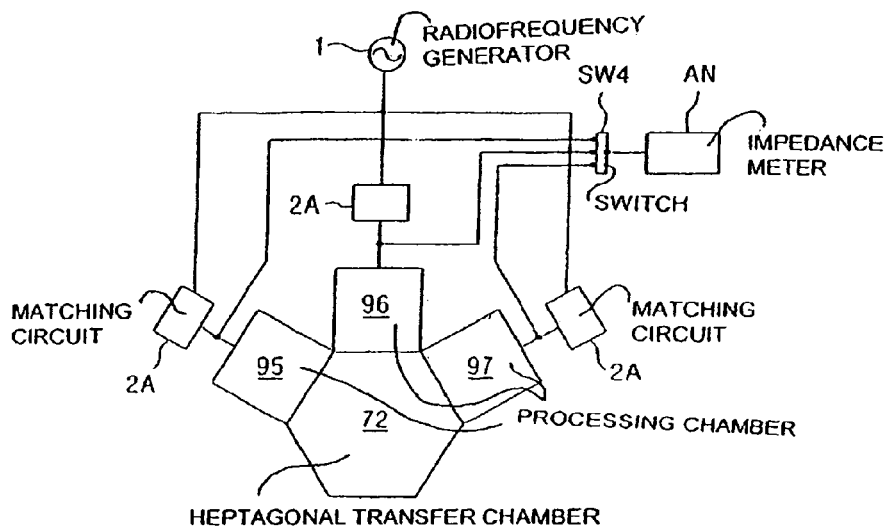
FIG. 38 is a schematic view of a plasma processing apparatus which is used in a performance evaluation method in accordance with the present invention.
Figure 39:
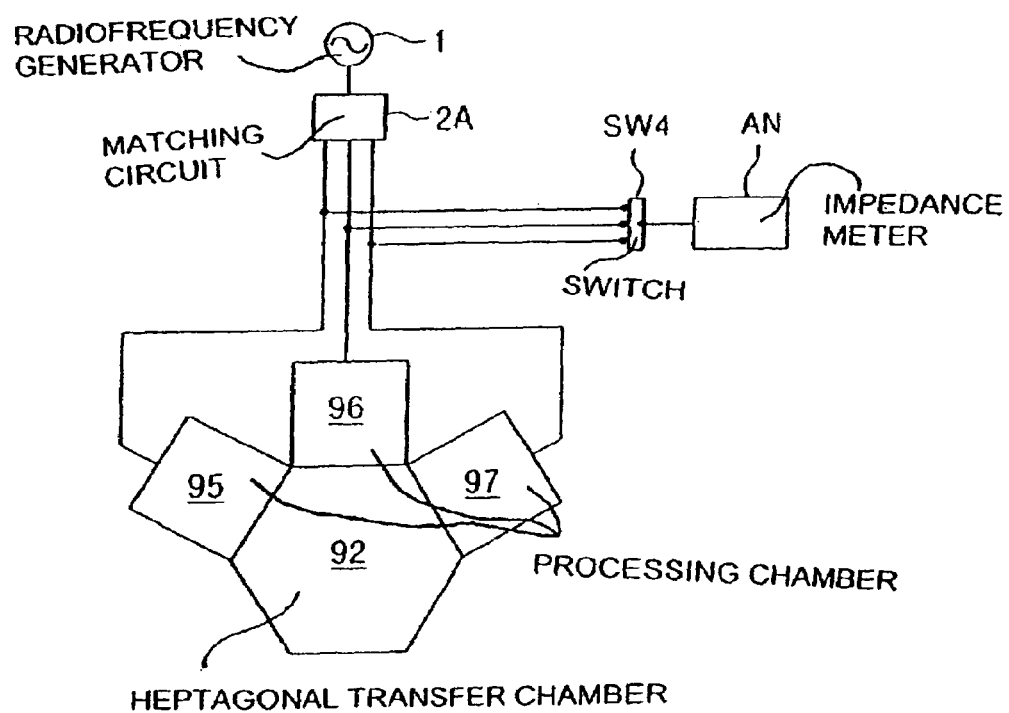
FIG. 39 is a schematic view of a plasma processing apparatus which is used in a performance evaluation method in accordance with the present invention.

In the above eleventh to thirteenth embodiment, as shown in FIG. 37, each of the processing chambers 95, 96, and 97 is provided with a matching circuit 2A and a radiofrequency generator 1. An impedance meter AN is connected to a connection point for every matching circuit 2A via a switch SW4. Alternatively, as shown in FIG. 38, one radiofrequency generator 1 may be connected to three matching circuits 2A for the processing chambers 95, 96, and 97, or as shown in FIG. 39, one matching circuit 2A may be connected to these processing chambers 95, 96, and 97.

In the eleventh to thirteen embodiments, the first series resonant frequency $f_0$ is used as the radiofrequency characteristic A in the performance evaluation method. Alternatively, the radiofrequency characteristic A may be any one of a resonant frequency f, an impedance $Z_{ef}$ at the frequency of the radiofrequency waves, a resistance $R_{ef}$ at the frequency of the radiofrequency waves, and a reactance $X_{ef}$ at the frequency of the radiofrequency waves.

Fourteenth Embodiment

A performance management system for a plasma processing apparatus in accordance with a fourteenth embodiment will now be described with reference to the drawings.

Figure 40:
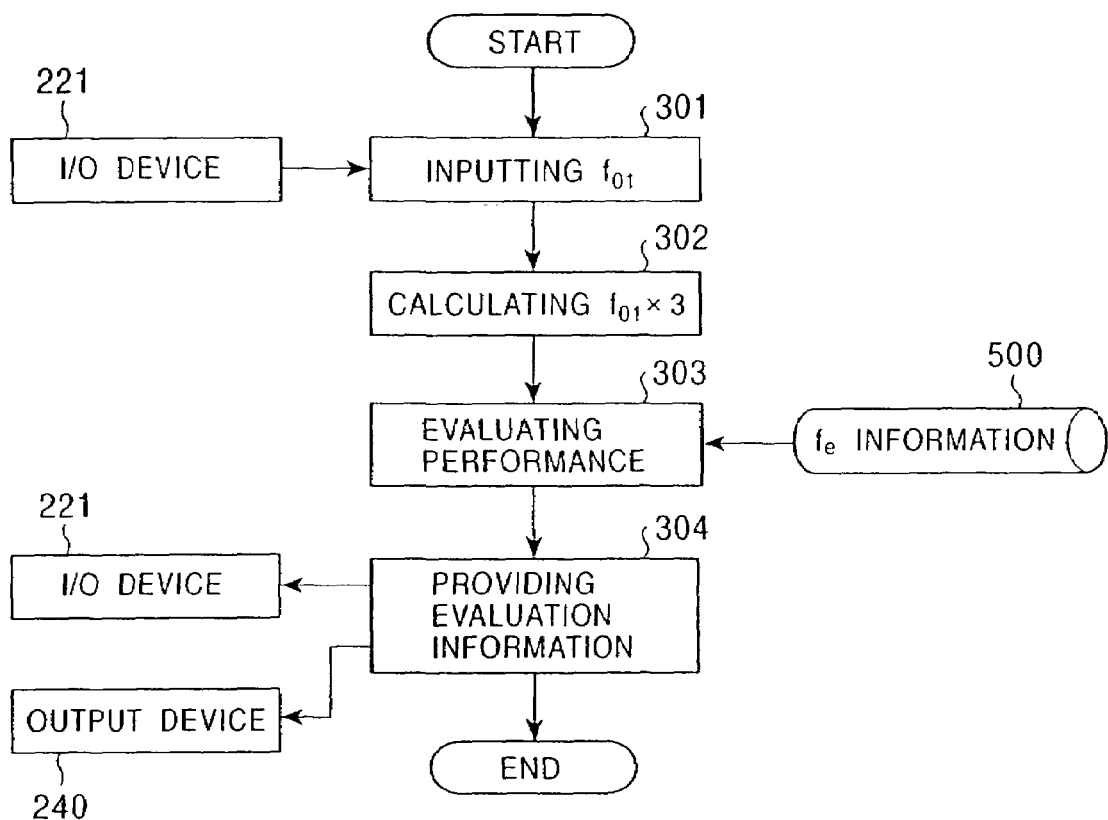
FIG. 40 is a flowchart illustrating a method for providing evaluation information which is prepared by a performance management system in accordance with a seventh embodiment.

FIGS. 17 and 19 are block diagrams of a performance management system for a plasma processing system of this embodiment, and FIG. 40 is a flowchart illustrating a method for providing evaluation information which is prepared by this performance management system.

The performance management system shown in FIG. 17 includes a server 210, a customer I/O device 220, a communication line 230 for linking the server 210 and the customer I/O device 220, and an output device 240 at a delivery site, the output device 240 being linked to the server 210. The performance management system shown in FIG. 19 further includes an impedance meter 260 connected to a plasma processing apparatus 250, in addition to the components shown in FIG. 17. This performance management system is applicable to various types of plasma processing apparatuses, for example, to the plasma processing apparatuses shown in FIGS. 8 to 12 and the plasma processing apparatuses included in the plasma processing system shown in FIG. 13. These components are described in detail in the above fourth embodiment.

The procedure in this embodiment will now be described based on the flowchart shown in FIG. 40, with reference to FIGS. 17 and 19.

A user of this performance management system, for example, a customer, a maintenance engineer who visits the customer measures the first resonant frequency $f_{01}$ of a plasma processing chamber of the customer and inputs this value from the customer I/O device 220. In case of the performance management system shown in FIG. 19, the observed first resonant frequency $f_{01}$ is directly input from the impedance meter 260 connected to the plasma processing apparatus 250.

The input first resonant frequency $f_{01}$ is transferred to the server 210 via the communication line 230.

The server 210 calculates $\{f_{01} \times 3\}$ (Step 302).

The server 210 then calls up information 500, stored in a memory device 212, on the power frequency $f_e$ of the radiofrequency which is supplied to the electrodes in the plasma processing chamber, and compares this value with the calculated $\{f_{01} \times 3\}$ to evaluate the performance of this plasma processing apparatus. If $\{f_{01} \times 3\}$ is larger than the power frequency $f_e$, the server 210 determines that a required level of performance is maintained, whereas if $\{f_{01} \times 3\}$ is not larger than the power frequency $f_e$, the server 210 determines that a required level of performance is not maintained (Step 303).

When the server 210 receives data of a plurality of first resonant frequencies $f_{01}$ from a plasma processing apparatus or a plasma processing system having a plurality of plasma processing chambers shown in the eleventh to thirteenth embodiments, the server 210 determines that a required level of performance is maintained only when all $\{f_{01} \times 3\}$ values are larger than the power frequency $f_e$ and that the required level of performance is not maintained in other cases.

The server 210 provides the results to both the customer I/O device 220 and the output device 240 (Step 304).

The server 210 transmits print, display or sound alarm signals to the customer I/O device 220. When the server 210 determines that a required level of performance is maintained, the server 210 outputs, for example, a message "this apparatus still exhibits the required level of performance sufficient for practical use." When the server 210 determines that the required level of performance is not maintained, the server 210 outputs, for example, a message "Please adjust this apparatus according to the manual included because the performance may not be maintained at the required level." These messages may be output as print, display on a screen, or voice for the customer or the maintenance engineer.

Also, the server 210 transmits print, display, or sound alarm signals to the output device 240 when the server 210 determines that the required level of performance is not maintained. The output device 240 outputs a maintenance command by printing or displaying a message or providing a signal or alarm. It is preferable that the identification number of the plasma processing chamber be received from the customer I/O device 220 and be output from the output device 240 so that the apparatus requiring the maintenance can be specified at the delivery site. Alternatively, the identification number or phone number of the customer I/O device 220 may be used to determine the identification number of the plasma processing chamber and to output the results from the output device 240.

As a result, the customer or the maintenance engineer who visits the customer can evaluate the plasma processing apparatus based on Evaluation Standard 1 without actually inspecting the substrates used for layer deposition in this apparatus.

Moreover, the plasma processing apparatus can be directly evaluated in situ in a short period of time, instead of a two-stage evaluation, i.e., processing of the substrates and confirmation and evaluation of the operation of the plasma processing apparatus based on the evaluation of the processed substrates. If an inspection process by actual layer deposition on the substrates is employed in a plasma processing apparatus having a plurality of plasma processing chambers, these plasma processing chambers can be simultaneously evaluated. In contrast, these plasma processing chambers must be independently evaluated in conventional inspection processes.

Accordingly, the performance management system for this embodiment can check the operating performance of the apparatus for a short period in a simplified process, and can reduce a shutdown time of the apparatus. The apparatus, therefore, has high productivity with reduced expenses for substrates used in the inspection, processing of these substrates, and labor during the inspection operations.

The manufacturer and so on at the delivery site can immediately identify the problems of the plasma processing apparatus at the customer site by the maintenance command, thus providing a satisfactory repair service.

Fifteenth Embodiment

Another performance management system for a plasma processing apparatus in accordance with a fifteenth embodiment will now be described with reference to the drawings.

Figure 41:
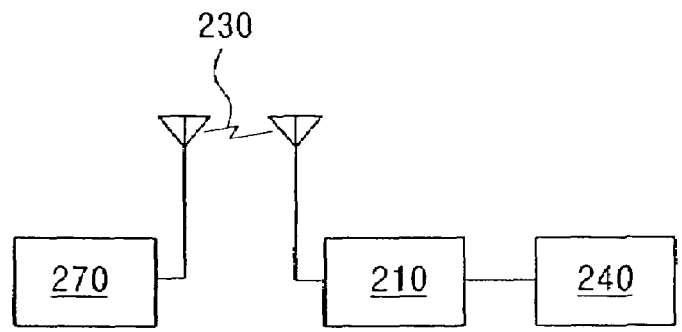
FIG. 41 is a block diagram of a performance management system for a plasma processing apparatus in accordance with an eighth embodiment of the present invention.
Figure 42:
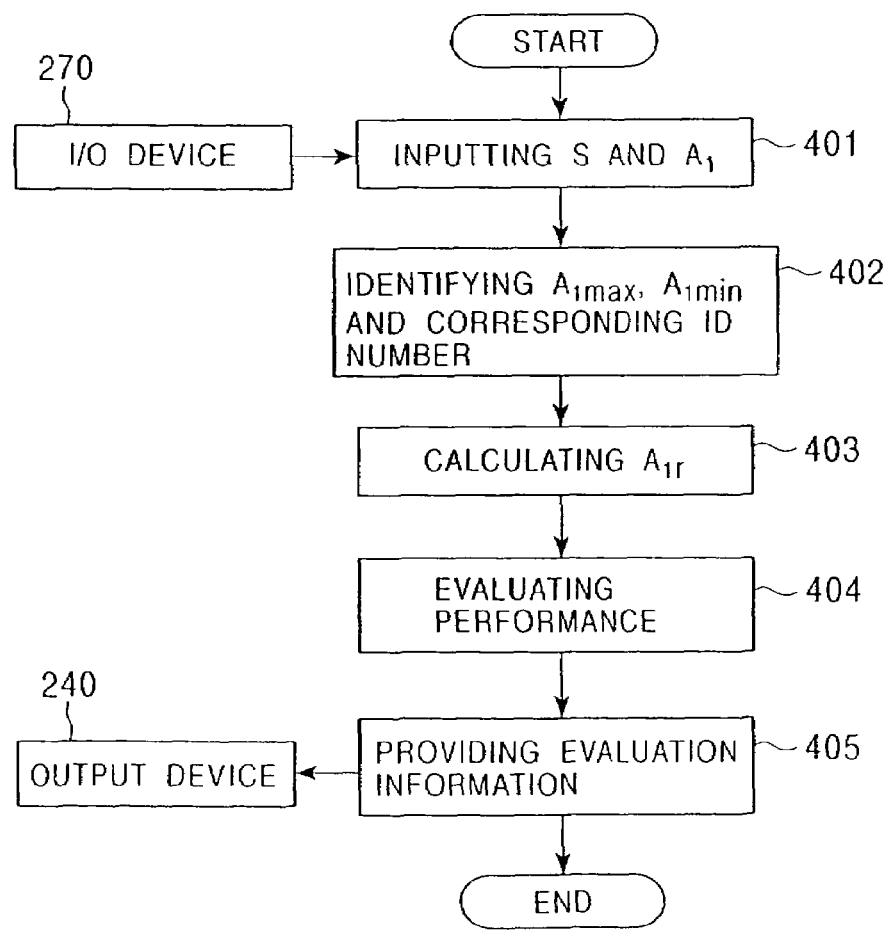
FIG. 42 is a flowchart illustrating a method for providing evaluation information which is prepared by the performance management system shown in FIG. 41.

FIG. 41 is a block diagram of a performance management system for a plasma processing system of this embodiment, and FIG. 42 is a flowchart illustrating a method for providing evaluation information which is prepared by this performance management system. The same components as those in FIGS. 17 to 19 are referred to with the same reference numerals, and the description thereof is omitted.

The performance management system shown in FIG. 41 includes a server 210, a customer input device 270, a communication line 230 linking the server 210 and the customer I/O device 270, and an output device 240 at a delivery site, the output device 240 being linked to the server 210. This performance management system is applicable to plasma processing apparatuses or plasma processing systems, each having a plurality of plasma processing chambers, for example, shown in the eleventh to thirteenth embodiments.

Referring to FIG. 41, the operation of this embodiment will now be described according to the flowchart shown in FIG. 42. A user of the performance management system, for example, a customer at a delivery site or a maintenance engineer who visits the customer inputs identification numbers S and observed radiofrequency characteristics $A_1$ of plasma processing chambers through the customer I/O device 270. The identification number S and the radiofrequency characteristics $A_1$ are transmitted to the server 210 via the communication line 230 (Step 401).

An impedance meter connected to the plasma processing apparatus may be connected to the customer I/O device 270 so that the identification numbers S and the radiofrequency characteristics $A_1$ of the plasma processing chambers can be automatically transmitted upon the request from the server 210.

The server 210 identifies the plasma processing chamber from the identification number and determines the maximum $A_{1max}$ and the minimum $A_{1min}$ of the radiofrequency characteristics $A_1$ (Step 402). The variation $A_{1r}$ is calculated based on the following equation (Step 403):

$$A_{1r} = (A_{1max} - A_{1min})/(A_{1max} + A_{1min})$$

The server 210 compares the calculated variation $A_{1r}$ with an upper limit, for example, 0.1 to evaluate the performance of the plasma processing apparatus. The server 210 determines that the plasma processing apparatus maintains a required level of performance when the variation $A_{1r}$ is smaller than the upper limit and that the plasma processing apparatus does not maintain the required level of performance when the variation $A_{1r}$ is not smaller than the upper limit (Step 404).

When determining that the plasma processing apparatus does not maintain the required level of performance, the server 210 provides evaluation information including a maintenance command and identification numbers of the plasma processing chambers having the maximum $A_{1max}$ or minimum $A_{1min}$ to the output device 240 at the delivery site (Step 405).

In detail, the server 210 transmits print, display, or sound alarm signals to the output device 240. The maintenance command and the identification numbers of the corresponding plasma processing chambers are output at the delivery site to identify the apparatuses which must be subjected to maintenance.

At the delivery site, the performance management system for the plasma processing apparatus of this embodiment can immediately identify the relevant plasma processing apparatus or plasma processing chamber.

As a result, the manufacturer or a maintenance company can evaluate the plasma processing apparatus or plasma processing system based on Evaluation Standard 2 without actually inspecting the substrates used for layer deposition in this apparatus or system.

Moreover, the plasma processing apparatus or system can be directly evaluated in situ in a short period of time, instead of a two-stage evaluation, i.e., processing of the substrates and confirmation and evaluation of the operation of the plasma processing apparatus or system based on the evaluation of the processed substrates. If an inspection process by layer deposition on the substrates is employed in a plasma processing apparatus or system having a plurality of plasma processing chambers, these plasma processing chambers can be simultaneously evaluated.

Accordingly, the performance management system for this embodiment can check the operating performance of the apparatus for a short period in a simplified process, and can reduce a shutdown time of the apparatus. The apparatus, therefore, has high productivity with reduced expenses for substrates used in the inspection, processing of these substrates, and labor during the inspection operations.

The manufacturer at the delivery site can immediately identify the problems of the plasma processing apparatus at the customer site by the maintenance command, thus providing a satisfactory repair service.

Sixteenth Embodiment

A sixteenth embodiment of the present invention will now be described with reference to FIG. 2.

In this embodiment, the radiofrequency characteristic A is measured at a measuring point PR3 which corresponds to the input terminal of the matching circuit 2A connected to the feed line 1A instead of the measuring point PR which corresponds to the input end of the feed plate 3 in the first to fifteenth embodiments. Herein, the feed line 1A is disconnected from the input end of the matching circuit 2A at the measuring point PR3, and the remaining portion of the plasma processing chamber is defined as the measured region.

In this manner, the radiofrequency characteristics of the matching circuit as well as the plasma processing chamber can be evaluated. Thus, compared to the foregoing measuring point, the evaluation of the effective power consumed in the plasma space and the plasma processing results can be further accurately evaluated.

Seventeenth Embodiment

A seventeenth embodiment of the present invention will now be described with reference to FIG. 2

In this embodiment, the radiofrequency characteristic A is measured at a measuring point PR2 which corresponds to the input end of the radiofrequency feed line 1A instead of the measuring point PR of the feed plate 3 in the first to fifteenth embodiments. Herein, the feed line 1A connecting the radiofrequency generator 1 to the matching circuit 2A is disconnected from the radiofrequency generator 1 at the output end thereof, thereby separating the radiofrequency generator 1 from the plasma processing chamber. The remaining portion of the plasma processing chamber is defined as the measured region.

In this manner, the radiofrequency characteristics of the plasma processing chamber, the matching circuit, and the feed line 1A can be evaluated. Thus, compared to the measuring points described above, the evaluation of the effective power consumed in the plasma space and the plasma processing results can be further accurately evaluated compared to the sixteenth embodiment.

It is noted that in the sixteenth and seventeenth embodiments, only the measuring point PR is used when the first series resonant frequency $f_0$ is measured to determine the relationship with the power frequency $f_e$, such as relationships (1), (2), and (3) described in the first, second, and third embodiments, respectively, as in these embodiments. The measuring points PR2 and PR3 should not be used in this case.

EXAMPLES

Comparative Example A

The power frequency $f_e$ was set at 40.68 MHz and the first series resonant frequency $f_0$ was set at 11.63 MHz. The factors constituting the equivalent circuit shown in FIG. 12, namely, the inductance $L_f$ and the resistance $R_f$ of the feed plate 3, the plasma electrode capacitance $C_e$ between the plasma excitation electrode 4 and the susceptor electrode 8, the capacitance $C_s$ between the susceptor electrode 8 and the susceptor shield 12 (ground), the inductance $L_S$ and the resistance $R_S$ of the shaft 13, the bellows 11, and the chamber wall 10, and the capacitance $C_X$ between the plasma excitation electrode 4 and the earth, were measured. The results are shown in Table 2.

Example A1

The length of the feed plate 3 of the plasma processing apparatus of COMPARATIVE EXAMPLE A was changed so that the first series resonant frequency $f_0$ was set to be 13.82 MHz so as to satisfy the relationship $3f_0 > f_e$. The results are shown in Table 2.

Example A2

The length of feed plate 3 was further changed from Example 1A, and the overlapping area of the susceptor electrode 8 and the chamber wall 10 was changed so that the first series resonant frequency $f_0$ was set to be 30.01 MHz so as to satisfy the relationship $3f_0 > f_e$. The results are shown in Table 2.

Example A3

The thickness of the insulator between the susceptor electrode 8 and the chamber wall 10 was increased compared to Example 2A so that the first series resonant frequency $f_0$ was set to be 33.57 MHz so as to satisfy the relationship $1.3f_0 > f_e$. The results are shown in Table 2.

Example A4

The feed plate 3 was removed from the plasma processing apparatus of EXAMPLE A3, the tuning capacitor 24 of the matching circuit 2A was directly connected to the susceptor electrode 8, and the shield supporting plate 12A of the susceptor shield 12 and the chamber wall 10 were short-circuited so that the first series resonant frequency $f_0$ was set to be 123.78 MHz so as to satisfy the relationship $f_0 > 3f_e$. The results are shown in Table 2.

TABLE 2

|  | COMPARATIVE EXAMPLE A | EXAMPLE A1 | EXAMPLE A2 | EXAMPLE A3 | EXAMPLE A4 |
| --- | --- | --- | --- | --- | --- |
| First series resonant frequency $f_0$ (MHz) | 11.63 | 13.82 | 30.01 | 33.57 | 123.78 |
| Inductance $L_f$ (nH) of feed plate 3 | 184 | 130 | 92 | 92 | 2 |
| Resistance $R_f$ (Ω) of feed plate 3 | 4 | 3 | 3 | 3 | 1 |
| Interelectrode capacitance $C_e$ (pF) | 37 | 37 | 37 | 37 | 37 |
| Capacitance $C_s$ (pF) between susceptor electrode 8 and ground | 2,250 | 2,250 | 2,250 | 2,250 | 2,250 |
| Inductance $L_s$ (nH) of chamber wall, etc. | 268 | 268 | 268 | 268 | 268 |
| Resistance $R_s$ (Ω) of chamber wall, etc. | 2 | 2 | 2 | 2 | 1 |
| Capacitance $C_s$ (pF) between plasma excitation electrode 4 and ground | 980 | 980 | 250 | 180 | 180 |

In order to evaluate the results of EXAMPLES A1 to A4 and COMPARATIVE EXAMPLE A, $SiN_X$ layers were deposited at 800 W and 400 W, and were evaluated as follows.

(1) Deposition Rate and Planar Uniformity

The process for evaluating the deposition rate and the planar uniformity included the following:

Step 1: Depositing a $SiN_X$ layer on a 6-inch glass substrate by plasma-enhanced CVD;

Step 2: Patterning a resist layer by photolithography;

Step 3: Dry-etching the SiNx layer with $SF_6$ and $O_2$;

Step 4: Removing the resist layer by ashing with $O_2$;

Step 5: Measuring the unevenness in the layer thickness using a contact displacement meter;

Step 6: Calculating the deposition rate from the deposition time and the layer thickness; and Step 7: Measuring the planar uniformity at 16 points on the substrate surface.

(2) BHF Etching Rate

The process for evaluating the etching rates included the following:

Steps 1 and 2: Same as above;
Step 3: Immersing the substrate in a BHF solution (HF: $NH_4F$=1:10) for one minute;
Step 4: Rinsing the substrate with deionized water, drying the substrate, and removing the resist layer with a mixture of sulfuric acid and hydrogen peroxide ($H_2SO_4$+$H_2O_2$);
Step 5: Measuring the unevenness as in Step 5 above; and
Step 6: Calculating the etching rate from the immersion time and the unevenness.

(3) Isolation Voltage

The process for evaluating the isolation voltage included the following:

Step 1: Depositing a chromium layer on a glass substrate by sputtering and patterning the chromium layer to form a lower electrode;
Step 2: Depositing a $SiN_X$ layer by plasma-enhanced CVD;
Step 3: Forming an upper electrode as in Step 1;
Step 4: Forming a contact hole for the lower electrode;
Step 5: Probing the upper and the lower electrodes to measure the current-voltage characteristic (I–V characteristic) by varying the voltage to approximately 200 V; and
Step 6: Defining the isolation voltage as the voltage V at 100 pA corresponding to 1 $\mu A/cm^2$ in a 100 μm square electrode.

These results are shown in Table 3.

TABLE 3

|  | COMPARATIVE EXAMPLE A | EXAMPLE A1 | EXAMPLE A2 | EXAMPLE A3 | EXAMPLE A4 |
| --- | --- | --- | --- | --- | --- |
| Power output (W) | 800 | 800 | 800 | 800 | 400 |
| Deposition rate (nm/min) min./max. | 30/100 | 100/450 | 100/450 | 100/550 | 100/550 |
| Planar uniformity (%) | >±10 | ~±10 | ~±10 | ±5 | ±5 |
| BHF etching rate (nm/min) | >200 | ~200 | ~200 | ~50 | ~50 |
| Isolation voltage MV/cm | ~4 | ~7 | ~7 | ~9 | ~9 |

These results show that the deposition rate and the isolation voltage are improved when $3f_0>f_e$, and that not only the deposition rate and the isolation voltage but also the planar uniformity and the BHF etching rate are improved when $1.3f_0>f_e$. When $f_0>3f_e$, the same layer characteristics as those in the power output of 800 are achieved at a power output of 400 W.

Accordingly, the performance of the plasma processing apparatus is improved by setting the first series resonant frequency $f_0$ at a high level relative to the power frequency $f_e$.

Example B1

The variation defined by the maximum frequency $f_{0max}$ and the minimum frequency $f_{0min}$ of the first series resonant frequencies $f_0$ of the above plasma processing apparatus was set to be 0.09 according to relationship (10), and the average of the first series resonant frequencies $f_0$ was set to be 43 MHz.

Example B2

The variation defined by the maximum frequency $f_{0max}$ and the minimum frequency $f_{0min}$ of the first series resonant frequencies $f_0$ of the above plasma processing apparatus was set to be 0.02 according to relationship (10), and the average of the first series resonant frequencies $f_0$ was set to be 43 MHz.

Comparative Example B

The variation defined by the maximum frequency $f_{0max}$ and the minimum frequency $f_{0min}$ of the first series resonant frequencies $f_0$ of the above plasma processing apparatus was set to be 0.11 according to relationship (10), and the average of the first series resonant frequencies $f_0$ was set to be 43 MHz.

In each of EXAMPLES B1 and B2 and COMPARATIVE EXAMPLE B, a silicon nitride layer was deposited according to the following same process recipe to measure the variation in the layer thicknesses:

(1) Depositing a $SiN_X$ layer on a 6-inch glass substrate by plasma enhanced CVD;
(2) Patterning a resist layer by photolithography;
(3) Dry-etching the $SiN_X$ layer with $SF_6$ and $O_2$;
(4) Removing the resist layer by $O_2$ ashing;
(5) Measuring the unevenness of the $SiN_X$ layer using a contact displacement meter;
(6) Calculating the deposition rate from the deposition time and the layer thickness; and
(7) Measuring the in-plane uniformity of the layer at 16 points on the glass substrate surface.

The deposition conditions were as follows:
Substrate temperature: 350° C.
$SiH_4$ flow rate: 40 SCCM
$NH_3$ flow rate: 200 SCCM
$N_2$ flow rate: 600 SCCM
Deposition rate: about 200 nm/min
The results are shown in Table 4.

TABLE 4

|  |  | Deposition Rate (nm/min) | Variation in Deposition Rate (%) |
| --- | --- | --- | --- |
| COMPARATIVE EXAMPLE B | Chamber 1 | 181 | 8.6 |
|  | Chamber 2 | 215 |  |
| EXAMPLE B1 | Chamber 1 | 195 | 4.9 |
|  | Chamber 2 | 215 |  |
| EXAMPLE B2 | Chamber 1 | 207 | 1.9 |
|  | Chamber 2 | 215 |  |

These results shows that the difference in the layer thickness between the plasma chambers is reduced when the variation of the first series resonant frequencies $f_0$ is set to be in the range specified according to the present invention. In other words, the operating characteristics of the plasma chambers are improved by such a specific variation in the first series resonant frequencies $f_0$.

What is claimed is:

1. A performance evaluation method for a plasma processing apparatus which is disassembled before transfer, is transported to a customer, and is reassembled at a customer site, the plasma processing apparatus comprising: a plasma processing chamber including an electrode to excite a plasma and a radiofrequency feeder, the electrode being connected to an output end of the radiofrequency feeder; a radiofrequency generator to supply a radiofrequency voltage to the electrode; and a matching circuit having an input terminal and an output terminal, the input terminal being connected to the radiofrequency generator and the output terminal being connected to an input end of the radiofrequency feeder so as to achieve impedance matching between the plasma processing chamber and the radiofrequency generator, the method comprising:

determining that the plasma processing apparatus maintains a required level of performance when three times a first series resonant frequency $f_{01}$ of the plasma processing chamber, after delivery of the apparatus, is larger than a power frequency $f_e$ of a radiofrequency at the output terminal of the radiofrequency generator and that the plasma processing apparatus does not maintain the required level of performance when three times the first series resonant frequency $f_{01}$ is not larger than the power frequency $f_e$, wherein the first series resonant frequency $f_{01}$ is measured at the input end of the radiofrequency feeder.

2. A performance evaluation method for the plasma processing apparatus according to claim 1, wherein a server storing data of the power frequency $f_e$ supplied from the radiofrequency generator to the plasma processing chamber and a customer I/O device linked to the server via a communication line are provided, wherein the server receives data of the first series resonant frequency $f_{01}$, after the delivery of the apparatus, from the customer I/O device, and transmits a signal indicating satisfying the required level of performance when three times the first series resonant frequency $f_{01}$ is larger than the power frequency $f_e$ and a signal indicating not satisfying the required level of performance when three times the first series resonant frequency $f_{01}$ is not larger than the power frequency $f_e$.

3. A performance evaluation method for the plasma processing apparatus according to claim 2, wherein the server comprises an output device at a delivery site of the apparatus, and the output device outputs a maintenance command when three times the first series resonant frequency $f_{01}$ is not larger than the power frequency $f_e$.

4. A performance evaluation method for a plasma processing apparatus which is disassembled before transfer, is transferred to a customer, and is reassembled at a customer site, the plasma processing apparatus comprising: a plurality of plasma processing chambers, each including an electrode to excite a plasma and a radiofrequency feeder, the electrode being connected to an output end of the radiofrequency feeder; a radiofrequency generator to supply a radiofrequency voltage to the electrode; and a matching circuit having an input terminal and an output terminal, the input terminal being connected to the radiofrequency generator and the output terminal being connected to an input end of the radiofrequency feeder so as to achieve impedance matching between the plasma processing chamber and the radiofrequency generator, the method comprising:

determining that the plasma processing apparatus maintains a required level of performance when a variation $f_{01r}$, defined by $(f_{01max}-f_{01min})/(f_{01max}+f_{01min})$, between a maximum $f_{01max}$ and a minimum $f_{01min}$ of a first series resonant frequency $f_{01}$ of each of the plurality of plasma processing chambers, after delivery of the apparatus, is less than an upper limit and when three times the first series resonant frequency $f_{01}$ of each plasma processing chamber after the delivery is larger than a power frequency $f_e$ of a radiofrequency at the output terminal of the radiofrequency generator and that the plasma processing apparatus does not maintain the required level of performance one of when one of the variations $f_{01r}$ is not less than the upper limit and when three times the first series resonant frequency $f_{01}$ of each plasma processing chamber is not larger than the power frequency $_e$ wherein each first series resonant frequency $f_{01}$ is measured at the input end of the radiofrequency feeder of each plasma processing chamber.

5. A performance evaluation method for a plasma processing apparatus according to claim 4, wherein the upper limit is 0.1.

6. A performance evaluation method for a plasma processing apparatus which is disassembled before transfer, is transferred to a customer, and is reassembled at a customer site, the plasma processing apparatus comprising: a plurality of plasma processing chambers, each including an electrode to excite a plasma and a radiofrequency feeder, the electrode being connected to an output end of the radiofrequency feeder; a radiofrequency generator to supply a radiofrequency voltage to the electrode of each of the plasma processing chambers; a radiofrequency supplier, an input end being connected to the radiofrequency generator; and a matching circuit having an input terminal and an output terminal, the input terminal being connected to the output end of the radiofrequency supplier and the output terminal being connected to an input end of the radiofrequency feeder so as to achieve impedance matching between the plasma processing chamber and the radiofrequency generator, the method comprising:

determining that the plasma processing apparatus maintains a required level of performance when a variation $f_{01r}$ defined by $(f_{01max}-f_{01min})/(f_{01max}+f_{01min})$, between a maximum $f_{01max}$ and a minimum $f_{01min}$ of a first series resonant frequency $f_{01}$ of each of the plurality of plasma processing chambers, after delivery of the apparatus, is less than an upper limit and when three times the first series resonant frequency $f_{01}$ of each plasma processing chamber after the delivery is larger than a power frequency $f_e$ of a radiofrequency at the output terminal of the radiofrequency generator and that the plasma processing apparatus does not maintain the required level of performance one of when one of the variations $f_{01}$ r is not less than the upper limit and when three times the first series resonant frequency $f_{01}$ of each plasma processing chamber is not larger than the power frequency $f_e$, wherein the first series resonant frequency $f_{01}$ is measured at the input end of the radiofrequency supplier of each plasma processing chamber.

7. A performance evaluation method for a plasma processing apparatus according to claim 6, wherein the upper limit is 0.1.

8. A performance evaluation method for a plasma processing apparatus which is disassembled before transfer, is transferred to a customer, and is reassembled at a customer site, the plasma processing apparatus comprising: a plurality of plasma processing chambers, each including an electrode to excite a plasma and a radiofrequency feeder, the electrode being connected to an output end of the radiofrequency feeder; a radiofrequency generator to supply a radiofrequency voltage to the electrode of each of the plasma processing chambers; a radiofrequency supplier, an input end being connected to the radiofrequency generator; and a matching circuit having an input terminal and an output terminal, the input terminal being connected to the output end of the radiofrequency supplier and the output terminal being connected to an input end of the radiofrequency feeder so as to achieve impedance matching between the plasma processing chamber and the radiofrequency generator, the method comprising:

determining that the plasma processing apparatus maintains a required level of performance when a variation $f_{01r}$, defined by $(f_{01max}-f_{01min})/(f_{01max}+f_{01min})$, between a maximum $f_{01max}$ and a minimum $f_{01min}$ of a first series resonant frequency $f_{01}$ of each of the plurality of plasma processing chambers, after delivery of the apparatus, is less than an upper limit and when three times the first series resonant frequency $f_{01}$ of each plasma processing chamber after the delivery is larger than a power frequency $f_e$ of a radiofrequency at the output terminal of the radiofrequency generator and that the plasma processing apparatus does not maintain the required level of performance one of when one of the variations $f_{01r}$ is not less than the upper limit and when three times the first series resonant frequency $f_{01}$ of each plasma processing chamber is not larger than the power frequency $f_e$ wherein the first series resonant frequency $f_{01}$ is measured at the input terminal of the matching circuit of each plasma processing chamber.

9. A performance evaluation method for a plasma processing apparatus according to claim 8, wherein the upper limit is 0.1.

10. A performance evaluation method for a plasma processing apparatus which is disassembled before transfer, is transferred to a customer, and is reassembled at a customer site, the plasma processing apparatus comprising: a plurality of plasma processing chambers, each including an electrode to excite a plasma and a radiofrequency feeder, the electrode being connected to an output end of the radiofrequency feeder; a radiofrequency generator to supply a radiofrequency voltage to the electrode; and a matching circuit having an input terminal and an output terminal, the input terminal being connected to the radiofrequency generator and the output terminal being connected to an input end of the radiofrequency feeder so as to achieve impedance matching between the plasma processing chamber and the radiofrequency generator, the method comprising:

determining that the plasma processing apparatus maintains a required level of performance when three times a first series resonant frequency $f_{01}$ of each of the plasma processing chambers, after delivery of the apparatus, is larger than a power frequency $f_e$ of a radiofrequency at the output terminal of the radiofrequency generator and that the plasma processing apparatus does not maintain the required level of performance when three times the first series resonant frequency $f_{01}$ of each of the plasma processing chambers is not larger than the power frequency $f_e$, wherein the first series resonant frequency $f_{01}$ of each of the plasma processing chambers is measured at the input end of the radiofrequency feeder of each of the plasma processing chambers.

11. A performance evaluation method for the plasma processing apparatus according to claim 10, wherein a server storing data of the power frequency $f_e$ supplied from the radiofrequency generator to each plasma processing chamber and a customer I/O device linked to the server via a communication line are provided, wherein the server receives data of the first series resonant frequencies $f_{01}$ of the plasma processing chambers from the customer I/O device, and transmits a signal indicating satisfying the required level of performance when three times the first series resonant frequency $f_{01}$ is larger than the power frequency $f_e$ in all the plasma processing chambers and a signal indicating not satisfying the required level of performance when three times the first series resonant frequency $f_{01}$ is not larger than the power frequency $f_e$ in any one of the plasma processing chambers.

12. A performance evaluation method for the plasma processing apparatus according to claim 11, wherein the server comprises an output device at a delivery site of the apparatus, and the output device outputs a maintenance command when three times the first series resonant frequency $f_{01}$ is not larger than the power frequency $f_e$ in any one of the plasma processing chambers.

* * * * *

UNITED STATES PATENT AND TRADEMARK OFFICE
CERTIFICATE OF CORRECTION

PATENT NO. : 7,120,556 B2
APPLICATION NO. : 10/887795
DATED : October 10, 2006
INVENTOR(S) : Akira Nakano et al.

It is certified that error appears in the above-identified patent and that said Letters Patent is hereby corrected as shown below:

Columns 87-88, in claim 4, line 32, after "the power frequency" delete "$_e$" and substitute --$f_e$,-- in its place.

Signed and Sealed this

Twenty-seventh Day of March, 2007

JON W. DUDAS
*Director of the United States Patent and Trademark Office*